(12) United States Patent
Lee et al.

(10) Patent No.: US 12,503,642 B2
(45) Date of Patent: *Dec. 23, 2025

(54) LIGHT-EMITTING DEVICE INCLUDING HETEROCYCLIC COMPOUND AND ELECTRONIC APPARATUS INCLUDING THE LIGHT-EMITTING DEVICE

(71) Applicant: Samsung Display Co., Ltd., Yongin-si (KR)

(72) Inventors: Jiyoung Lee, Yongin-si (KR); Tsuyoshi Naijo, Yongin-si (KR); Hyunyoung Kim, Yongin-si (KR); Hyosup Shin, Yongin-si (KR); Jungsub Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 840 days.

This patent is subject to a terminal disclaimer.

(21) Appl. No.: 17/714,872

(22) Filed: Apr. 6, 2022

(65) Prior Publication Data

US 2022/0344593 A1 Oct. 27, 2022

(30) Foreign Application Priority Data

Apr. 7, 2021 (KR) .................. 10-2021-0045318

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/658* (2023.02);
(Continued)

(58) Field of Classification Search
CPC .... C07F 5/027; H10K 85/322; H10K 85/658; C09K 2211/1018
See application file for complete search history.

(56) References Cited

U.S. PATENT DOCUMENTS 8,906,521 B2 12/2014 Suda et al.
9,865,829 B2 1/2018 Tada et al.
(Continued)

FOREIGN PATENT DOCUMENTS

CN 113651841 A * 11/2021
KR 10-2012-0021448 A 3/2012
(Continued)

OTHER PUBLICATIONS

Machine Translation of CN113651841A (Year: 2021).*
(Continued)

*Primary Examiner* — Jenna N Chandhok
(74) *Attorney, Agent, or Firm* — Womble Bond Dickinson (US) LLP

(57) ABSTRACT

A light-emitting device including a heterocyclic compound represented by Formula 1 and a phosphorescent dopant, and an electronic apparatus including the light-emitting device are provided. Formula 1 is the same as described in the present specification. The light-emitting device includes: a first electrode, a second electrode facing the first electrode,
(Continued)

an interlayer between the first electrode and the second electrode and including an emission layer, and the heterocyclic compound represented by Formula 1

Formula 1

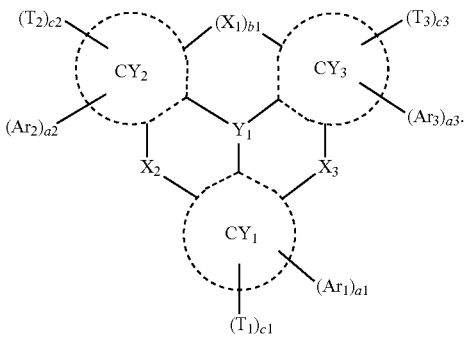

20 Claims, 3 Drawing Sheets

(51) Int. Cl.
  H10K 50/11    (2023.01)
  H10K 85/60    (2023.01)
  H10K 101/10   (2023.01)
  H10K 101/20   (2023.01)
  H10K 101/30   (2023.01)
(52) U.S. Cl.
  CPC ...... C09K 2211/1018 (2013.01); H10K 50/11 (2023.02); H10K 2101/10 (2023.02); H10K 2101/20 (2023.02); H10K 2101/30 (2023.02)

(56) References Cited

U.S. PATENT DOCUMENTS

| | | |
|---|---|---|
| 10,374,166 B2 | 8/2019 | Hatakeyama et al. |
| 12,058,927 B2 | 8/2024 | Kuwabara et al. |
| 2004/0048099 A1 | 3/2004 | Chen et al. |
| 2011/0309739 A1 | 12/2011 | Song et al. |
| 2020/0144513 A1 | 5/2020 | Hatakeyama et al. |
| 2020/0194683 A1 | 6/2020 | Sim et al. |
| 2022/0045277 A1 | 2/2022 | Stengel et al. |
| 2022/0328766 A1* | 10/2022 | Shin ............... H10K 85/657 |

FOREIGN PATENT DOCUMENTS

| | | |
|---|---|---|
| KR | 10-2014-0112501 A | 9/2014 |
| KR | 10-1482559 B1 | 1/2015 |
| KR | 10-2016-0119683 A | 10/2016 |
| KR | 10-1707799 B1 | 2/2017 |
| KR | 10-2020-0062329 A | 6/2020 |
| KR | 10-2020-0075986 A | 6/2020 |
| KR | 10-2021-0014799 A | 2/2021 |
| WO | WO 2020/067143 A1 | 4/2020 |

OTHER PUBLICATIONS

Huang, W. et al., "Molecular Design of Deep Blue Thermally Activated Delayed Fluorescence Materials Employing a Homoconjugative Triptycene Scaffold and Dihedral Angle Tuning", Chemistry of Materials, Feb. 13, 2018, pp. 1462-1466.
Kyung-Ryang Wee et al. "Carborane—Based Optoelectronically Active Organic Molecules: Wide Band Gap Host Materials for Blue Phosphorescence" J. Am. Chem. Soc. 2012, vol. 134, p. 17982-17990 (Year: 2012).
English translation of KR 2020/0062329 A and the original KR 2020/0062329 A, Takuji Hatakeyama, Jun. 3, 2020 (Year: 2020).
Yoshimasa Wada et al., "Organic light emitters exhibiting very fast reverse intersystem crossing", Nature Photonics, Aug. 3, 2020, pp. 643-649, vol. 14, https://doi.org/10.1038/s41566-020-0667-0.
Xueyan Wu et al. "Aggregation-induced emission characteristics of o-carborane-functionalized fluorene and its heteroanalogs: the influence of heteroatoms on photoluminescence" Mater. Chem. Front. 2020, vol. 4, p. 257-267 (Year: 2020).
Mina Jung et al. "A bipolar host based high triplet energy electroplex for an over 10 000 h lifetime in pure blue phosphorescent organic light-emitting diodes" Mater. Horiz. 2020, vol. 7, 559-565 (Year: 2020).
US Office Action dated Jun. 11, 2025, issued in U.S. Appl. No. 17/683,546 (15 pages).
US Final Office Action dated Oct. 23, 2025, issued in U.S. Appl. No. 17/683,546 (25 pages).

* cited by examiner

LIGHT-EMITTING DEVICE INCLUDING HETEROCYCLIC COMPOUND AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2021-0045318, filed on Apr. 7, 2021, in the Korean Intellectual Property Office, the entire content of which is incorporated herein by reference.

BACKGROUND

1. Field

One or more embodiments of the present disclosure relate to a heterocyclic compound, a light-emitting device including the same, and an electronic apparatus including the light-emitting device.

2. Description of the Related Art

From among light-emitting devices, self-emissive devices have wide-viewing angles, high contrast ratios, short response times, and/or suitable (e.g., excellent) characteristics in terms of luminance, driving voltage, and/or response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

SUMMARY

Aspects according to one or more embodiments of the present disclosure are directed toward a novel heterocyclic compound, a light-emitting device including the same, and an electronic apparatus including the light-emitting device.

Additional aspects of embodiments will be set forth in part in the description, which follows and, in part, will be apparent from the description, or may be learned by practice of the presented embodiments of the disclosure.

According to one or more embodiments, a light-emitting device includes:
  a first electrode,
  a second electrode facing the first electrode,
  an interlayer between the first electrode and the second electrode and including an emission layer, and
  a heterocyclic compound represented by Formula 1 and a phosphorescent compound.

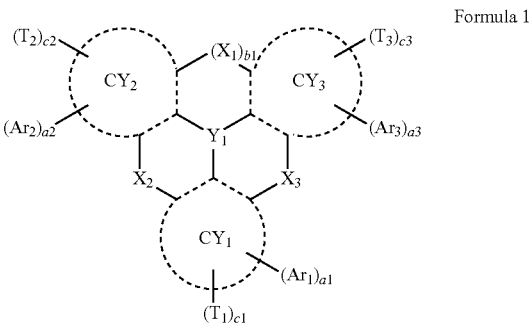

Formula 1

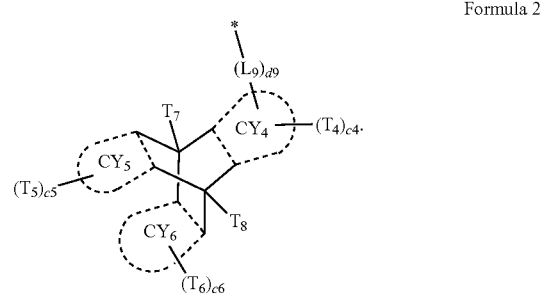

Formula 2

In Formula 1 and Formula 2,
$Ar_1$ to $Ar_3$ may each independently be a group represented by Formula 2,
a1 to a3 may each independently be an integer from 0 to 4, and a sum of a1, a2, and a3 may be 1 or more,
$Y_1$ may be B or N,
$X_1$ may be O, S, $B(Z_{1a})$, $N(Z_{1a})$, $C(Z_{1a})(Z_{1b})$, or $Si(Z_{1a})(Z_{1b})$,
b1 may be 0 or 1, wherein, when b1 is 0, $X_1$ may not exist,
$X_2$ may be O, S, $B(Z_2)$, or $N(Z_2)$,
$X_3$ may be O, S, $B(Z_3)$, or $N(Z_3)$,
ring $CY_1$ to ring $CY_6$ may each independently be a $C_3$-$C_{60}$ carbocyclic group or a $C_1$-$C_{60}$ heterocyclic group,
$T_1$ may be $*'$-$(L_1)_{d1}$-$(R_1)_{e1}$,
$T_2$ may be $*'$-$(L_2)_{d2}$-$(R_2)_{e2}$,
$T_3$ may be $*'$-$(L_3)_{d3}$-$(R_3)_{e3}$,
$T_4$ may be $*'$-$(L_4)_{d4}$-$(R_4)_{e4}$,
$T_5$ may be $*'$-$(L_5)_{d5}$-$(R_5)_{e5}$,
$T_e$ may be $*'$-$(L_6)_{d6}$-$(R_6)_{e6}$,
$T_7$ may be $*'$-$(L_7)_{d7}$-$(R_7)_{e7}$,
$T_8$ may be $*'$-$(L_8)_{d8}$-$(R_8)_{e8}$,
$*'$ in $T_1$ to $T_8$ may be a binding site to a neighboring atom,
c1 to c6 may each independently be an integer selected from 0 to 10,
$L_1$ to $L_9$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$,
d1 to d9 may be an integer selected from 0 to 3,
$Z_{1a}$, $Z_{1b}$, $Z_2$, $Z_3$, and $R_1$ to $R_8$ may each independently be a group represented by Formula 2, hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_0$ aryl alkyl group that is unsubstituted or substituted with at least one $R_{10a}$, a $C_2$-$C_{60}$ heteroaryl alkyl group that is unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and each of $R_1$ to Re may not be a group represented by Formula 2, e1 to e8 may each independently be an integer selected from 0 to 10,

* in Formula 2 indicates a binding site to Formula 1, two or more of $R_1$(s) in the number of e1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_2$(s) in the number of e2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$(s) in the number of e3 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_4$(s) in the number of e4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_5$(s) in the number of e5 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of Re(s) in the number of e6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_7$(s) in the number of e7 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of Re(s) in the number of e8 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ may be:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-Coo heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$ and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group, or a $C_2$-$C_{60}$ heteroaryl alkyl group.

One or more embodiments include an electronic apparatus including the light-emitting device.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
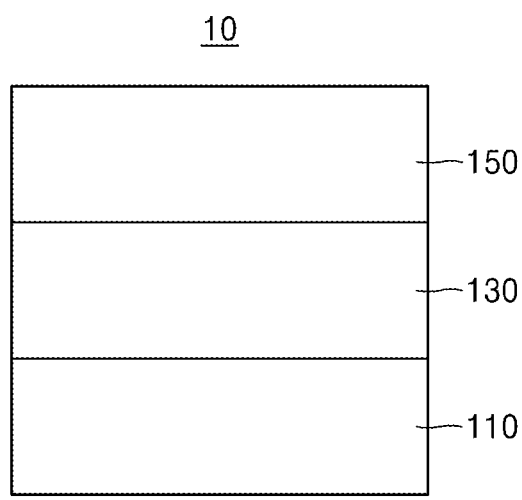
FIG. 1 shows a schematic cross-sectional view of a light-emitting device according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

According to one or more embodiments of the present disclosure, a heterocyclic compound is represented by Formula 1:

Formula 1

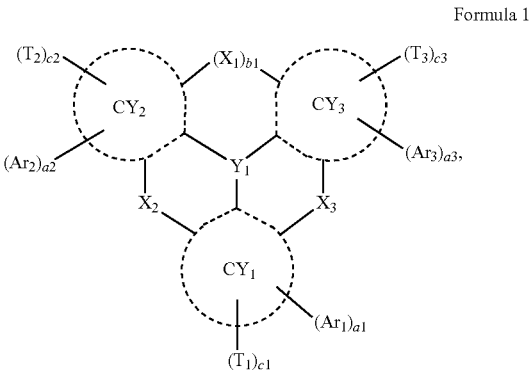

wherein, in Formula 1,
$Ar_1$ to $Ar_3$ may each independently be a group represented by Formula 2.

Formula 2

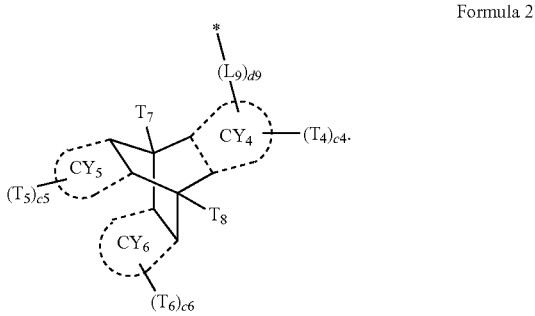

The detailed description of Formula 2 is the same as described in the present specification.

a1 to a3 in Formula 1 may each independently be an integer selected from 0 to 4, and the sum of a1, a2, and a3 may be 1 or more.

In an embodiment, a1 to a3 in Formula 1 may each independently be an integer from 0 to 1, and the sum of a1, a2, and a3 may be 1 or more.

In an embodiment, a1 to a3 in Formula 1 may each independently be an integer from 0 to 1, and the sum of a1, a2, and a3 may be an integer selected from 1 to 3.

$Y_1$ in Formula 1 may be B or N.

$X_1$ in Formula 1 may be O, S, $B(Z_{1a})$, $N(Z_{1a})$, $C(Z_{1a})(Z_{1b})$, or $Si(Z_{1a})(Z_{1b})$.

b1 in Formula 1 may be 0 or 1, and when b1 is 0, $X_1$ may not exist.

In an embodiment, b1 in Formula 1 may be 0, and $X_1$ may not exist.

$X_2$ in Formula 1 may be O, S, $B(Z_2)$, or $N(Z_2)$, and $X_3$ may be O, S, $B(Z_3)$, or $N(Z_3)$.

In an embodiment, in Formula 1, $X_2$ may be S, $B(Z_2)$, or $N(Z_2)$, and $X_3$ may be S, $B(Z_3)$, or $N(Z_3)$.

In an embodiment, $X_2$ and $X_3$ in Formula 1 may each be different from $Y_1$.

In one or more embodiments, $X_2$ and $X_3$ in Formula 1 may be identical to each other.

In one or more embodiments, $X_2$ and $X_3$ in Formula 1 may be different from each other.

Ring $CY_1$ to ring $CY_6$ in Formulae 1 and 2 may each independently be a $C_3$-$C_{60}$ carbocyclic group or a $C_1$-$C_{60}$ heterocyclic group.

In an embodiment, ring $CY_1$ to ring $CY_6$ in Formulae 1 and 2 may each independently be a benzene group, a naphthalene group, an anthracene group, a dibenzofuran group, a dibenzothiophene group, a carbazole group, a fluorene group, or a dibenzosilole group.

In an embodiment, ring $CY_1$ to ring $CY_3$ in Formula 1 may each be identical to each other.

In one or more embodiments, ring $CY_1$ to ring $CY_3$ in Formula 1 may each be a benzene group.

In an embodiment, ring $CY_4$ to ring $CY_6$ in Formula 2 may each be identical to each other.

In one or more embodiments, ring $CY_4$ to ring $CY_6$ in Formula 2 may each be a benzene group.

In an embodiment, at least one of ring $CY_4$ to ring $CY_6$ in Formula 2 may be a carbazole group.

In an embodiment, at least one of ring $CY_5$ or ring $CY_6$ in Formula 2 may be a carbazole group. In an embodiment, ring $CY_5$ in Formula 2 may be a carbazole group. In an embodiment, ring $CY_6$ in Formula 2 may be a carbazole group.

$T_1$ may be *'-$(L_1)_{d1}$-$(R_1)_{e1}$, $T_2$ may be *'-$(L_2)_{d2}$-$(R_2)_{e2}$, $T_3$ may be *'-$(L_3)_{d3}$-$(R_3)_{e3}$, $T_4$ may be *'-$(L_4)_{d4}$-$(R_4)_{e4}$, $T_5$ may be *'-$(L_5)_{d5}$-$(R_5)_{e5}$, $T_6$ may be *'-$(L_6)_{d6}$-$(R_6)_{e6}$, $T_7$ may be *'-$(L_7)_{d7}$-$(R_7)_{e7}$, and $T_8$ may be *'-$(L_8)_{d8}$-$(R_8)_{e8}$. *' in $T_1$ to $T_8$ may be a binding site to a neighboring atom.

c1 to c6 in Formulae 1 and 2 indicate the numbers of $T_1$ to $T_6$, respectively, and may each independently be an integer selected from 0 to 10 (for example, 0, 1, or 3). When c1 is 2 or more, two or more of $T_1$(s) may be identical to or different from each other, when c2 is 2 or more, two or more of $T_2$(s) may be identical to or different from each other, when c3 is 2 or more, two or more of $T_3$(s) may be identical to or different from each other, when c4 is 2 or more, two or more of $T_4$(s) may be identical to or different from each other, when c5 is 2 or more, two or more of $T_5$(s) may be identical to or different from each other, and when c6 is 2 or more, two or more of $T_6$(s) may be identical to or different from each other.

d1 to d9 in Formulae 1 and 2 indicate the numbers of $L_1$ to $L_9$, and may each independently be an integer selected from 0 to 3 (for example, 0, 1, or 3). When d1 is 2 or more, two or more of $L_1$(s) may be identical to or different from each other, when d2 is 2 or more, two or more of $L_2$(s) may be identical to or different from each other, when d3 is 2 or more, two or more of $L_3$(s) may be identical to or different from each other, when d4 is 2 or more, two or more of $L_4$(s) may be identical to or different from each other, when d5 is 2 or more, two or more of $L_5$(s) may be identical to or different from each other, when d6 is 2 or more, two or more of $L_6$(s) may be identical to or different from each other, when d7 is 2 or more, two or more of $L_7$(s) may be identical to or different from each other, when d8 is 2 or more, two or more of $L_8$(s) may be identical to or different from each other, and when d9 is 2 or more, two or more of $L_9$(s) may be identical to or different from each other.

$L_1$ to $L_9$ in Formulae 1 and 2 may each independently be a single bond; a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolene group, a dibenzoquinolinylene group, a bipyridinylene group, or a pyridinylene group; or a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolene group, a bipyridinylene group, a dibenzoquinolinylene group, or a pyridinylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrolinyl group, a dibenzoquinol group, a bipyridinyl group, a pyridinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof.

In one or more embodiments, $L_1$ to $L_9$ in Formulae 1 and 2 may each independently be: a single bond; or a phenylene group, a naphthylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolinylene group, a dibenzoquinolinylene group, a bipyridinylene group, or a pyridinylene group; or a phenylene group, a naphthylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolnylene group, a dibenzoquinolinylene group, a bipyridinylene group, or a pyridinylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrolinyl group, a dibenzoquinol group, a bipyridinyl group, a pyridinyl group, or any combination thereof.

In one or more embodiments, $L_1$ to $L_g$ in Formulae 1 and 2 may each independently be: a single bond; a phenylene group or a naphthylene group; or a phenylene group or a naphthylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, or any combination thereof.

In one or more embodiments, $L_1$ to $L_9$ in Formulae 1 and 2 may each independently be a single bond; or a group represented by one of Formulae 4-1 to 4-9.

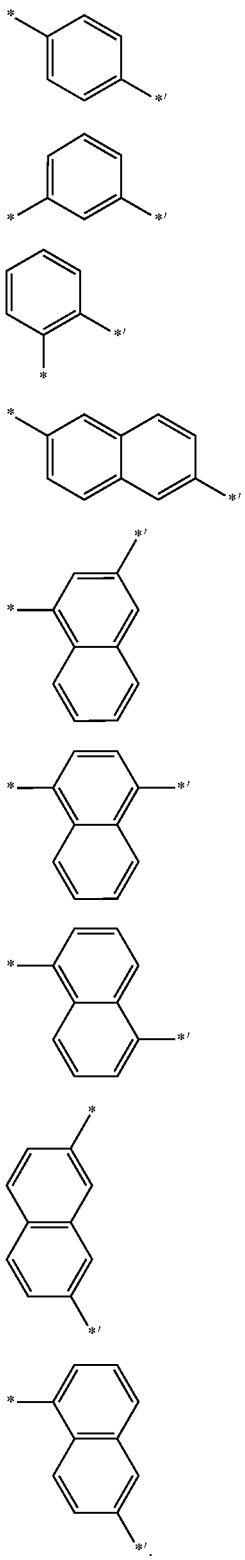

4-1

4-2

4-3

4-4

4-5

4-6

4-7

4-8

4-9

\* and \*' in Formulae 4-1 to 4-9 each indicate a binding site to a neighboring atom.

$Z_{1a}$, $Z_{1b}$, $Z_2$, $Z_3$, and $R_1$ to $R_8$ in Formula 1 or Formula 2 may each independently be a group represented by Formula 2, hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —Si$(Q_1)(Q_2)(Q_3)$, —N$(Q_1)(Q_2)$, —B$(Q_1)(Q_2)$, —C$(\!=\!O)(Q_1)$, —S$(\!=\!O)_2(Q_1)$, or —P$(\!=\!O)(Q_1)(Q_2)$, and $R_1$ to $R_8$ may not be a group represented by Formula 2. That is, each of $R_1$ to $R_8$ may not be a group represented by Formula 2.

In one or more embodiments, one of $Z_{1a}$, $Z_{1b}$, $Z_2$, and $Z_3$ in Formula 1 may be a group represented by Formula 2.

In an embodiment, $Z_{1a}$, $Z_{1b}$, $Z_2$, $Z_3$, and $R_1$ to $R_8$ in Formulae 1 and 2 may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, -CD$_3$, -CD$_2$H, -CDH$_2$, —CF$_3$, —CF$_2$H, —CFH$_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphtho benzofuranyl group, a naphtho benzothiophenyl group, naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, an azadibenzosilolyl group, an indazolyl group, or a pyridoindolyl group, each unsubstituted or substituted with deuterium, —F, —Cl, —Br, —I, -CD$_3$, -CD$_2$H, -CDH$_2$, —CF$_3$, —CF$_2$H, —CFH$_2$, a hydroxyl group, a cyano group, a nitro group, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphtho benzofuranyl group, a naphtho benzothiophenyl group, naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, benzothienocarbazolyl group, benzosilolocarbazolyl group, an imidazopyridinyl group, an imidazopyrimidinyl group, an indazolyl group, a pyridoindolyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), —P(=O)(Q$_{31}$)(Q$_{32}$), or any combination thereof; or
—Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), wherein Q$_1$ to Q$_3$ and Q$_{31}$ to Q$_{33}$ may each independently be:
—CH$_3$, -CD$_3$, -CD$_2$H, -CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, -CD$_2$CD$_3$, -CD$_2$CD$_2$H, or -CD$_2$CDH$_2$; or
an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a C$_1$-C$_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, Z$_{1a}$, Z$_{1b}$, Z$_2$, Z$_3$, and R$_1$ to R$_8$ in Formulae 1 and 2 may each independently be:
hydrogen, deuterium, —F, a cyano group, a C$_1$-C$_{20}$ alkyl group, or a C$_1$-C$_{20}$ alkoxy group;
a C$_1$-C$_{20}$ alkyl group or a C$_1$-C$_{20}$ alkoxy group, each substituted with deuterium, —F, -CD$_3$, -CD$_2$H, -CDH$_2$, —CF$_3$, —CF$_2$H, —CFH$_2$, a cyano group, or any combination thereof;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a C$_1$-C$_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphtho benzofuranyl group, a naphtho benzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, an indazolyl group, or a pyridoindolyl group, each substituted or unsubstituted with deuterium, —F, -CD$_3$, -CD$_2$H, -CDH$_2$, —CF$_3$, —CF$_2$H, —CFH$_2$, a cyano group, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a C$_1$-C$_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphtho benzofuranyl group, a naphtho benzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, an indazolyl group, a pyridoindolyl group, —P(=O)(Q$_{31}$)(Q$_{32}$), —N(Q$_{31}$)(Q$_{32}$), —B(Q$_{31}$)(Q$_{32}$), or any combination thereof; or —P(=O)(Q$_1$)(Q$_2$), —N(Q$_1$)(Q$_2$), or —B(Q$_1$)(Q$_2$).

In an embodiment, Z$_{1a}$, Z$_{1b}$, Z$_2$, Z$_3$, and R$_1$ to R$_8$ in Formulae 1 and 2 may each independently be:
hydrogen, deuterium, —F, or a cyano group;
a group represented by —N(Q$_1$)(Q$_2$) or —P(=O)(Q$_1$)(Q$_2$); or
a phenyl group, a biphenyl group, a carbazolyl group, a pyridinyl group, an indazolyl group, or a pyridoindolyl group, each unsubstituted or substituted with deuterium, —F, a cyano group, a $C_1$-$C_{20}$ alkyl group, a phenyl group, a biphenyl group, a $C_1$-$C_{20}$ alkylphenyl group, a carbazolyl group, a pyridinyl group, an indazolyl group, a pyridoindolyl group, or any combination thereof.

In an embodiment, $Z_{1a}$, $Z_{1b}$, $Z_2$, $Z_3$, and $R_1$ to $R_8$ in Formulae 1 and 2 may each independently be:

hydrogen, deuterium, —F, or a cyano group;

a group represented by —N($Q_1$)($Q_2$) or —P(=O)($Q_1$)($Q_2$); or a group represented by one of Formulae 3-1 to 3-13.

3-1
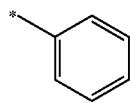

3-2
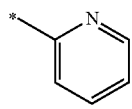

3-3
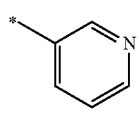

3-4
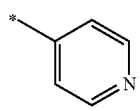

3-5
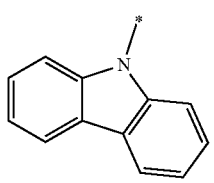

3-6
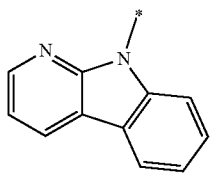

3-7
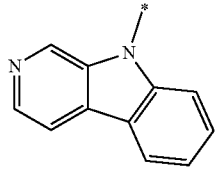

3-8
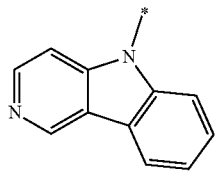

3-9
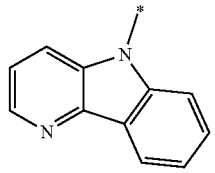

3-10
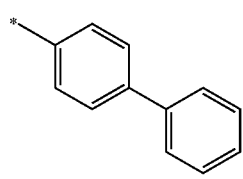

3-11
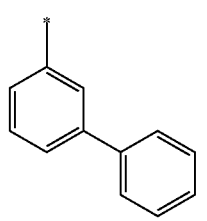

3-12
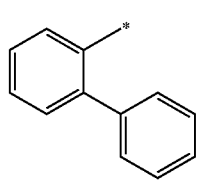

3-13
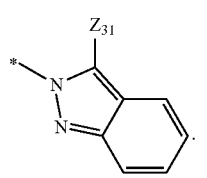

In Formulae 3-1 to 3-13, $Z_{31}$ may be the same as described in connection with $Z_{1a}$, and * may be a binding site to a neighboring atom.

e1 to e8 in Formulae 1 and 2 indicate the numbers of $R_1$ to $R_8$, respectively, and may each independently be an integer from 0 to 10 (for example, 0, 1, or 3). When e1 is 2 or more, two or more of $R_1$(s) may be identical to or different from each other, when e2 is 2 or more, two or more of $R_2$(s) may be identical to or different from each other, when e3 is 2 or more, two or more of Ra(s) may be identical to or different from each other, when e4 is 2 or more, two or more of $R_4$(s) may be identical to or different from each other, when e5 is 2 or more, two or more of $R_5$(s) may be identical to or different from each other, when e6 is 2 or more, two or more of $R_6$(s) may be identical to or different from each other, when e7 is 2 or more, two or more of $R_7$(s) may be identical to or different from each other, and when e8 is 2 or more, two or more of $R_8$(s) may be identical to or different from each other.

* in Formula 2 indicates a binding site to Formula 1.

In Formulae 1 and 2, i) two or more of $R_1$(s) in the number of e1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) two or more of $R_2$(s) in the number of e2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) two or more of $R_3$(s) in the number of e3 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iv) two or more of $R_4$(s) in the number of e4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, v) two or more of $R_5$(s) in the number of e5 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vi) two or more of $R_6$(s) in the number of e6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vii) two or more of $R_7$(s) in the number of e7 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and viii) two or more of $R_8$(s) in the number of e8 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one Ria.

In an embodiment, a group represented by

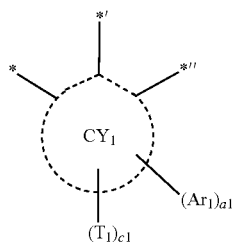

in Formula 1 may be a group represented by one of Formulae CY1-1 to CY1-3.

CY1-1

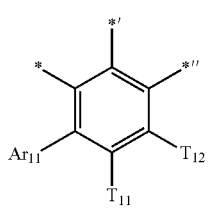

CY1-2

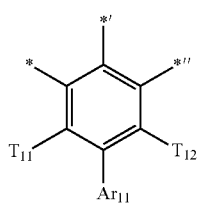

CY1-3

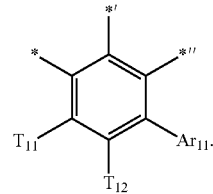

In Formulae CY1-1 to CY1-3,
$Ar_{11}$ is the same as explained in connection with $Ar_1$,
$T_{11}$ and $T_{12}$ are each independently the same as described in connection with $T_1$,
* indicates a binding site to $X_2$ in Formula 1,
*' indicates a binding site to $Y_1$ in Formula 1, and
*" indicates (e.g., is) a binding site to $X_3$ in Formula 1.

For example, at least one of $T_{11}$ or $T_{12}$ in Formulae CY1-1 to CY1-3 may be hydrogen.

For example, a group represented by Formula CY1-2 may be a group represented by Formula CY1-2(1).

CY1-2(1)

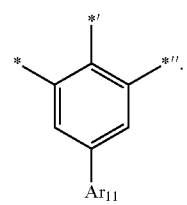

For example, $Ar_{11}$ in Formula CY1-2(1) may be a group represented by Formula 2.

In an embodiment, a group represented by

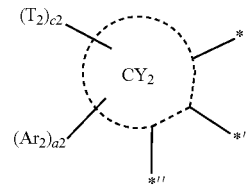

in Formula 1 may be a group represented by one of Formulae CY2-1 to CY2-3.

CY2-1

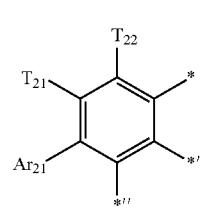

CY2-2

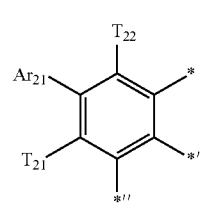

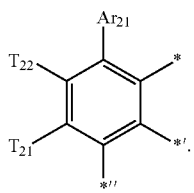
CY2-3

In Formulae CY2-1 to CY2-3,
$Ar_{21}$ is the same as explained in connection with $Ar_2$,
$T_{21}$ and $T_{22}$ are each independently the same as described in connection with $T_2$,
* indicates (e.g., is) a binding site to $X_1$ in Formula 1,
*' indicates a binding site to $Y_1$ in Formula 1, and
*'' indicates (e.g., is) a binding site to $X_2$ in Formula 1.

For example, at least one of $T_{21}$ and $T_{22}$ in Formulae CY2-1 to CY2-3 may be hydrogen.

For example, a group represented by Formula CY2-2 may be a group represented by Formula CY2-2(1).

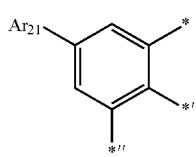
CY2-2(1)

For example, $Ar_{21}$ in Formula CY2-2(1) may be a group represented by Formula 2.

In one or more embodiments a group represented by

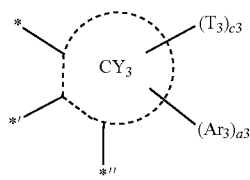

in Formula 1 may be a group represented by one of Formulae CY3-1 to CY3-3.

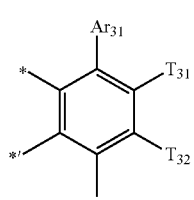
CY3-1

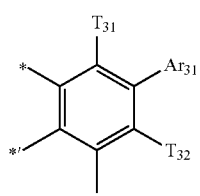
CY3-2

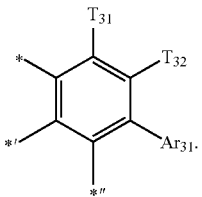
CY3-3

In Formulae CY3-1 to CY3-3,
$Ar_{31}$ is the same as described in connection with $Ar_3$,
$T_{31}$ and $T_{32}$ are each independently the same as described in connection with $T_3$,
* indicates (e.g., is) a binding site to $X_1$ in Formula 1,
*' indicates a binding site to $Y_1$ in Formula 1, and
*'' indicates (e.g., is) a binding site to $X_3$ in Formula 1.

For example, at least one of $T_{31}$ and $T_{32}$ in Formulae CY3-1 to CY3-3 may be hydrogen.

For example, a group represented by Formula CY3-2 may be a group represented by Formula CY3-2(1).

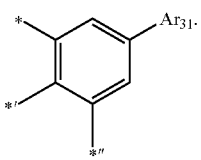
CY3-2(1)

For example, $Ar_{31}$ in Formula CY3-2(1) may be a group represented by Formula 2.

In an embodiment, the sum of a1 and c1 may be an integer of 0 or 3, the sum of a2 and c2 may be an integer of 0 or 3, the sum of a3 and c3 may be an integer of 0 or 3, and the sum of a1, a2, a3, c1, c2, and c3 may be 1 or more.

In an embodiment, the sum of a1 and c1 may be an integer of 0 or 1, the sum of a2 and c2 may be an integer 0 or 1, the sum of a3 and c3 may be an integer of 0 or 1, and the sum of a1, a2, a3, c1, c2, and c3 may be an integer selected from 1 to 3.

In one or more embodiments, when the sum of a1, a2, and a3 in Formula 1 is 1, a group represented by

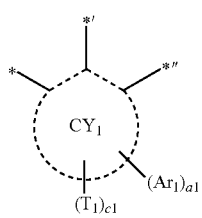

in Formula 1 may be a group represented by Formula CY1-2(1).

In an embodiment when the sum of a1, a2, and a3 in Formula 1 is 2, a group represented by

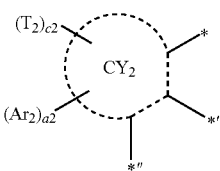

in Formula 1 may be a group represented by Formula CY2-2(1), and a group represented by

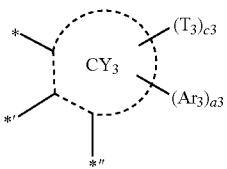

in Formula 1 may be a group represented by Formula CY3-2(1).

In an embodiment, when the sum of a1, a2, and a3 in Formula 1 is 3, a group represented by

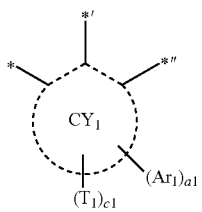

in Formula 1 may be a group represented by Formula CY1-2(1), a group represented by

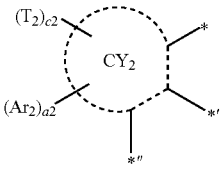

in Formula 1 may be a group represented by Formula CY2-2(1), and a group represented by

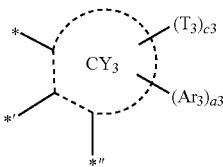

in Formula 1 may be a group represented by Formula CY3-2(1).

In an embodiment, a group represented by

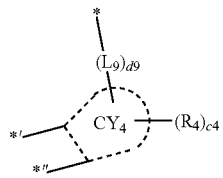

in Formula 2 may be a group represented by one of Formulae CY4-1 to CY4-4.

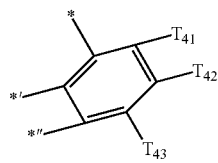

CY4-1

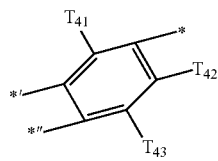

CY4-2

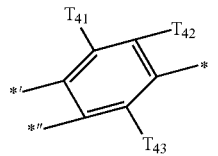

CY4-3

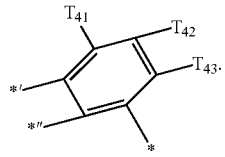

CY4-4

In Formulae CY4-1 to CY4-4,
$T_{41}$ to $T_{43}$ are each independently the same as described in connection with $T_4$,
* indicates a binding site to Formula 1,
*' indicates (e.g., is) a binding site to the carbon to which $T_7$ in Formula 2 is bonded, and
*" indicates (e.g., is) a binding site to the carbon to which $T_8$ in Formula 2 is bonded.

For example, at least one of $T_{41}$ to $T_{43}$ in Formulae CY4-1 to CY4-4 may be hydrogen.

For example, Formula CY4-1 may be a group represented by CY4-1(1).

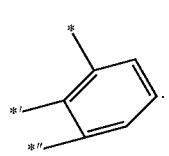

CY4-1(1)

In one or more embodiments, a group represented by

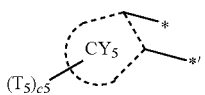

in Formula 2 may be a group represented by one of Formulae CY5-1 to CY5-5.

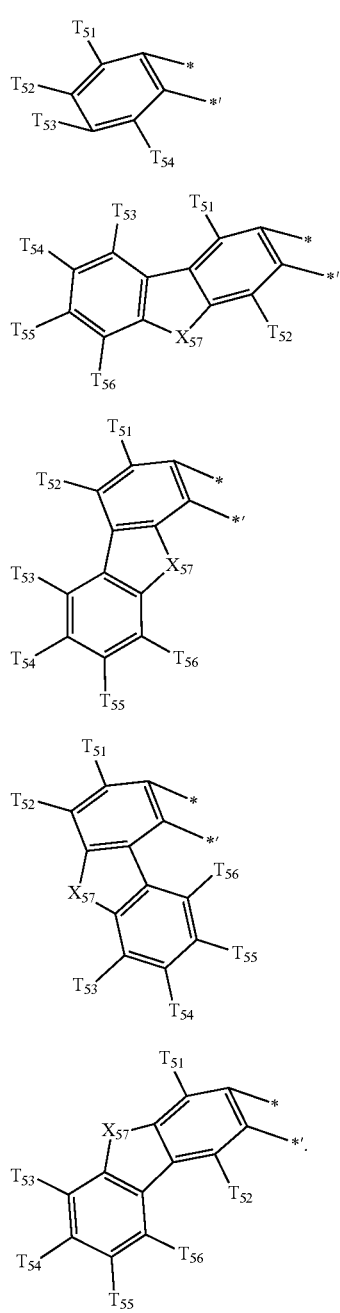

In Formulae CY5-1 to CY5-5,
$X_{57}$ may be O, S, $B(T_{57})$, $N(T_{57})$, $C(T_{57})(T_{58})$, or $Si(T_{57})(T_{58})$, $T_{51}$ to $T_{58}$ are each independently the same as described in connection with $T_5$, \* indicates (e.g., is) a binding site to the carbon to which $T_7$ in Formula 2 is bonded, and \*' indicates (e.g., is) a binding site to the carbon to which $T_8$ in Formula 2 is bonded.

For example, at least one of $T_{51}$ to $T_{56}$ in Formulae CY5-1 to CY5-5 may be hydrogen.

For example, each of Formulae CY5-1 to CY5-5 may be a group represented by one of Formulae CY5-1(1) to CY5-1(4), CY5-2(1), CY5-3(1), CY5-4(1), and CY5-5(1).

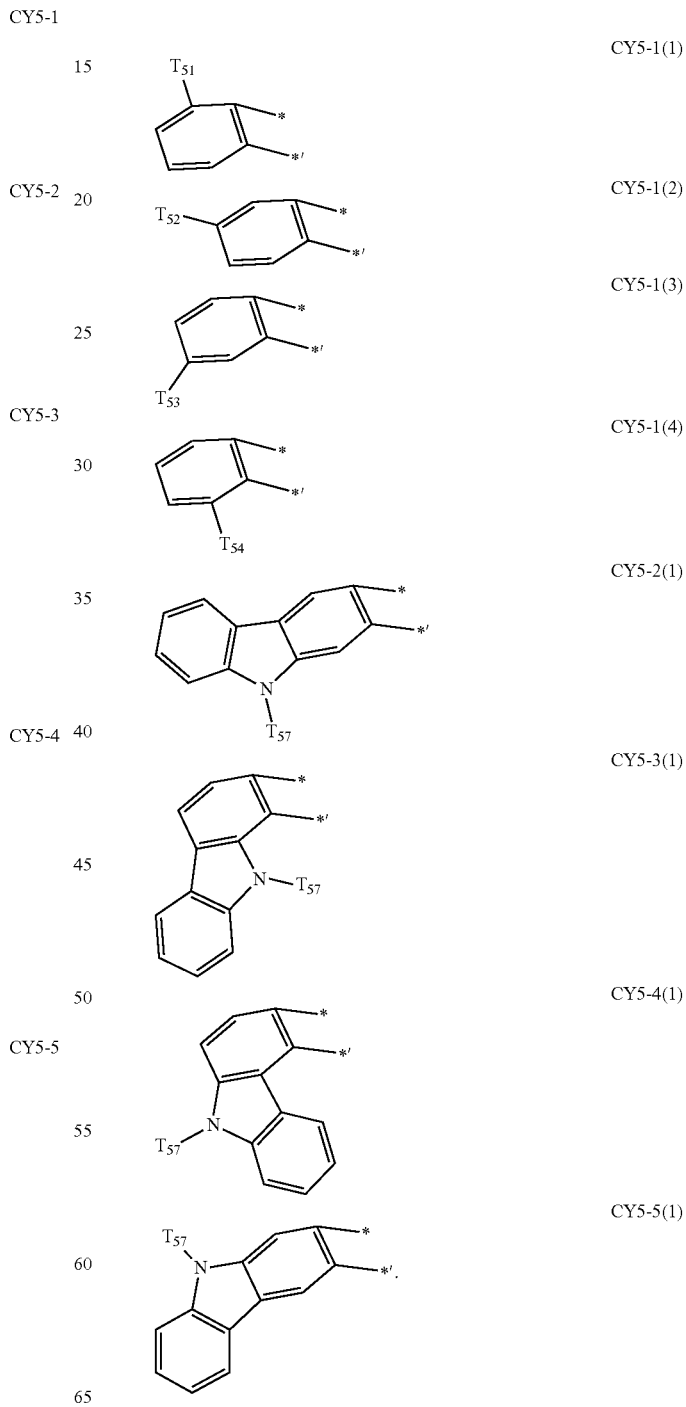

In one or more embodiments, a group represented by

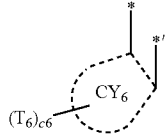

in Formula 2 may be a group represented by one of Formulae CY6-1 to CY6-5.

CY6-1

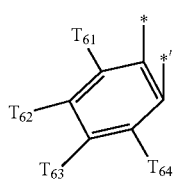

CY6-2

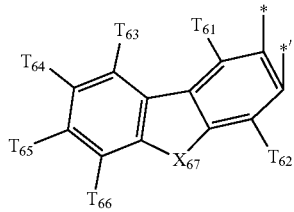

CY6-3

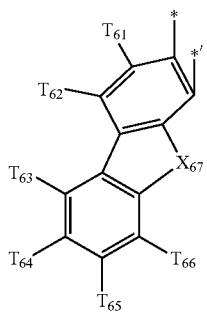

CY6-4

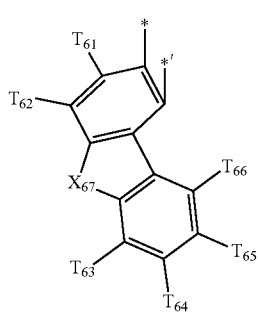

CY6-5

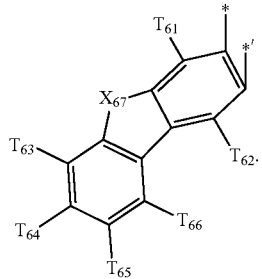

In Formulae CY6-1 to CY6-5,
$X_{67}$ may be O, S, B($T_{67}$), N($T_{67}$), C($T_{67}$)($T_{68}$), or Si($T_{67}$)($T_{68}$),
$T_{61}$ to $T_{68}$ are each independently the same as described in connection with $T_6$,
* is a binding site to the carbon to which $T_7$ in Formula 2 is bonded, and
*' is a binding site to the carbon to which $T_a$ in Formula 2 is bonded.

For example, at least one of $T_{61}$ to $T_{66}$ in Formulae CY6-1 to CY6-5 may be hydrogen.

For example, each of Formulae CY6-1 to CY6-5 may be a group represented by one of Formulae CY6-1(1) to CY6-1(4), CY6-2(1), CY6-3(1), CY6-4(1), and CY6-5(1).

CY6-1(1)

CY6-1(2)

CY6-1(3)

CY6-1(4)

CY6-2(1)

-continued

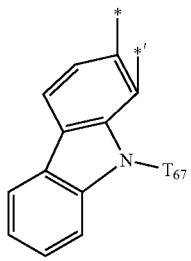
CY6-3(1)

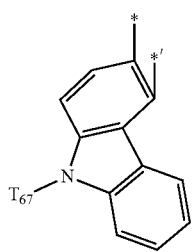
CY6-4(1)

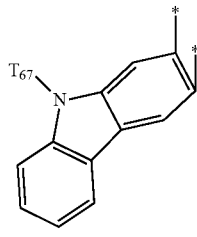
CY6-5(1)

In an embodiment, a group represented by

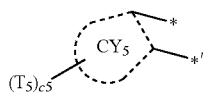

in Formula 2 may be a group represented by Formula CY5-1, and a group represented by

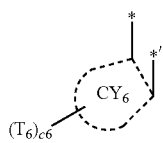

in Formula 2 may be a group represented by one of Formulae CY6-2 to CY6-5.

In one or more embodiments, a group represented by

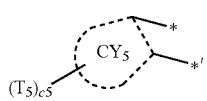

in Formula 2 may be a group represented by one of Formulae CY5-2 to CY5-5, and a group represented by

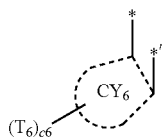

in Formula 2 may be a group represented by Formula CY6-1.

In an embodiment, the sum of c4, c5 and c6 in Formula 2 may be an integer from 0 to 3.

In one or more embodiments, the sum of c4, c5, and c6 in Formula 2 may be 0 or 1.

The heterocyclic compound represented by Formula 1 may be, for example, one of Compounds 1 to 17:

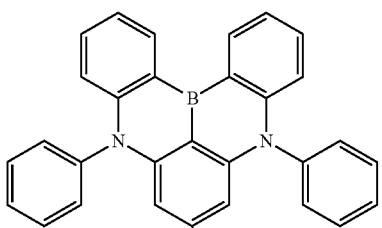

1

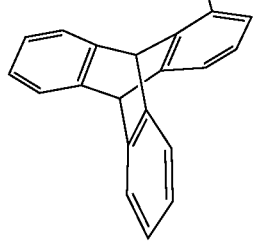

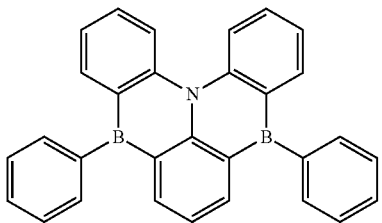

2

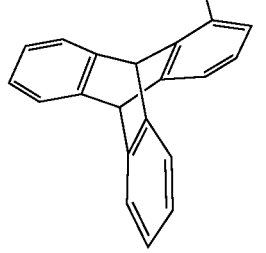

9
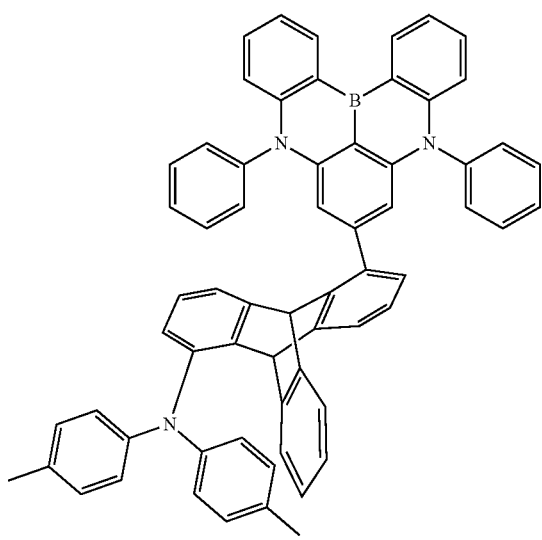
10
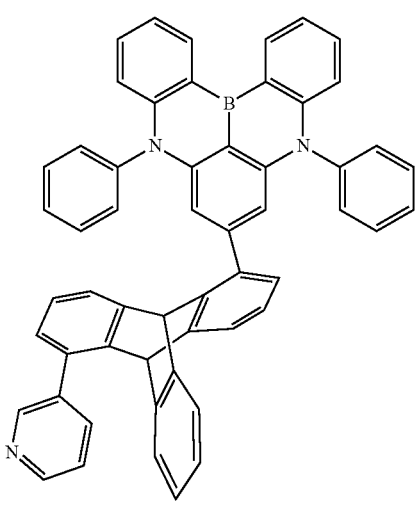
11
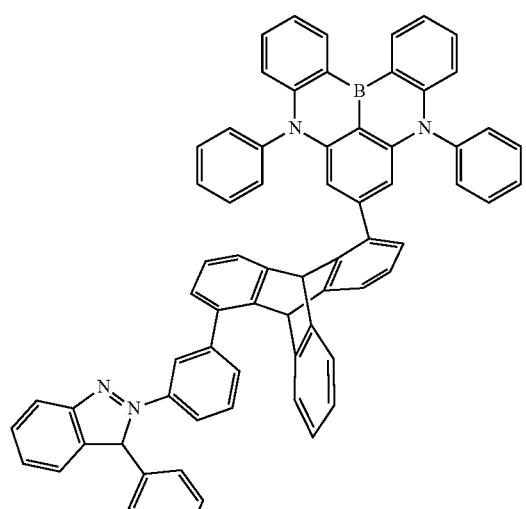
12
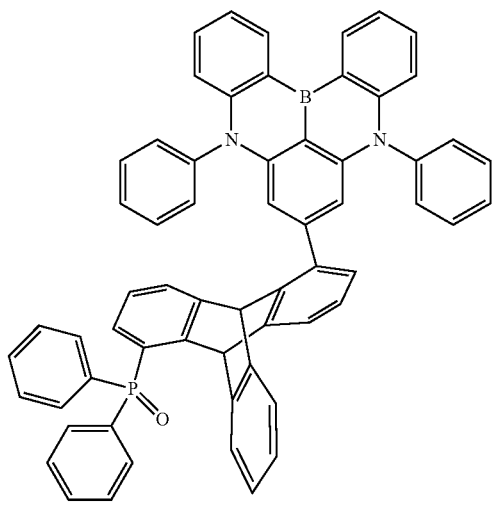
13
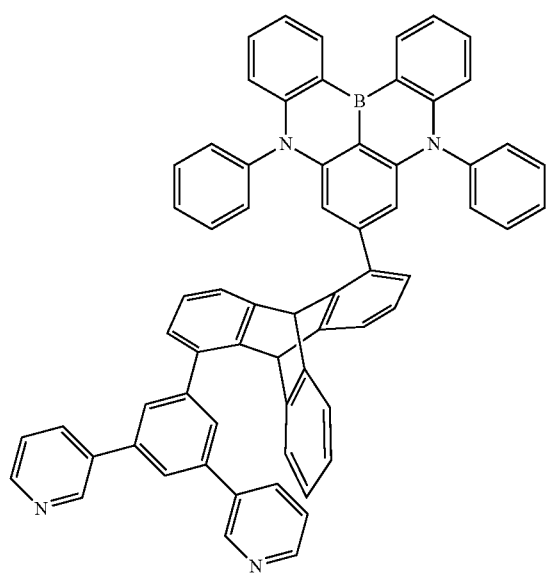
14
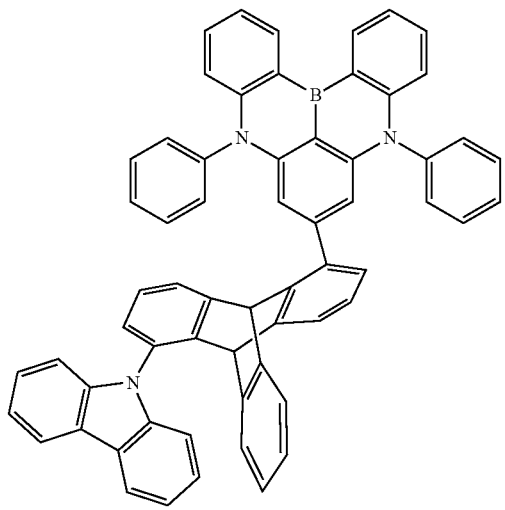

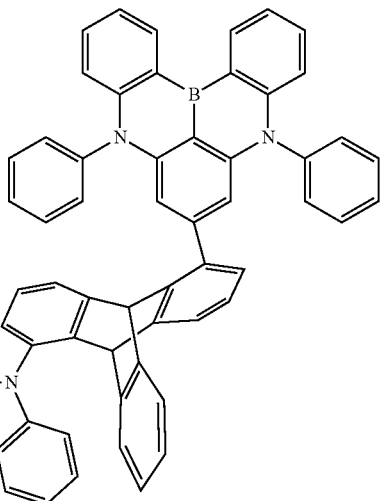

15

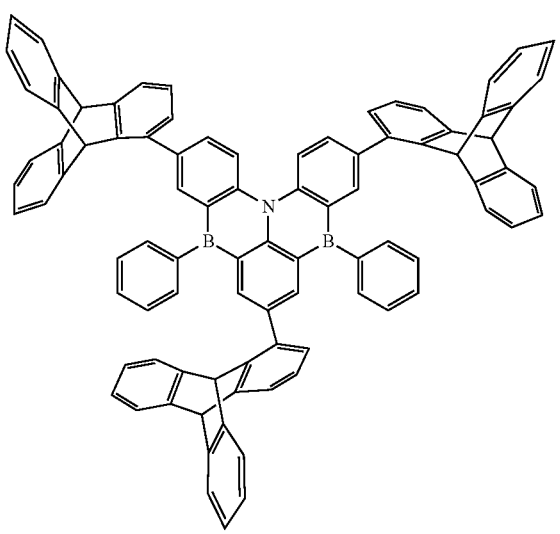

16

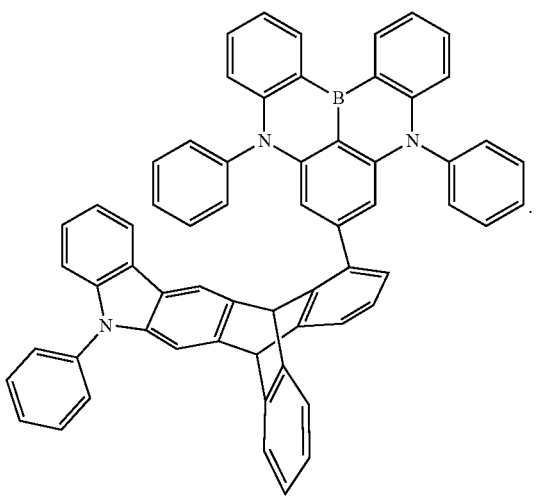

17

The heterocyclic compound represented by Formula 1 may be represented by Formula 1 in which $Ar_1$ to $Ar_3$ are each independently a group represented by Formula 2.

Although not intended to be limited by any particular mechanism or theory, in the case of a compound (e.g., a comparative compound) that has the same structure as Formula 1 except that the substituent group represented by Formula 2 is not included, due to the absence of the aromatic and bulky substituent group represented by Formula 2, the intermolecular distance of the virtual compound (e.g., the comparative compound) may be short, and thus during the intermolecular intersystem crossing, not only intersystem crossing by light (Forster intersystem crossing) but also intersystem crossing by electron (Dexter intersystem crossing) may occur concurrently or simultaneously. Accordingly, the generation ratio of triplet excitons by Dexter intersystem crossing may be increased, and the operation lifespan of the light-emitting device may be reduced due to the long luminescence lifespan of the triplet excitons. However, in the case of the heterocyclic compound represented by Formula 1 containing the substituent group represented by Formula 2, because the substituent group represented by Formula 2 is a bulky group, the distance from neighboring molecules may be sufficiently long. Moreover, because the substituent group represented by Formula 2 has aromaticity, strong electromagnetic repulsion thereof with neighboring molecules may be induced. Accordingly, the heterocyclic compound represented by Formula 1 containing the substituent group represented by Formula 2 may be effectively spaced apart from neighboring molecules. In this case, Dexter intersystem crossing may be restricted (or reduced), and the Forster intersystem crossing ratio may be increased. Accordingly, the intersystem crossing ratio by singlet exciton may be increased, so that the operation lifespan of the light-emitting device may be improved.

Accordingly, an electronic device, for example, a light-emitting device, including the heterocyclic compound represented by Formula 1 and a phosphorescent compound to be described in more detail herein below may have improved luminescence efficiency and/or lifespan.

Synthesis methods of the heterocyclic compound represented by Formula 1 may be recognizable by one of ordinary skill in the art by referring to Synthesis Examples and/or Examples provided below.

At least one heterocyclic compound represented by Formula 1 may be utilized in a light-emitting device (for example, an organic light-emitting device). Therefore, a light-emitting device is provided, including: a first electrode; a second electrode facing the first electrode; and an interlayer located between the first electrode and the second electrode and including an emission layer, wherein the emission layer includes the heterocyclic compound represented by Formula 1 and a phosphorescent compound.

In some embodiments,
the first electrode of the light-emitting device is an anode,
the second electrode of the light-emitting device is a cathode,
the interlayer further includes a hole transport region located between the first electrode and the emission layer and an electron transport region located between the emission layer and the second electrode,
the hole transport region may include a hole injection layer, a hole transport layer, an emission auxiliary layer, an electron blocking layer, or any combination thereof, and The electron transport region may include a buffer layer, a hole blocking layer, an electron control layer, an electron transport layer, an electron injection layer, or any combination thereof.

In an embodiment, the heterocyclic compound represented by Formula 1 and the phosphorescent compound may be included between the first electrode and the second electrode of the light-emitting device. Accordingly, the heterocyclic compound represented by Formula 1 and a phosphorescent compound may be included in the interlayer of the light-emitting device, for example, in the emission layer of the interlayer. The emission layer may emit red light, green light, blue light, and/or white light. For example, the emission layer may emit blue light. The blue light may have a maximum emission wavelength of, for example, about 400 nm to about 490 nm.

In an embodiment, the emission layer may further include a host, and the amount of the host may be greater than the amount of the heterocyclic compound represented by Formula 1. For example, the host included in the emission layer may include two or more different kinds (e.g., types) of hosts.

For example, the phosphorescent compound may be a phosphorescent dopant. For example, the phosphorescent compound may include, as a phosphorescent dopant, an organometallic compound. For example, the phosphorescent compound may include a organometallic compound containing platinum (Pt).

In an embodiment, the light-emitting device may include a capping layer located outside the first electrode or outside the second electrode. For example, the capping layer may include the heterocyclic compound represented by Formula 1.

In an embodiment, the light-emitting device may further include at least one of a first capping layer located outside the first electrode and a second capping layer located outside the second electrode, and the heterocyclic compound represented by Formula 1 may be included in at least one of the first capping layer and the second capping layer. More details for the first capping layer and/or the second capping layer are the same as described in the present specification.

In one or more embodiments, the light-emitting device may further include:
- a first capping layer located outside the first electrode (e.g., facing away from the second electrode) and containing the heterocyclic compound represented by Formula 1;
- a second capping layer located outside the second electrode (e.g., facing away from the first electrode) and containing the heterocyclic compound represented by Formula 1; or
- both the first capping layer and the second capping layer.

The expression "(an interlayer and/or a capping layer) includes at least one heterocyclic compound represented by Formula 1" as used herein may include a case in which "(an interlayer and/or a capping layer) includes identical heterocyclic compounds represented by Formula 1" and a case in which "(an interlayer and/or a capping layer) includes two or more different heterocyclic compounds represented by Formula 1."

For example, the interlayer and/or capping layer may include only Compound 1 as the heterocyclic compound represented by Formula 1. In this regard, Compound 1 may exist in the emission layer of the light-emitting device. In one or more embodiments, the interlayer may include, as the heterocyclic compound represented by Formula 1, Compound 1 and Compound 2. In this regard, Compound 1 and Compound 2 may exist in an identical layer (for example, Compound 1 and Compound 2 may both exist in an emission layer), or different layers (for example, Compound 1 may exist in an emission layer and Compound 2 may exist in an electron transport region).

The term "interlayer" as used herein refers to a single layer and/or all of a plurality of layers located between a first electrode and a second electrode of a light-emitting device.

According to one or more embodiments, an electronic apparatus includes the light-emitting device. The electronic apparatus may further include a thin-film transistor. In one or more embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described in the present specification.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate and/or a plastic substrate may be utilized. In one or more embodiments, the substrate may be a flexible substrate, and may include plastics having suitable (e.g., excellent) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that can facilitate injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be utilized as a material for forming the first electrode 110.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region placed between the first electrode 110 and the emission layer and an electron transport region placed between the emission layer and the second electrode 150.

The interlayer 130 may further include, in addition to various suitable organic materials, one or more metal-containing compounds such as organometallic compounds, inorganic materials such as quantum dots, and/or the like.

In one or more embodiments, the interlayer 130 may include, i) two or more light-emitting units sequentially stacked between the first electrode 110 and the second electrode 150 and ii) a charge generation layer located between the two or more emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, constituting layers are stacked sequentially from the first electrode 110 in the respective stated order.

The hole transport region may include a compound represented by Formula 201, a compound represented by Formula 202, or any combination thereof:

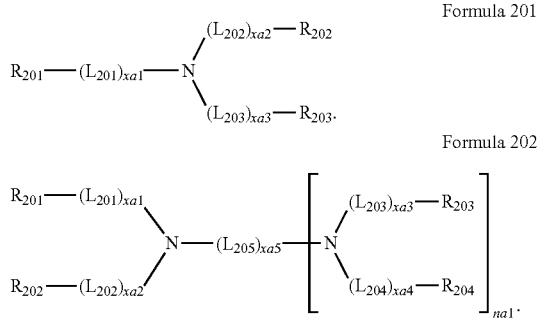

Formula 201

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of the groups represented by Formulae CY201 to CY217.

CY201

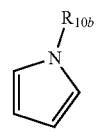

CY202

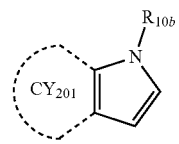

CY203

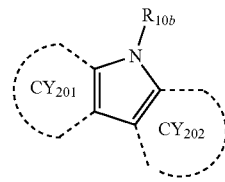

CY204

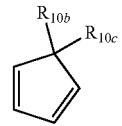

CY205

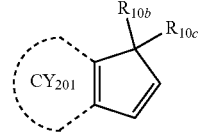

CY206

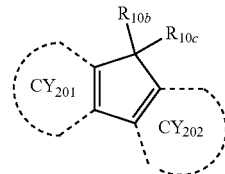

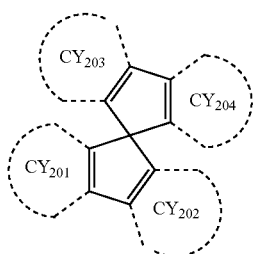
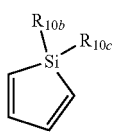
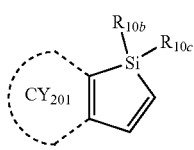
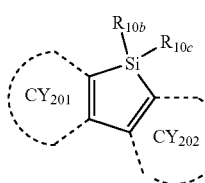
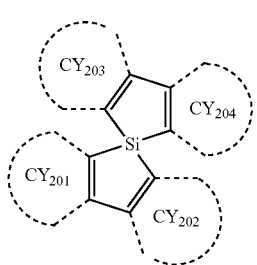
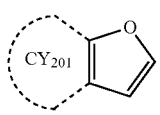
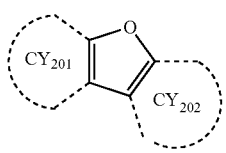

CY207
CY208
CY209
CY210
CY211
CY212
CY213
CY214
CY215

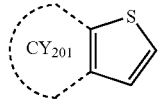

CY216

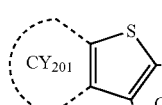

CY217

$R_{10b}$ and $R_{10c}$ in Formulae CY201 to CY217 are each independently the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{20}1$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include any of the groups represented by Formulae CY201 to CY203.

In one or more embodiments, each of Formulae 201 and 202 may not include any of the groups represented by Formulae CY201 to CY203, and may include at least one of the groups represented by Formulae CY204 to CY217.

In one or more embodiments, each of Formulae 201 and 202 may not include any of the groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
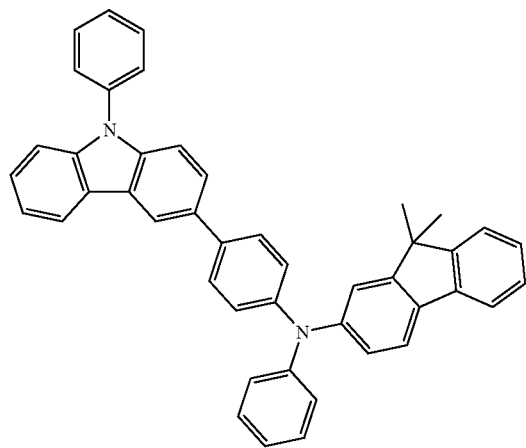
HT2
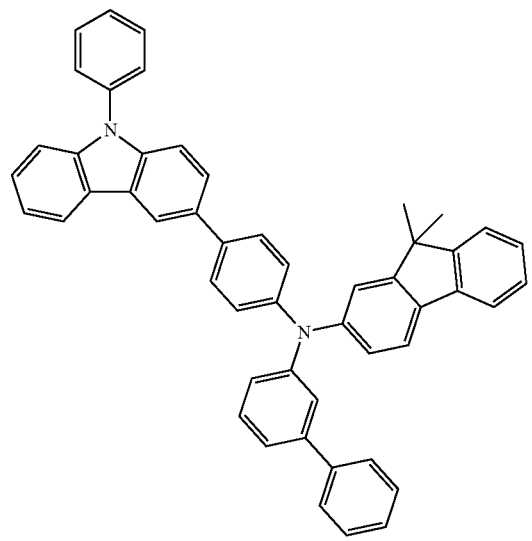
HT3
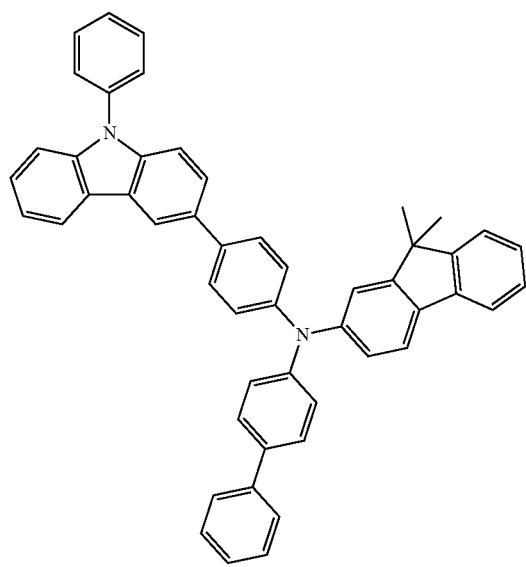
HT4
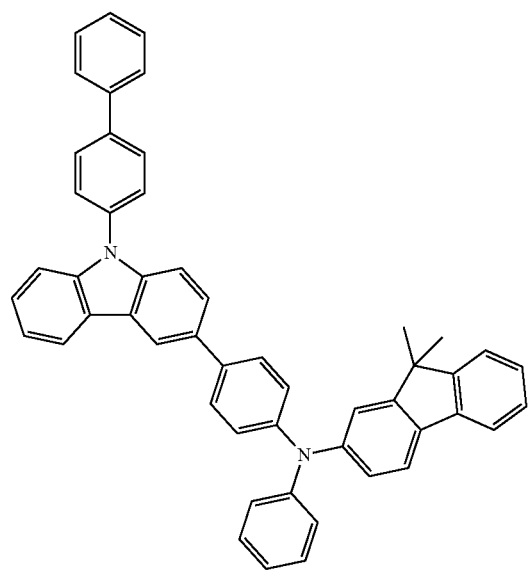

-continued
HT5
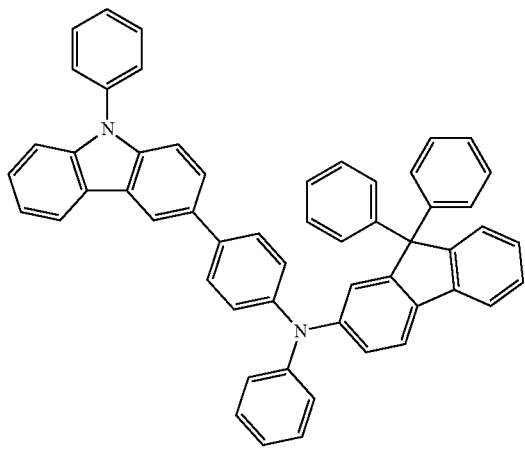
HT6
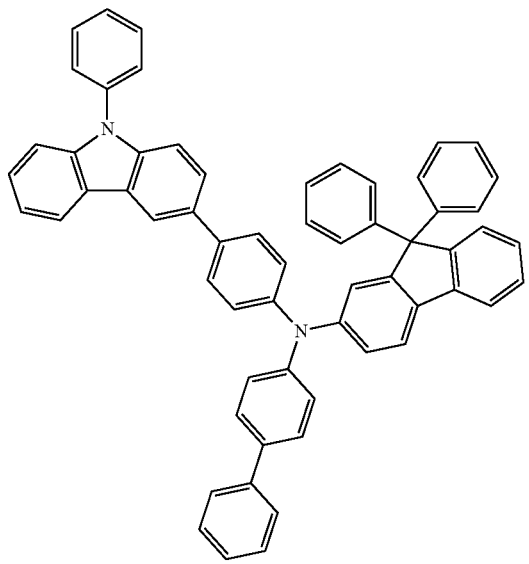
HT7
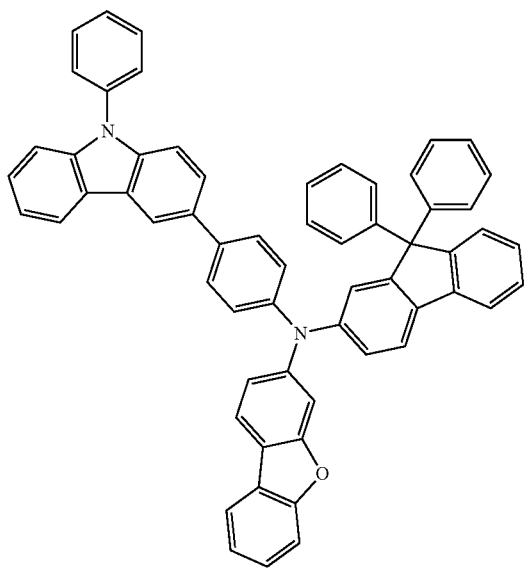
HT8
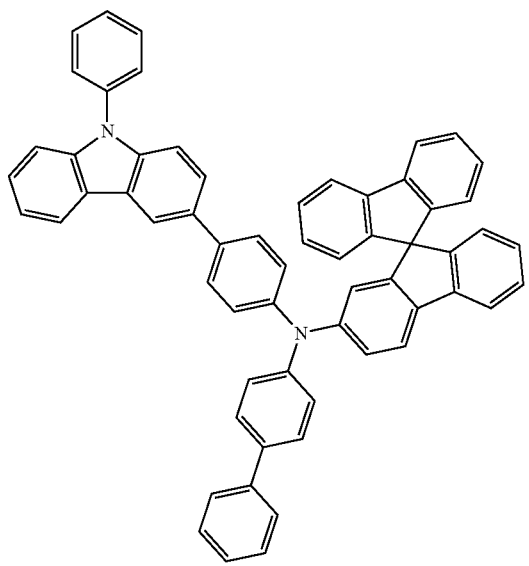

-continued
HT9
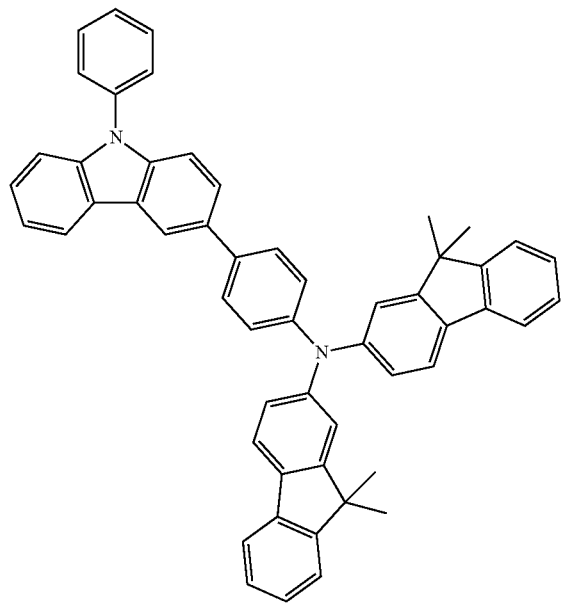
HT10
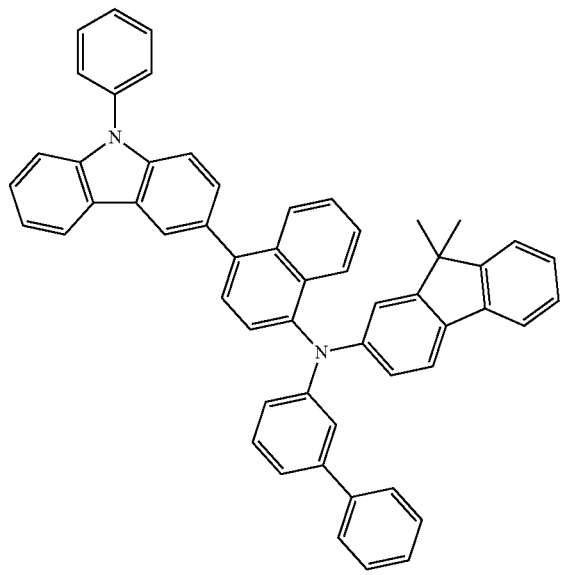
HT11
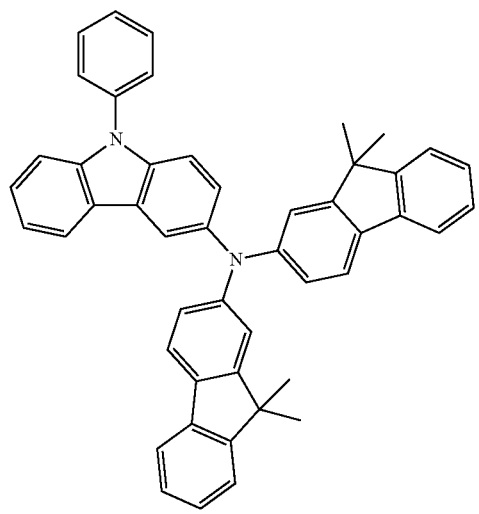
H12
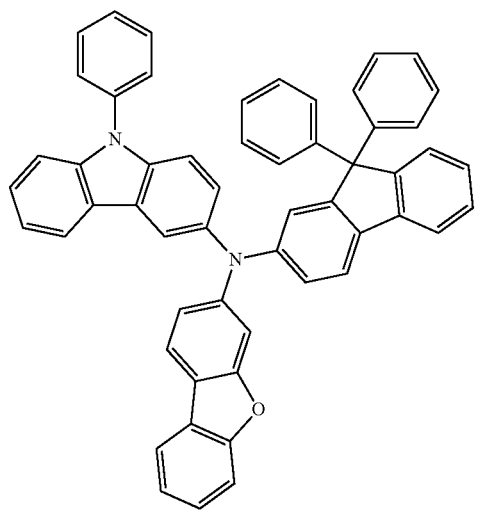

-continued
HT13
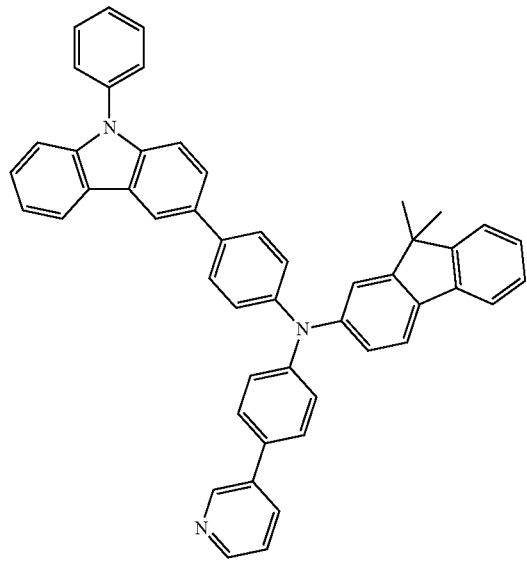
HT14
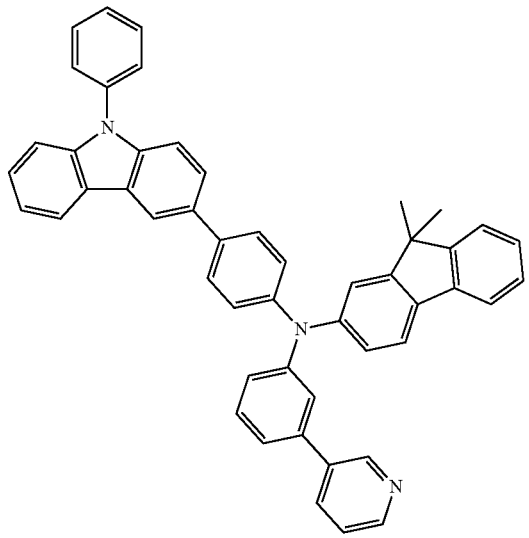
HT15
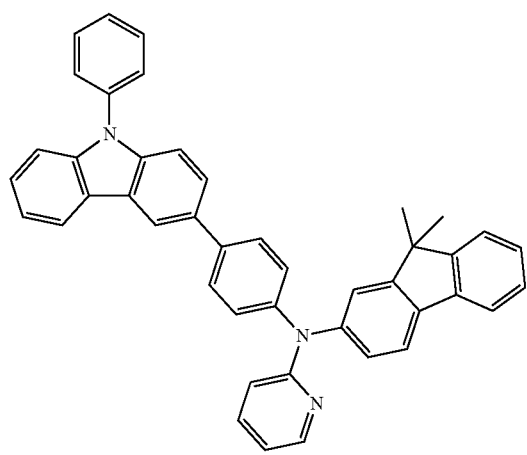
HT16
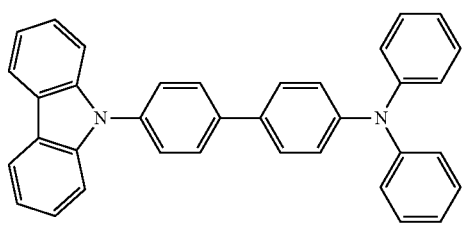
HT17
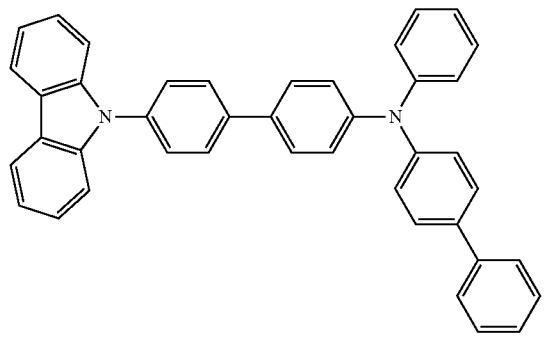
HT18
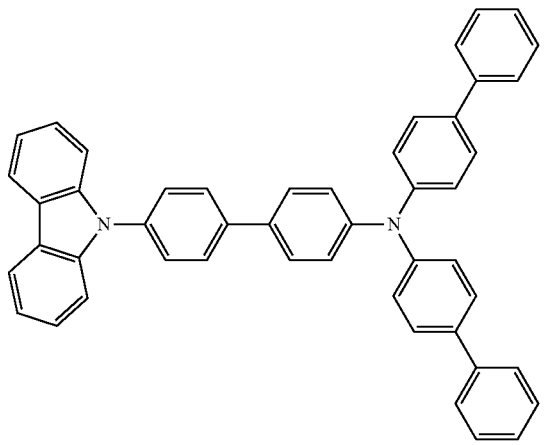

-continued
HT19
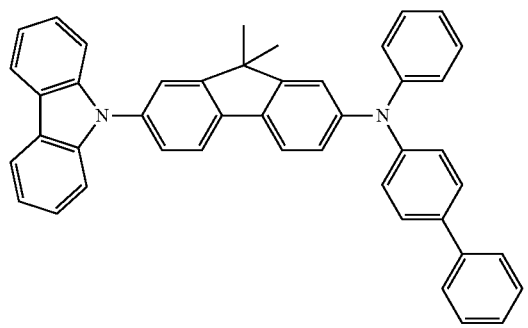
HT20
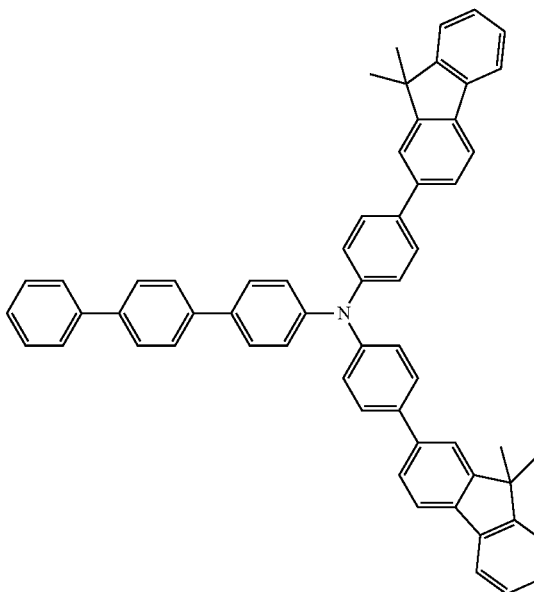
HT21
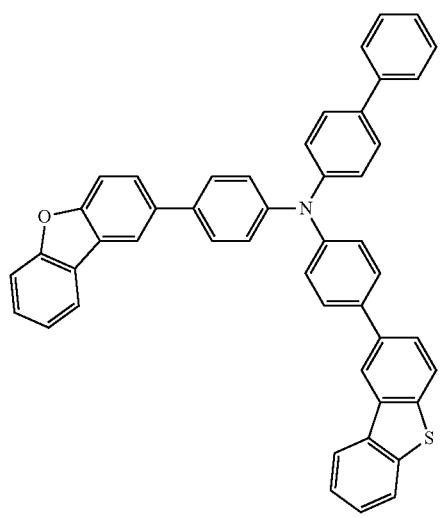
HT22
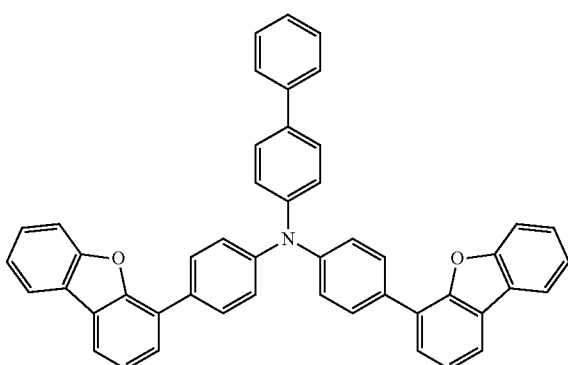
HT23
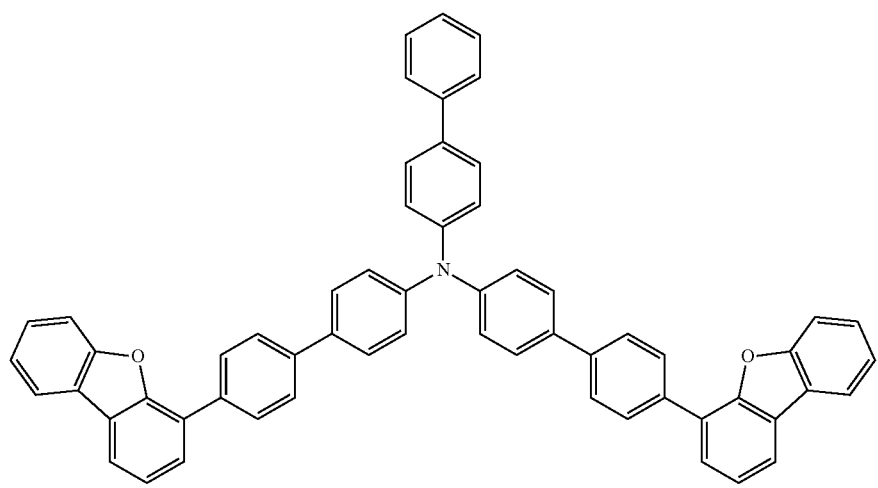

-continued
HT24
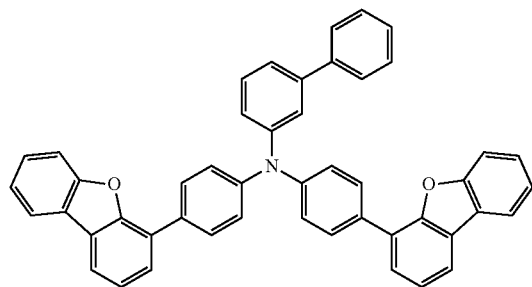
HT25
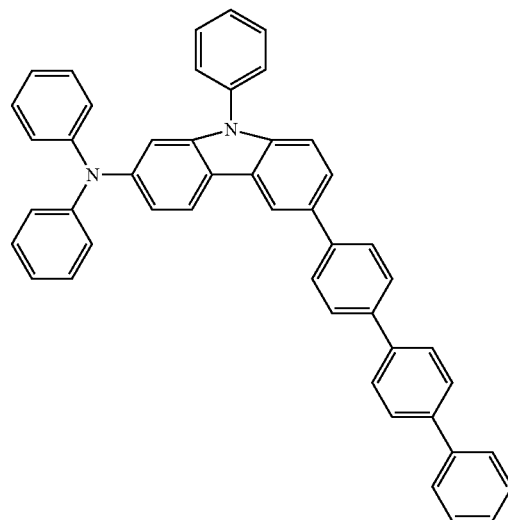
HT26
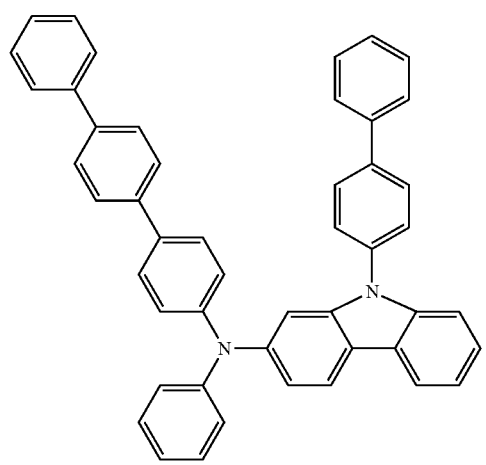
HT27
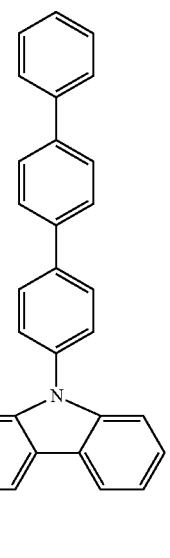
HT28
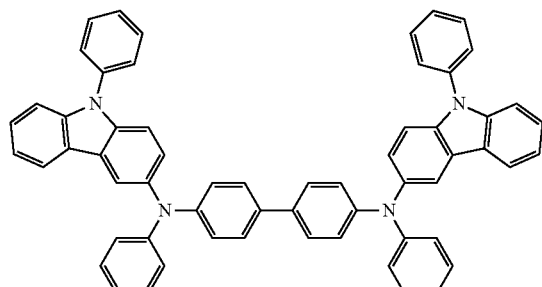
HT29
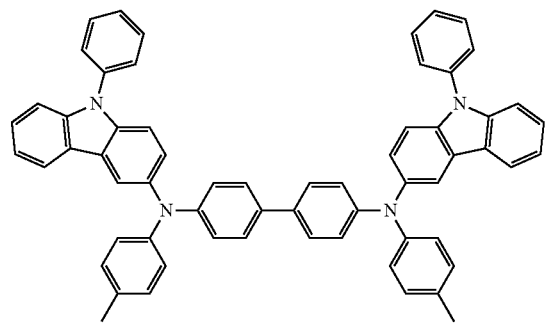

-continued
HT30
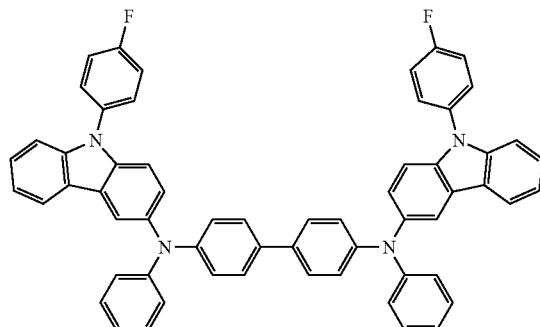
HT31
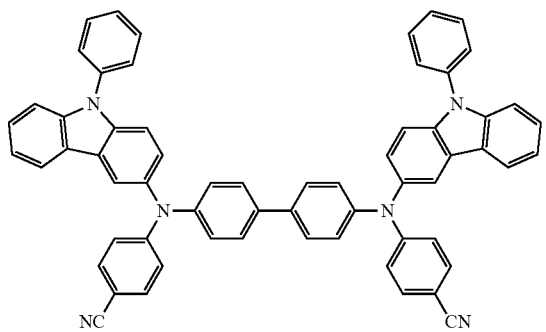
HT32
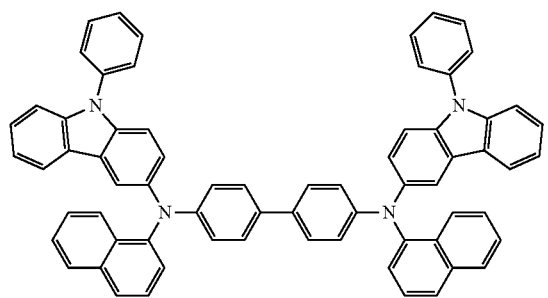
HT33
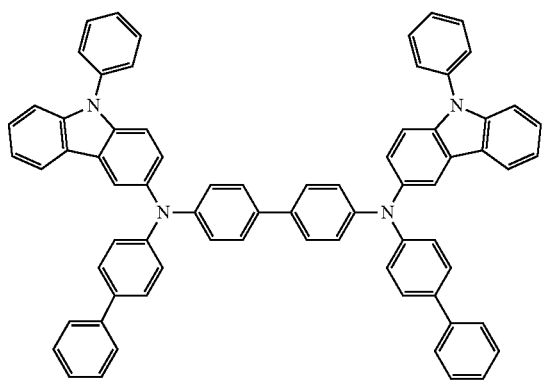
HT34
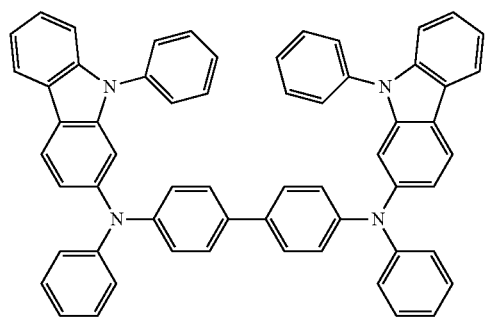
HT35
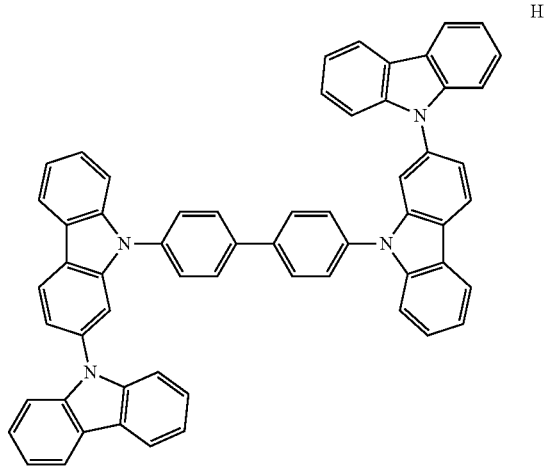
HT36
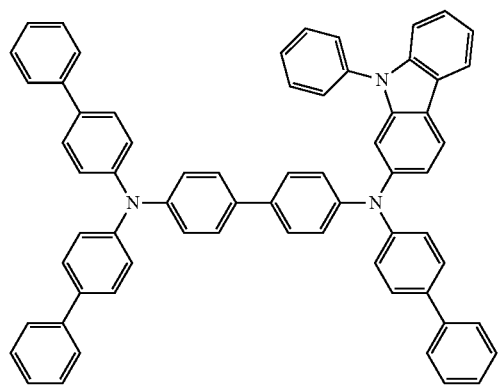
HT37
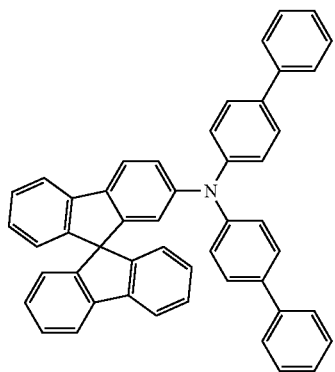

-continued
HT38
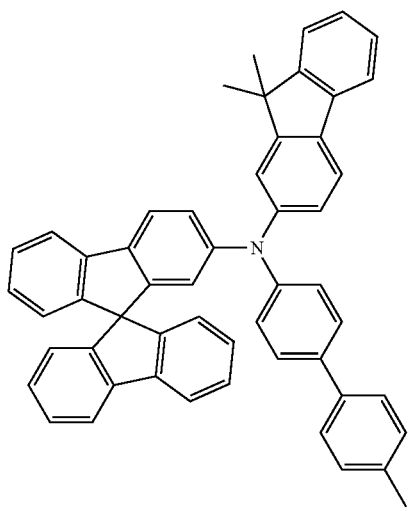
HT39
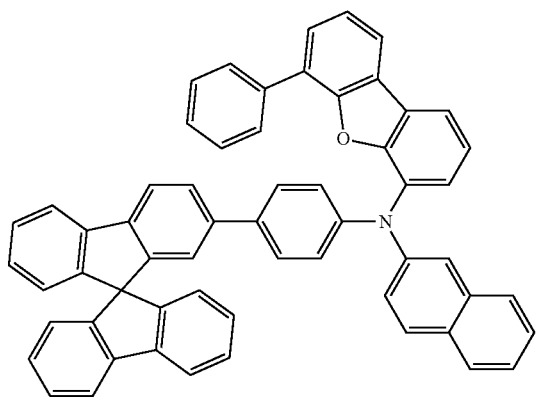
HT40
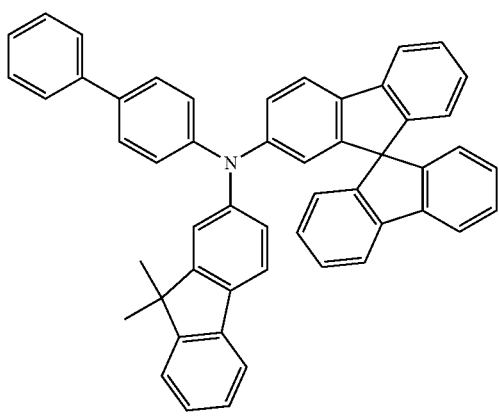
HT41
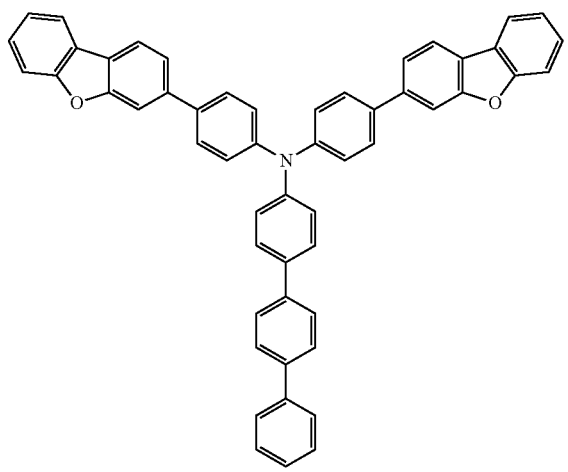
HT42
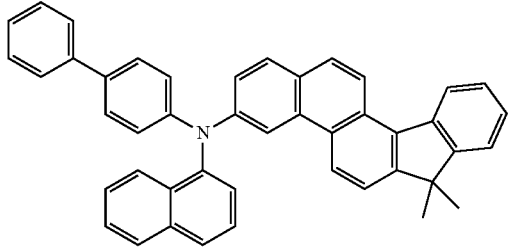
HT43
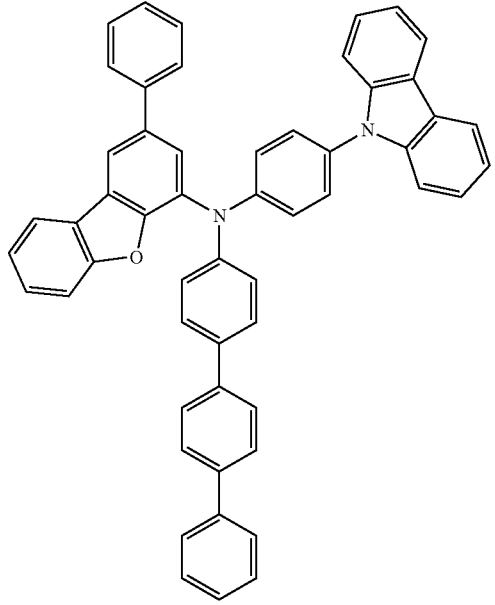

HT44
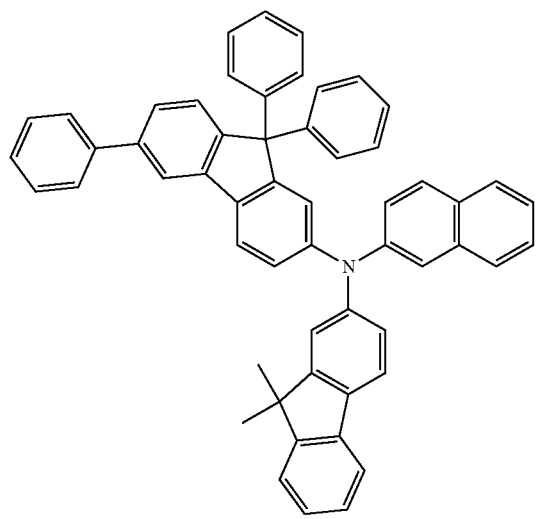
HT45
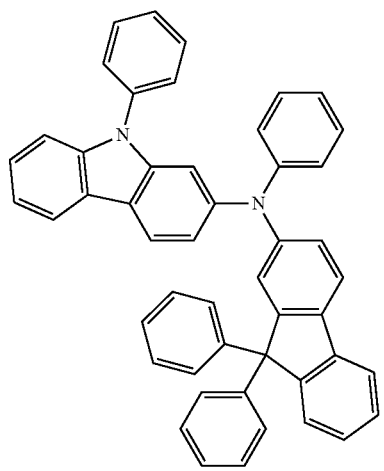
HT45
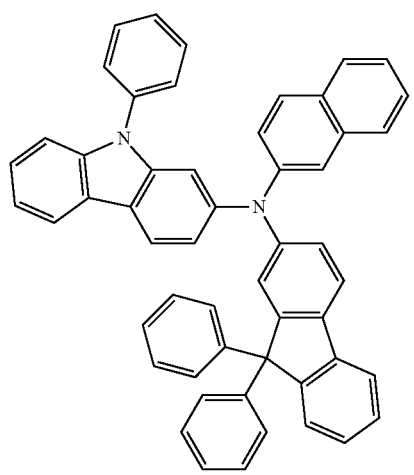
m-MTDATA
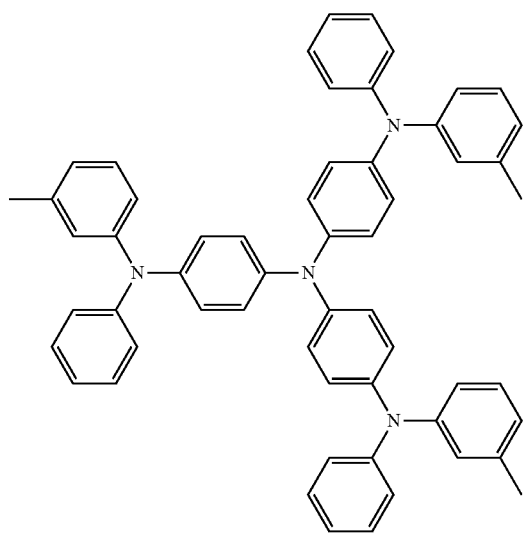

-continued
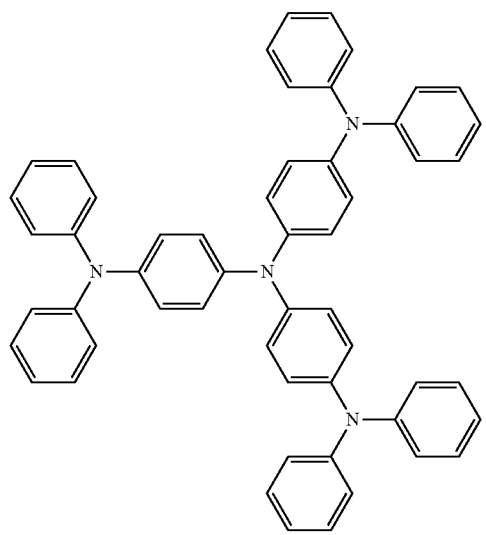
TDATA
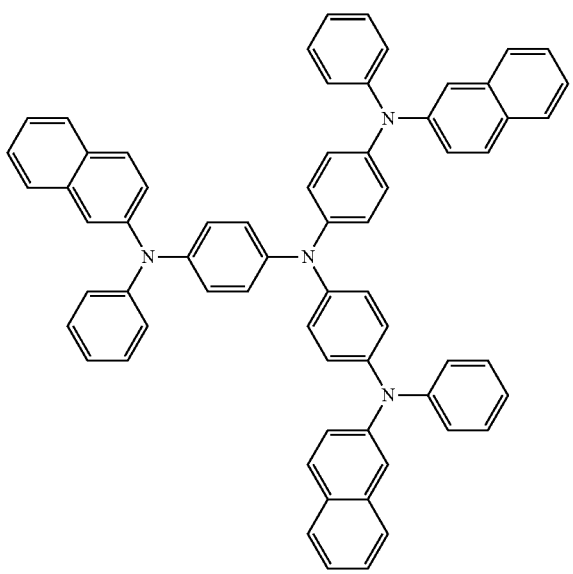
2-TNATA
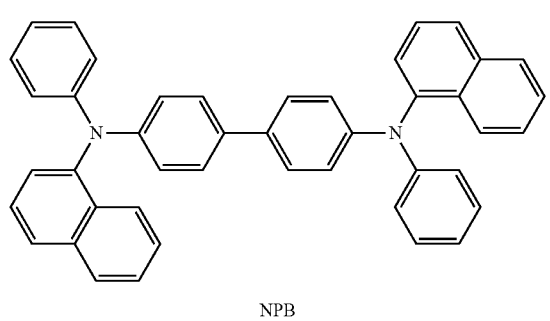
NPB
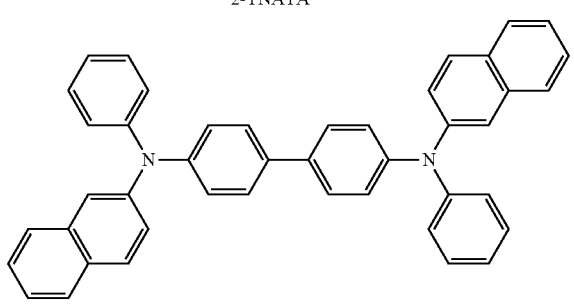
β-NPB
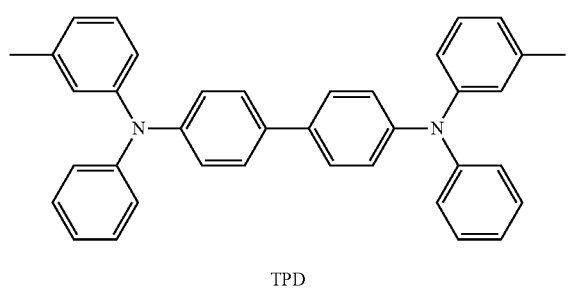
TPD
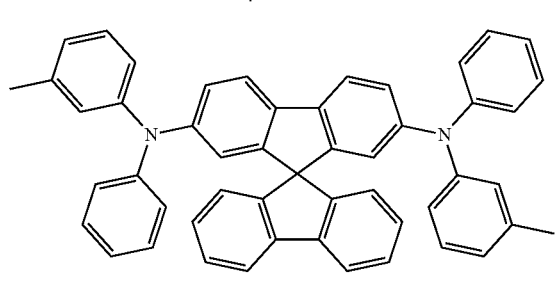
Spiro-TPD
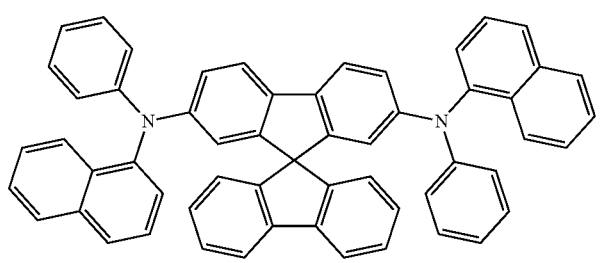
Spiro-TPD
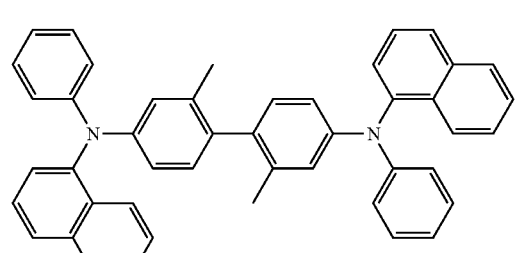
methylated NPB

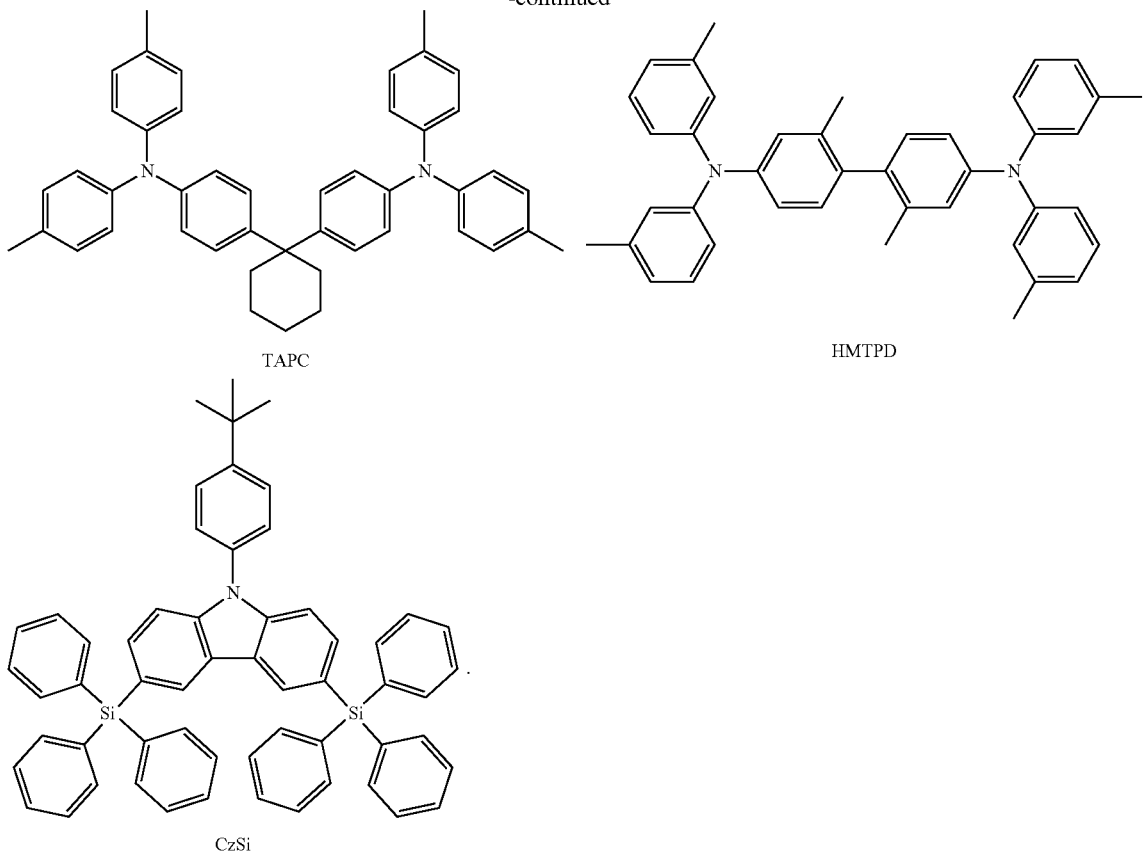

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron-blocking layer may block or reduce the flow (e.g., leakage) of electrons from the emission layer to the hole transport region. Materials that may be included in the hole transport region may be included in the emission auxiliary layer and the electron-blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer including (e.g., consisting of) the charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2 (to be described in more detail below), or any combination thereof.

Examples of the quinone derivative may include (e.g., may be) TCNQ, F4-TCNQ, etc.

Examples of the cyano group-containing compound may include (e.g., may be) HAT-CN, and a compound represented by Formula 221 below.

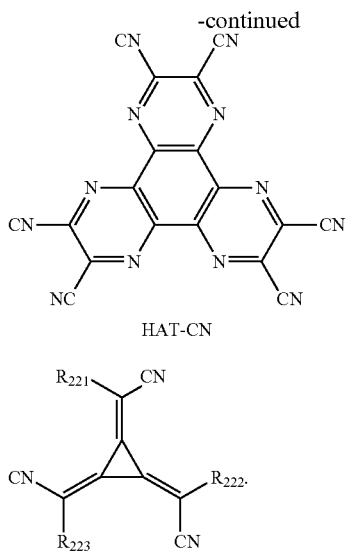

HAT-CN

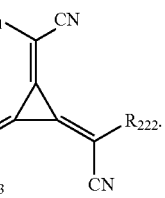

Formula 221

In Formula 221,
R$_{221}$ to R$_{223}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, and at least one of R$_{221}$ to R$_{223}$ may each independently be a C$_3$-C$_{60}$ carbocyclic group or a C$_1$-C$_{60}$ heterocyclic group, each substituted with a cyano group; —F; —Cl; —Br; —I; a C$_1$-C$_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include (e.g., may be) an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include (e.g., may be) silicon (Si), antimony (Sb), and tellurium (Te).

Examples of the non-metal may include (e.g., may be) oxygen (O) and halogen (for example, F, Cl, Br, I, etc.).

In one or more embodiments, examples of the compound including element EL1 and element EL2 may include (e.g., may be) a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include (e.g., may be) tungsten oxide (for example, WO, W$_2$O$_3$, WO$_2$, WO$_3$, W$_2$O$_5$, etc.), vanadium oxide (for example, VO, V$_2$O$_3$, VO$_2$, V$_2$O$_5$, etc.), molybdenum oxide (MoO, Mo$_2$O$_3$, MoO$_2$, MoO$_3$, Mo$_2$O$_5$, etc.), and rhenium oxide (for example, ReO$_3$, etc.).

Examples of the metal halide may include (e.g., may be) an alkali metal halide, an alkaline earth metal halide, a transition metal halide, a post-transition metal halide, and a lanthanide metal halide.

Examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include (e.g., may be) BeF$_2$, MgF$_2$, CaF$_2$, SrF$_2$, BaF$_2$, BeCl$_2$, MgCl$_2$, CaCl$_2$, SrCl$_2$, BaCl$_2$, BeBr$_2$, MgBr$_2$, CaBr$_2$, SrBr$_2$, BaBr$_2$, BeI$_2$, MgI$_2$, CaI$_2$, SrI$_2$, and BaI$_2$.

Examples of the transition metal halide may include (e.g., may be) titanium halide (for example, TiF$_4$, TiCl$_4$, TiBr$_4$, TiI$_4$, etc.), zirconium halide (for example, ZrF$_4$, ZrCl$_4$, ZrBr$_4$, ZrI$_4$, etc.), hafnium halide (for example, HfF$_4$, HfCl$_4$, HfBr$_4$, HfI$_4$, etc.), vanadium halide (for example, VF$_3$, VCl$_3$, VBr$_3$, VI$_3$, etc.), niobium halide (for example, NbF$_3$, NbCl$_3$, NbBr$_3$, NbI$_3$, etc.), tantalum halide (for example, TaF$_3$, TaCl$_3$, TaBr$_3$, TaI$_3$, etc.), chromium halide (for example, CrF$_3$, CrCl$_3$, CrBr$_3$, CrI$_3$, etc.), molybdenum halide (for example, MoF$_3$, MOCl$_3$, MoBr$_3$, MoI$_3$, etc.), tungsten halide (for example, WF$_3$, WCl$_3$, WBr$_3$, WI$_3$, etc.), manganese halide (for example, MnF$_2$, MnCl$_2$, MnBr$_2$, MnI$_2$, etc.), technetium halide (for example, TcF$_2$, TcCl$_2$, TcBr$_2$, TcI$_2$, etc.), rhenium halide (for example, ReF$_2$, ReCl$_2$, ReBr$_2$, ReI$_2$, etc.), iron halide (for example, FeF$_2$, FeCl$_2$, FeBr$_2$, FeI$_2$, etc.), ruthenium halide (for example, RuF$_2$, RuCl$_2$, RuBr$_2$, RuI$_2$, etc.), osmium halide (for example, OsF$_2$, OSC$_2$, OsBr$_2$, OSI$_2$, etc.), cobalt halide (for example, CoF$_2$, COCl$_2$, CoBr$_2$, CoI$_2$, etc.), rhodium halide (for example, RhF$_2$, RhCl$_2$, RhBr$_2$, RhI$_2$, etc.), iridium halide (for example, IrF$_2$, IrCl$_2$, IrBr$_2$, IrI$_2$, etc.), nickel halide (for example, NiF$_2$, NiCl$_2$, NiBr$_2$, NiI$_2$, etc.), palladium halide (for example, PdF$_2$, PdCl$_2$, PdBr$_2$, PdI$_2$, etc.), platinum halide (for example, PtF$_2$, PtC$_2$, PtBr$_2$, PtI$_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include (e.g., may be) zinc halide (for example, ZnF$_2$, ZnCl$_2$, ZnBr$_2$, ZnI$_2$, etc.), indium halide (for example, In$_3$, etc.), and tin halide (for example, SnI$_2$, etc.).

Examples of the lanthanide metal halide may include (e.g., may be) YbF, YbF$_2$, YbF$_3$, SmF$_3$, YbCl, YbCl$_2$, YbCb$_3$ SmCl$_3$, YbBr, YbBr$_2$, YbBr$_3$ SmBr$_3$, YbI, YbI$_2$, YbI$_3$, and SmI$_3$.

An example of the metalloid halide may include (e.g., may be) antimony halide (for example, SbCl$_5$, etc.).

Examples of the metal telluride may include (e.g., may be) an alkali metal telluride (for example, Li$_2$Te, Na$_2$Te, K$_2$Te, Rb$_2$Te, Cs$_2$Te, etc.), an alkaline earth metal telluride (for example, BeTe, MgTe, CaTe, SrTe, BaTe, etc.), a transition metal telluride (for example, TiTe$_2$, ZrTe$_2$, HfTe$_2$, V$_2$Te$_3$, Nb$_2$Te$_3$, Ta$_2$Te$_3$, Cr$_2$Te$_3$, Mo$_2$Te$_3$, W$_2$Te$_3$, MnTe, TcTe, ReTe, FeTe, RuTe, OsTe, CoTe, RhTe, IrTe, NiTe, PdTe, PtTe, Cu$_2$Te, CuTe, Ag$_2$Te, AgTe, Au$_2$Te, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light. For example, the emission layer may emit blue light.

In an embodiment, the emission layer may include a heterocyclic compound represented by Formula 1 and a phosphorescent compound as described herein.

The emission layer may include a host and a dopant.

In an embodiment, the dopant may include the heterocyclic compound represented by Formula 1 as described herein. In this regard, the dopant may include, in addition to the heterocyclic compound represented by Formula 1, a phosphorescent dopant, a fluorescent dopant, or any combination thereof. In addition to the heterocyclic compound represented by Formula 1, a phosphorescent dopant, a fluorescent dopant, etc. may be further included in the emission layer, and the phosphorescent dopant and the fluorescent dopant will be described in more detail herein below.

For example, the phosphorescent dopant may include a phosphorescent compound. For example, the phosphorescent compound may be a phosphorescent dopant.

The amount of the dopant in the emission layer may be from about 0.01 to about 15 parts by weight based on 100 parts by weight of the host.

In one or more embodiments, the emission layer may include a quantum dot.

In an embodiment, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, suitable (or excellent) light-emission characteristics may be obtained without a substantial increase in driving voltage.

Host

The host may include, for example, a carbazole-containing compound, an anthracene-containing compound, a triazine-containing compound, or any combination thereof. The host may include, for example, a carbazole-containing compound and/or a triazine-containing compound.

In an embodiment, the host may include a compound represented by Formula 301 below:

$$[Ar_{301}]_{xb11}-[(L_{301})_{xb1}-R_{301}]_{xb21} \quad \text{Formula 301}$$

wherein, in Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ are each independently the same as described in connection with Q$_1$.

In an embodiment, when xb11 in Formula 301 is 2 or more, two or more of Ar$_{301}$(s) may be linked to each other via a single bond.

In one or more embodiments, the host may include a compound represented by Formula 301-1, a compound represented by Formula 301-2, or any combination thereof:

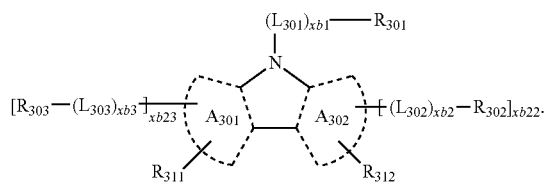

Formula 301-1

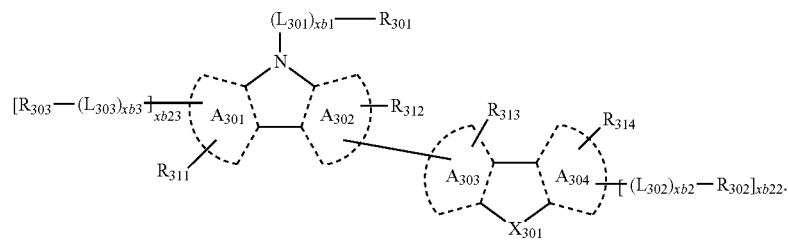

Formula 301-2

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are the same as respectively described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are each independently the same as described in connection with $R_{301}$.

In one or more embodiments, the host may include an alkaline earth metal complex, a post-transition metal complex, or any combination thereof. In one or more embodiments, the host may include a Be complex (for example, Compound H55), an Mg complex, a Zn complex, or any combination thereof.

In an embodiment, the host may include one of Compounds H1 to H139, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1
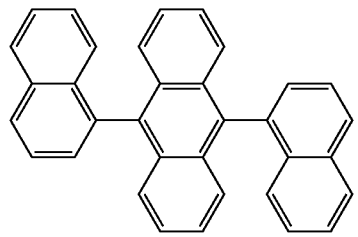

H2
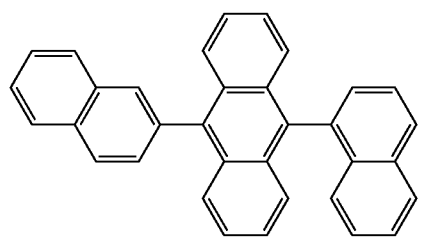

H3
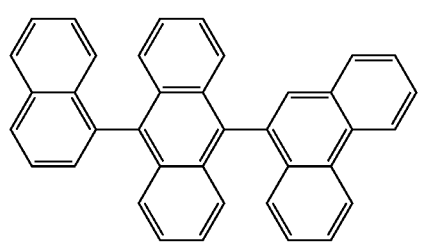

H4
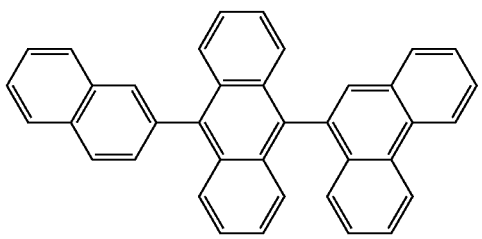

H5
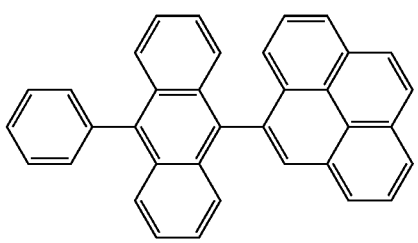

H6
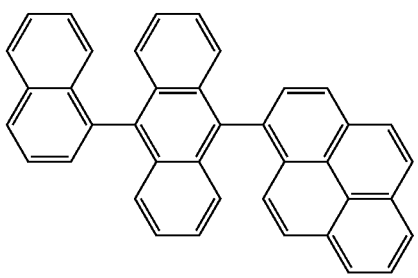

H7
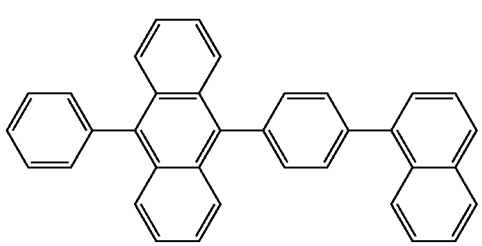

H8
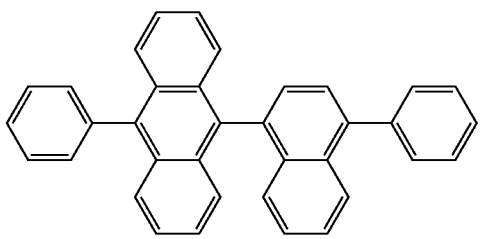

H9
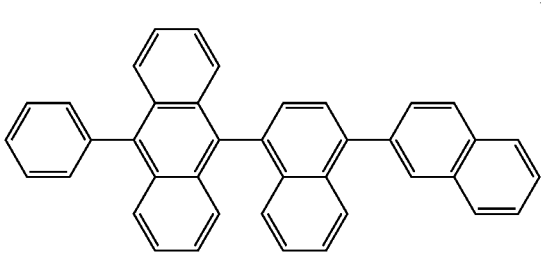

H10
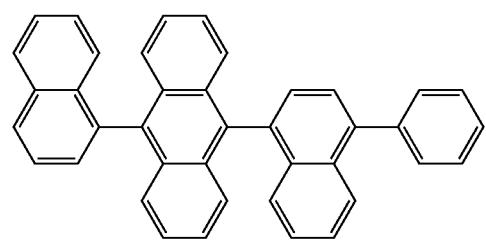
H11
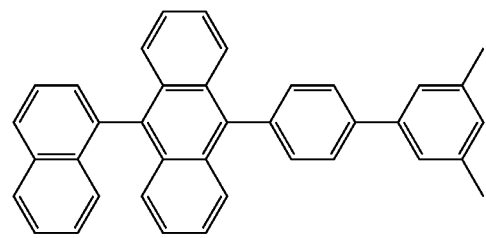
H12
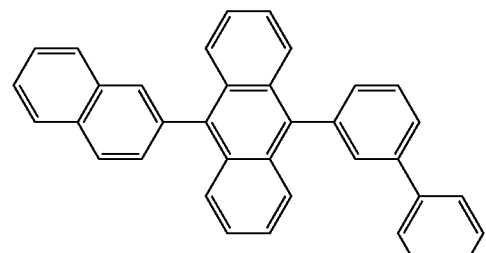
H13
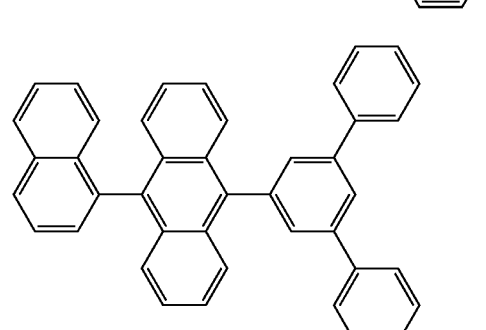
H14
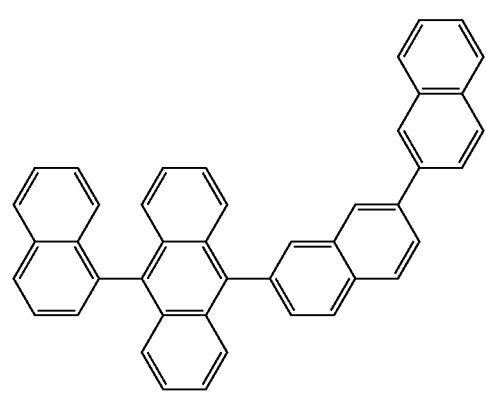
H15
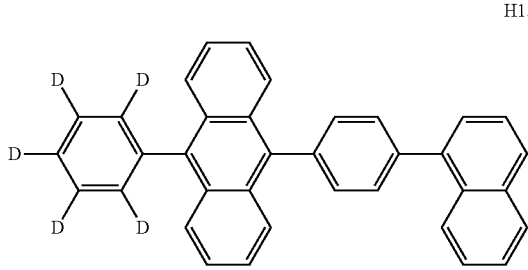
H16
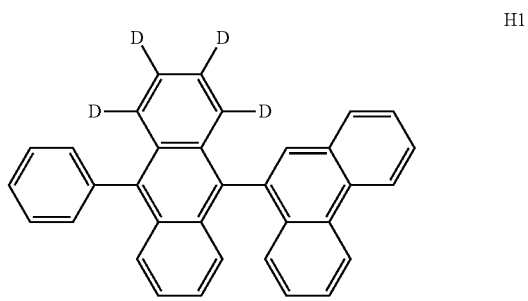
H17
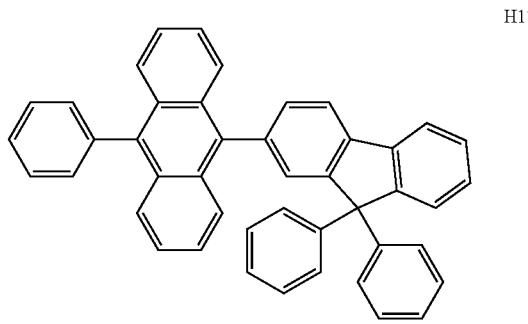
H18
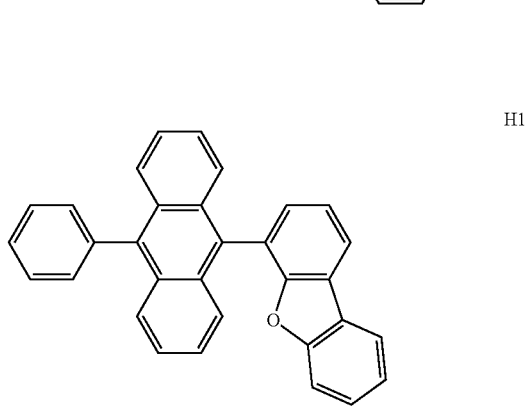
H19
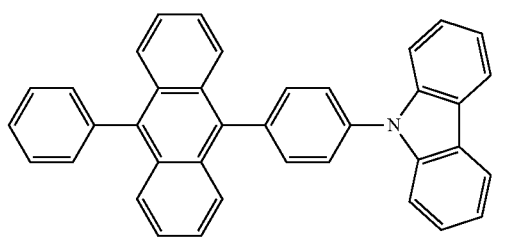

H20
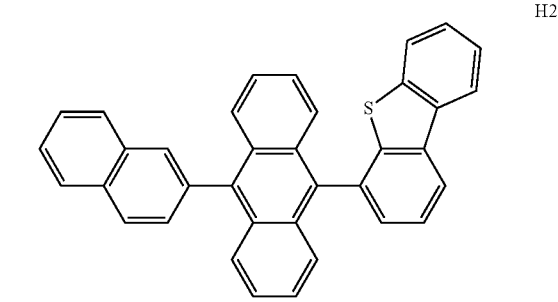
H21
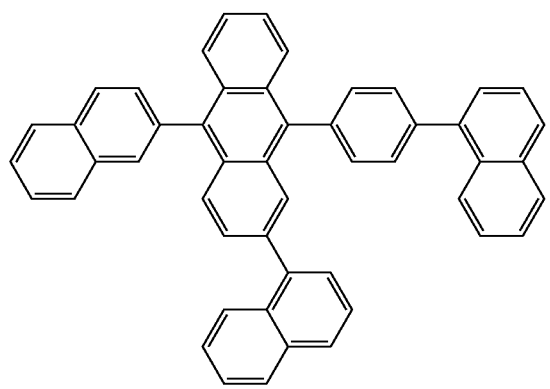
H22
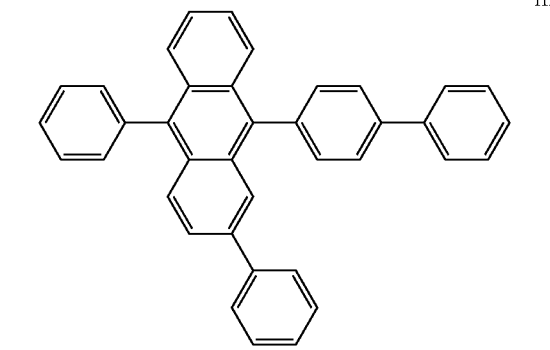
H23
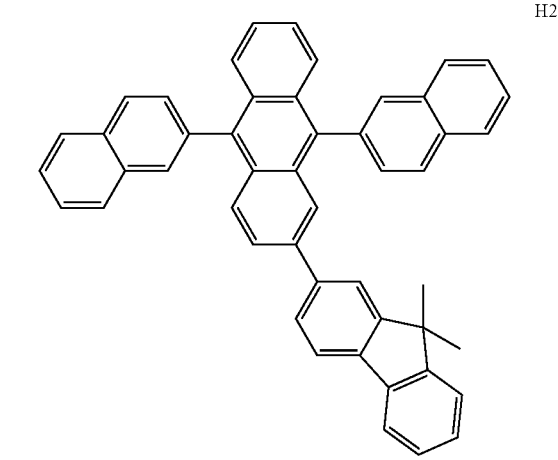
H24
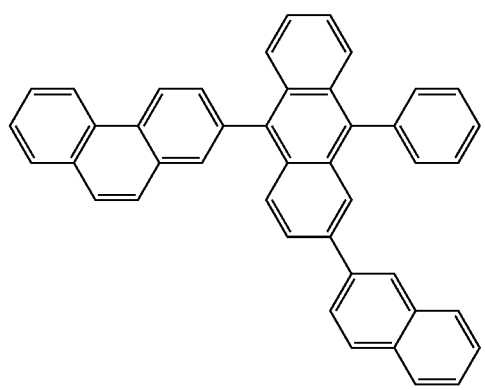
H25
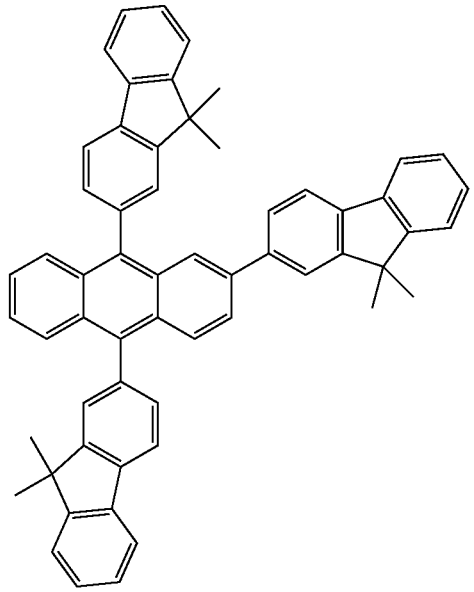
H26
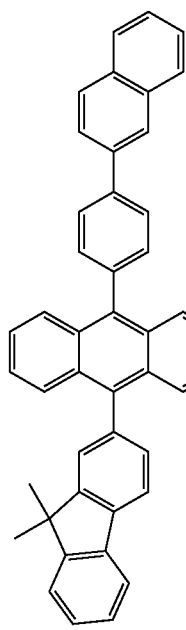

-continued
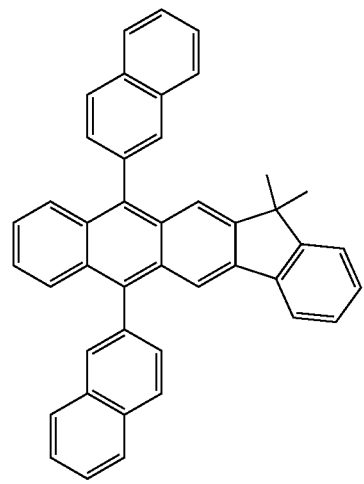
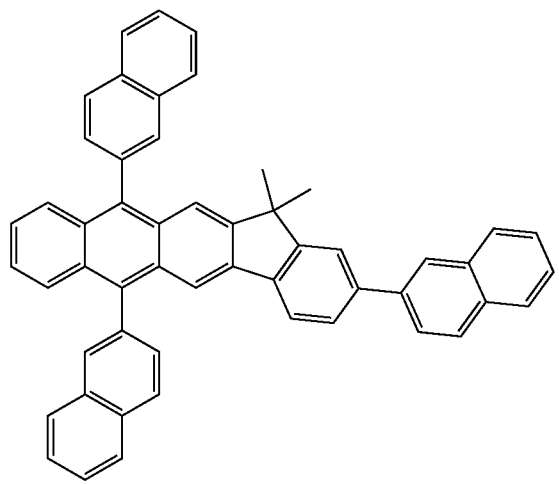
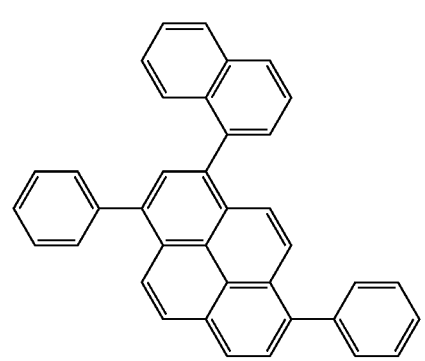
H27
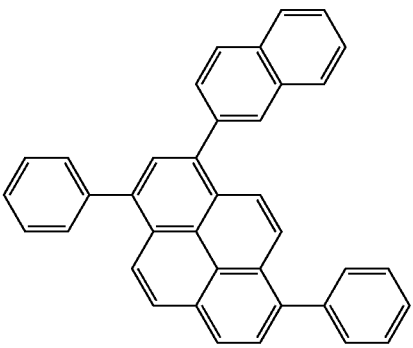
H28
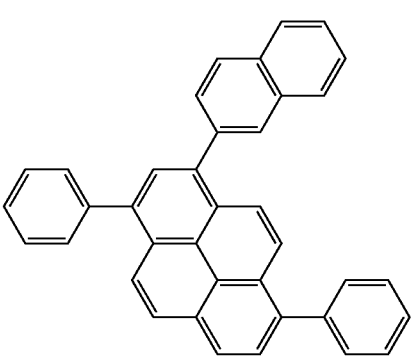
H29
-continued
H30
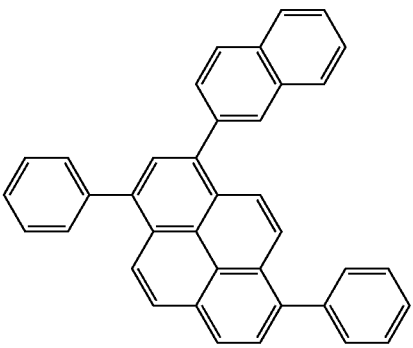
H30
H31
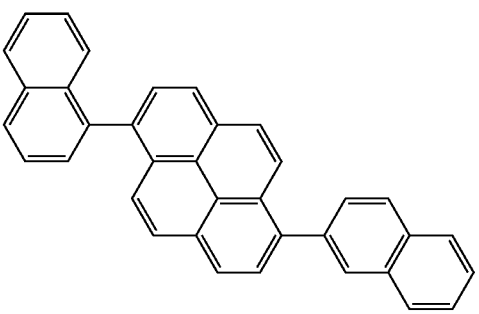
H32
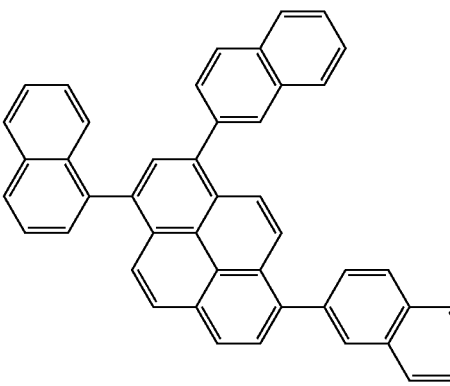
H33
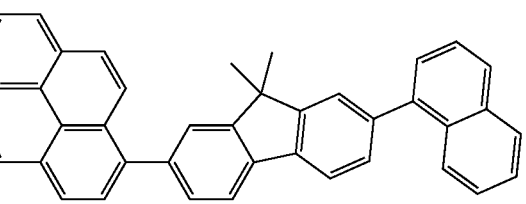

-continued
H34
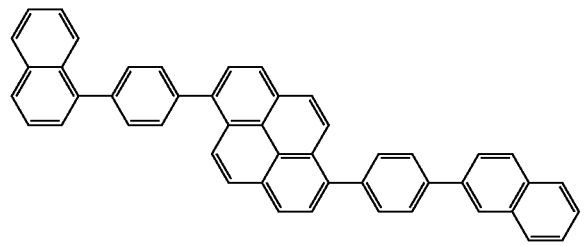
H35
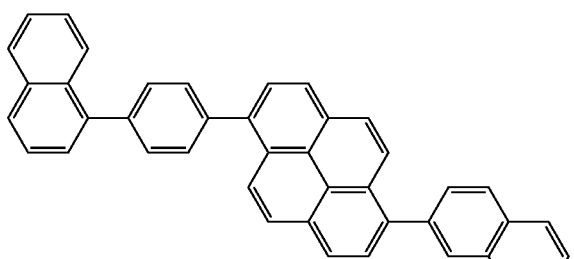
H36
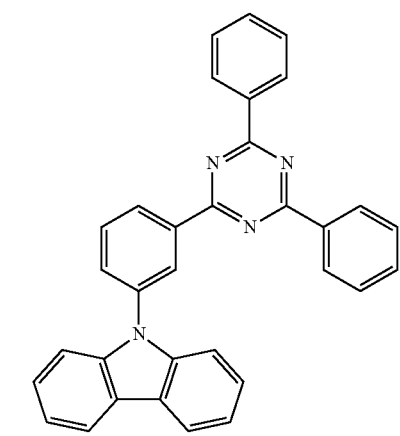
H37
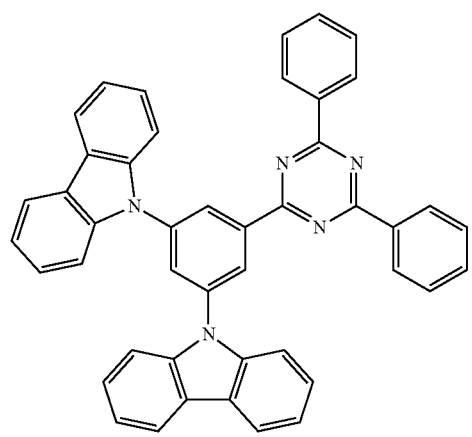
-continued
H38
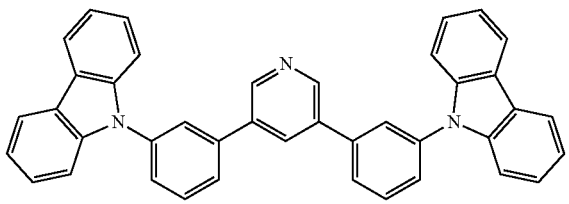
H39
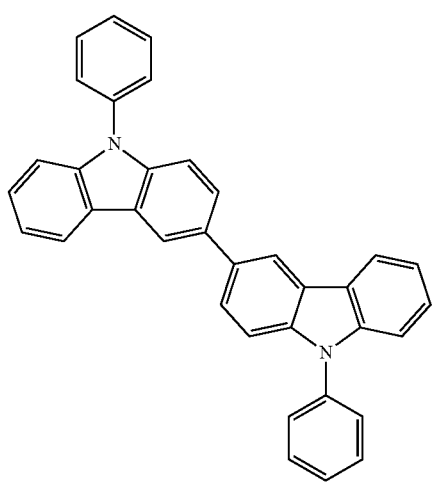
H40
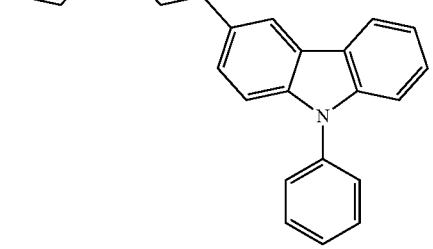

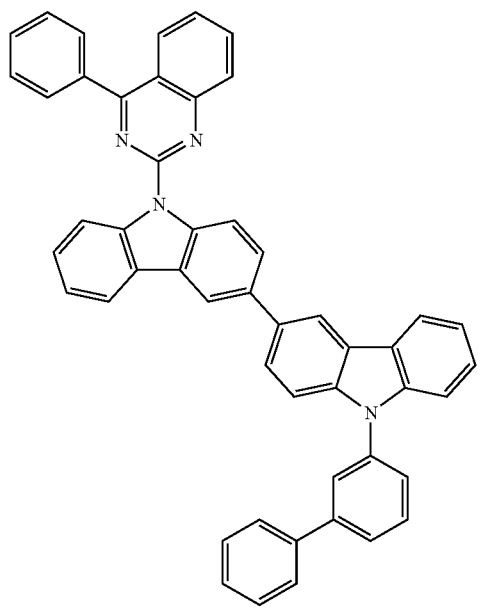
H41
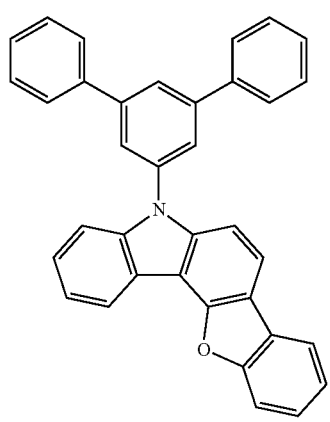
H42
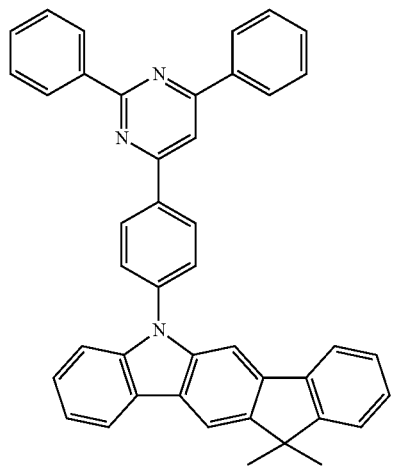
H43
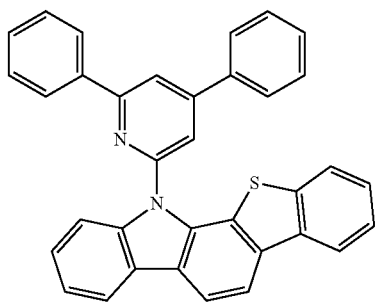
H44
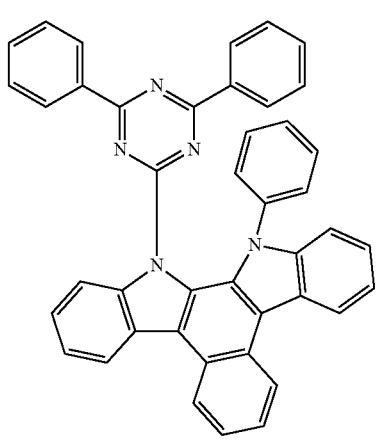
H45
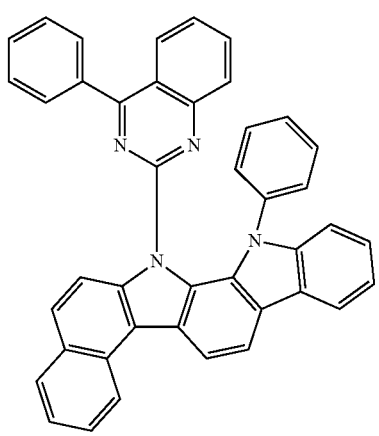
H46
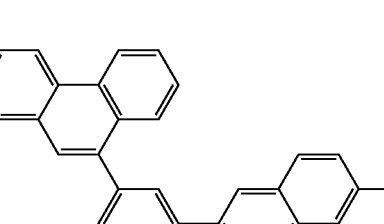
H47
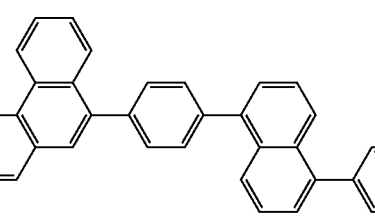
H48

H49
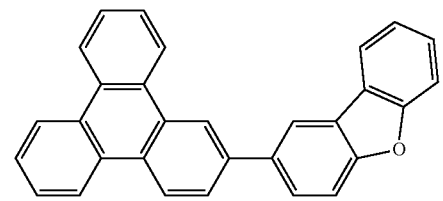
H50
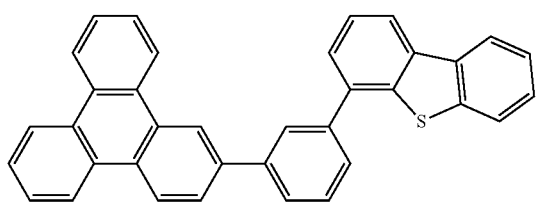
H51
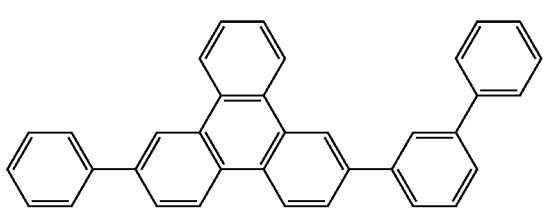
H52
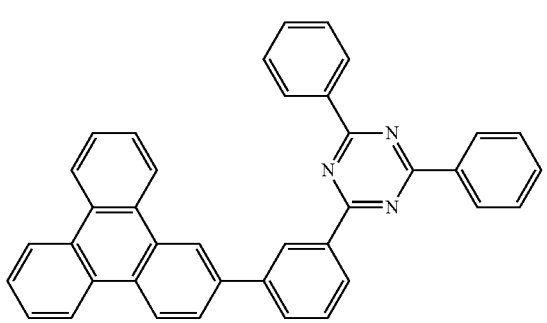
H53
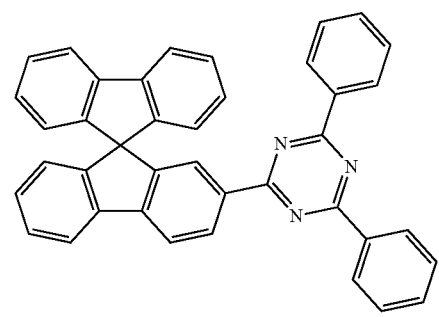
H54
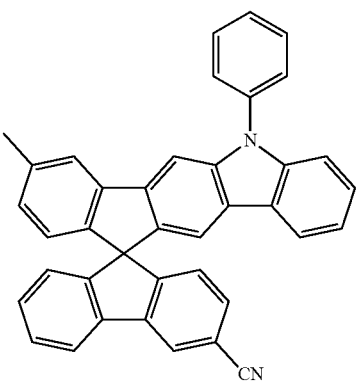
H55
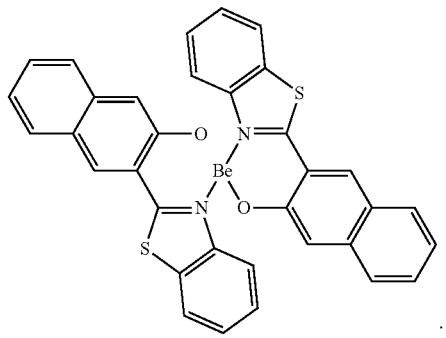
H56
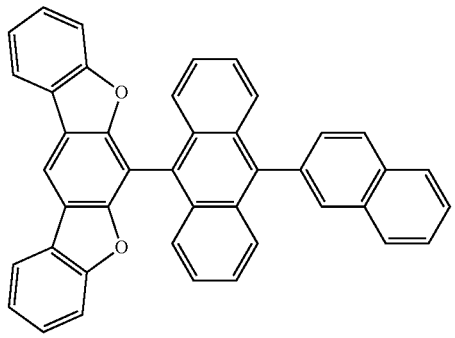
H57
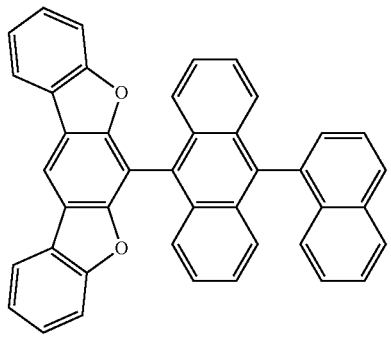

H58
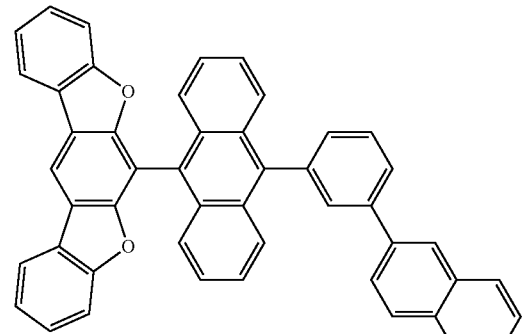
H59
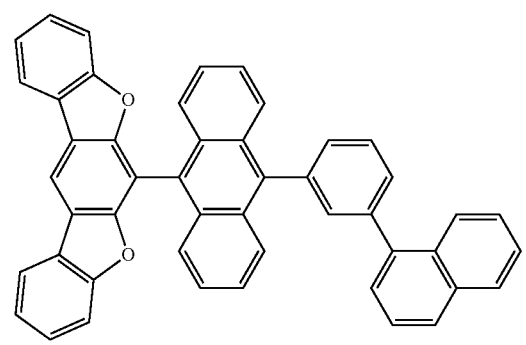
H60
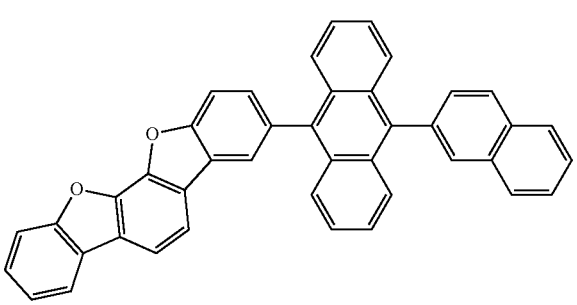
H61
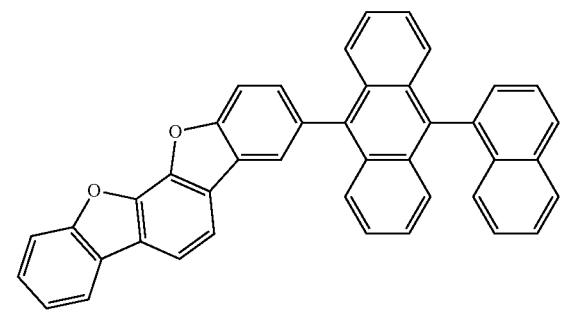
H62
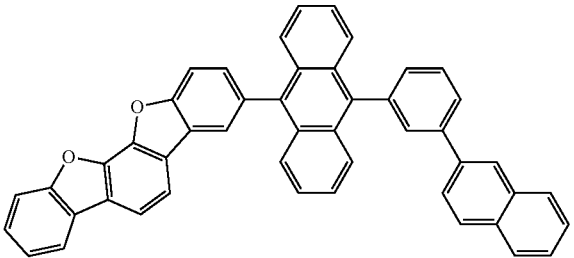
H63
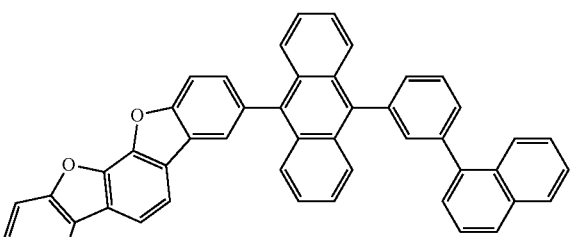
H64
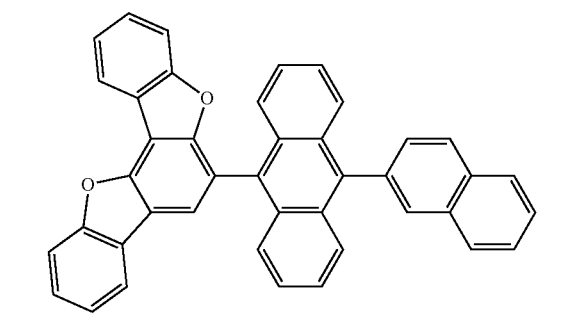
H65
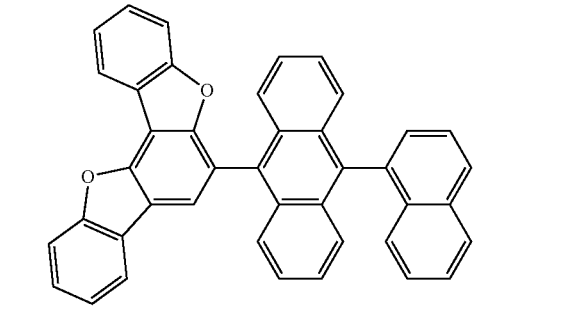
H66
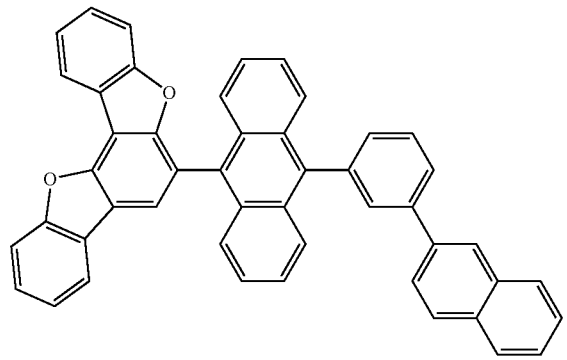

H67
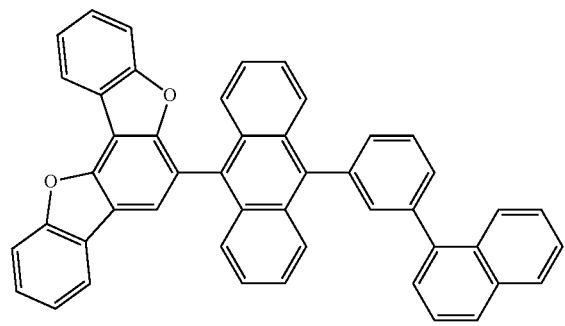
H68
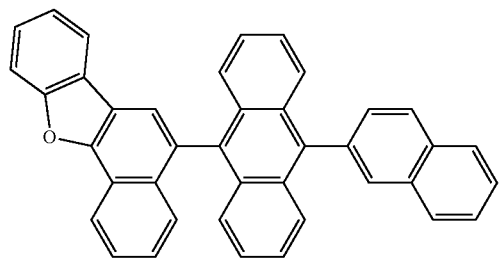
H69
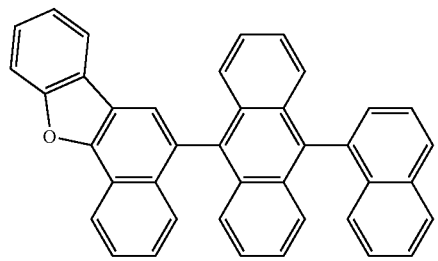
H70
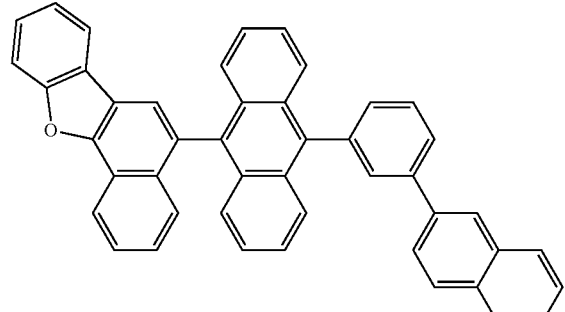
H71
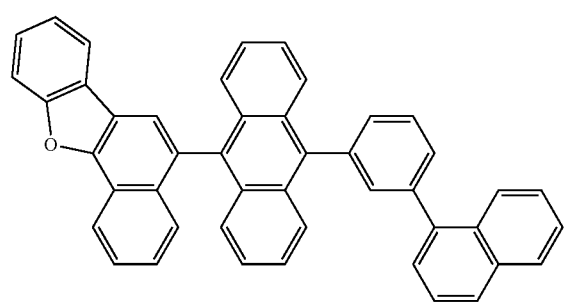
H72
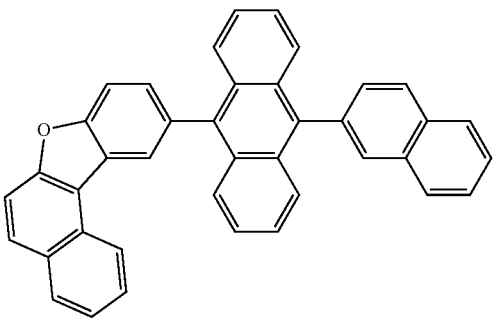
H73
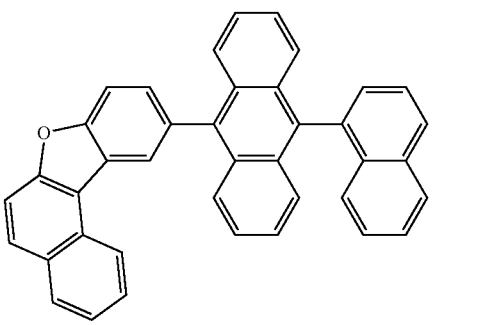
H74
H75
H76
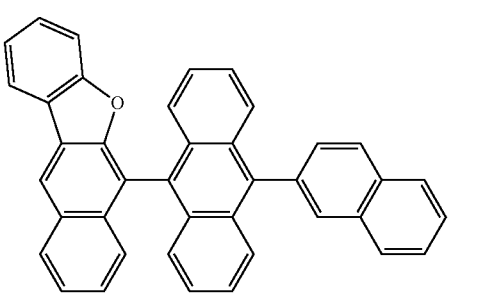

H77
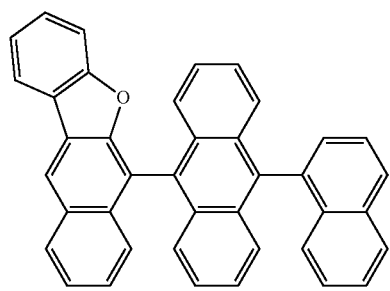
H78
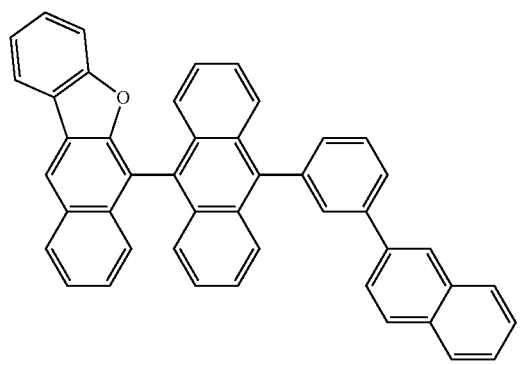
H79
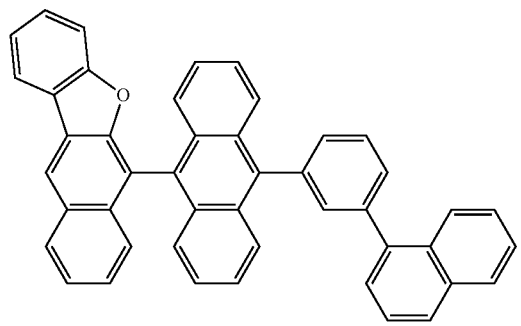
H80
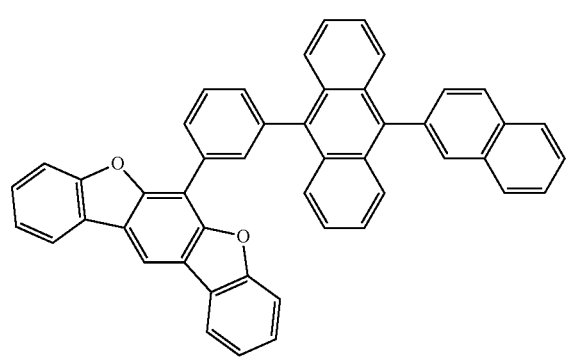
H81
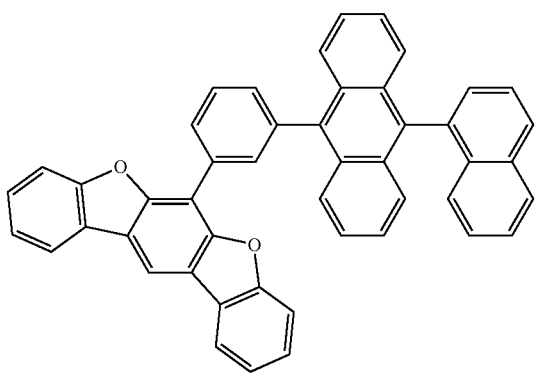
H82
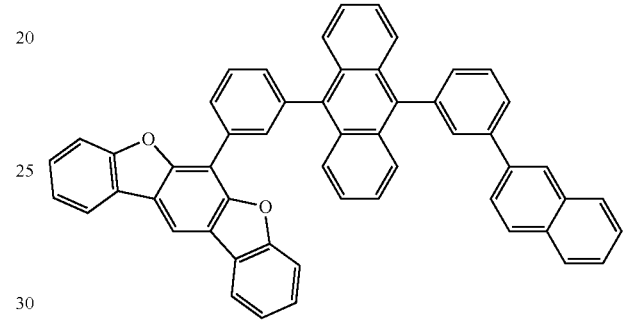
H83
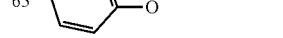

H85
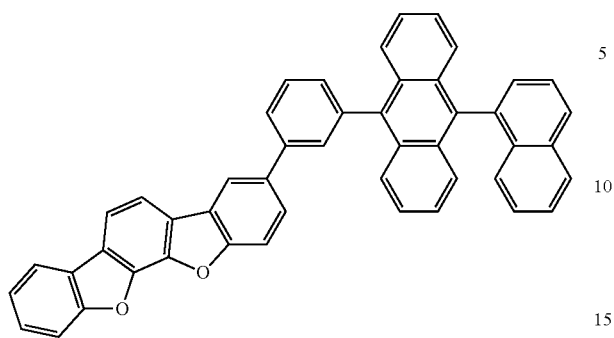
H86
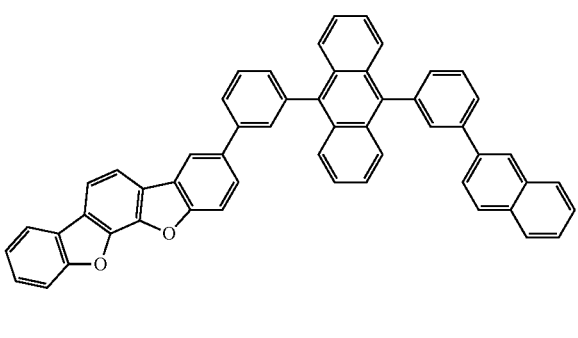
H87
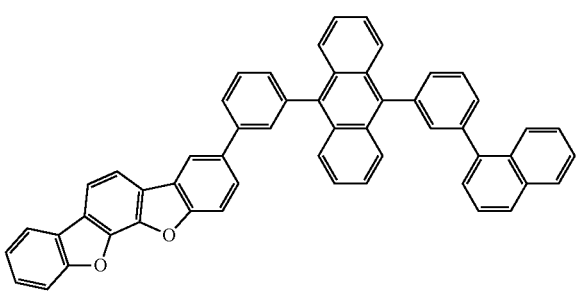
H88
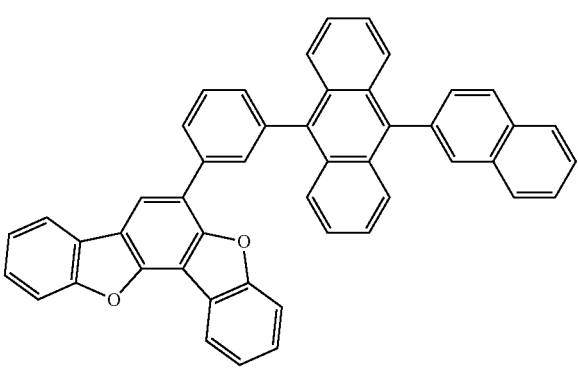
H89
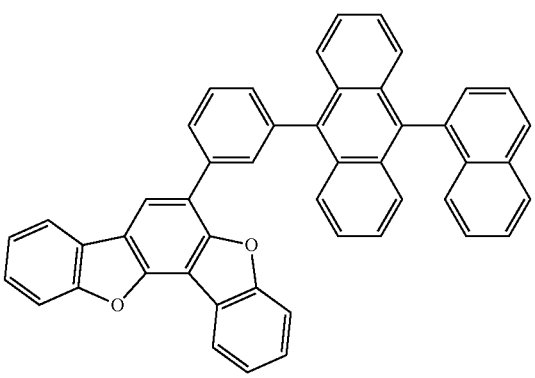
H90
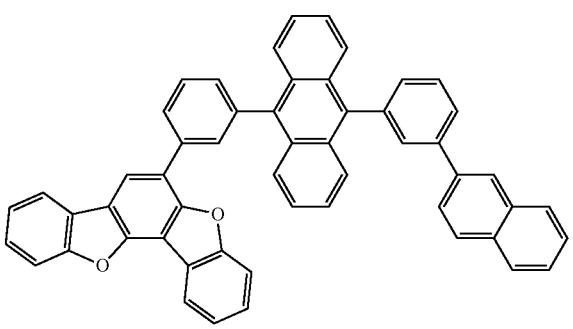
H91
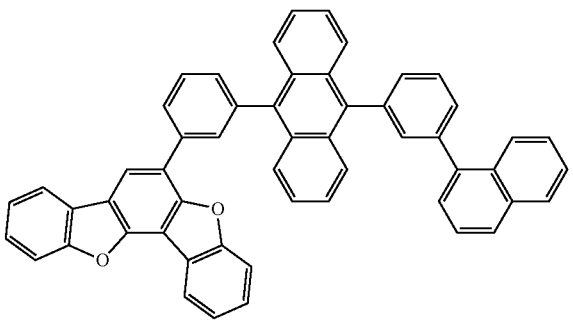
H92
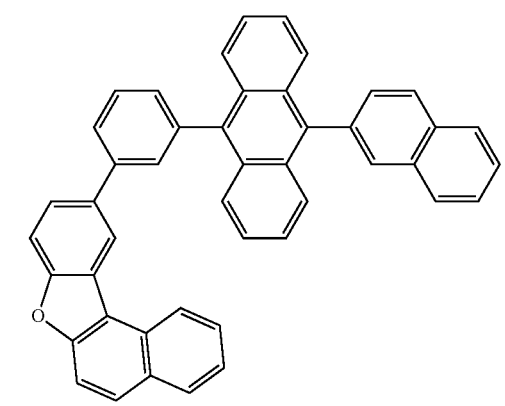

H93
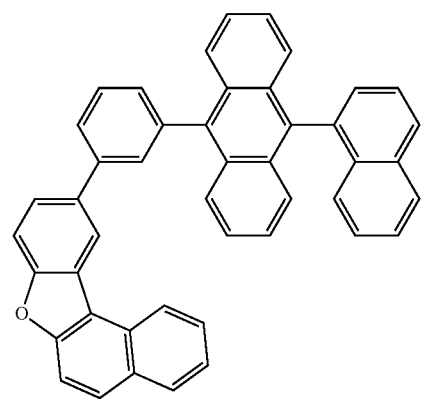
H94
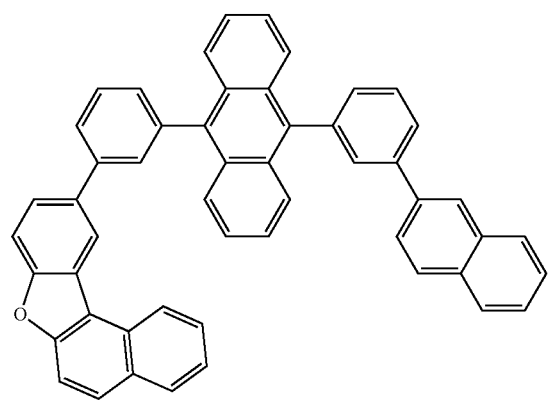
H95
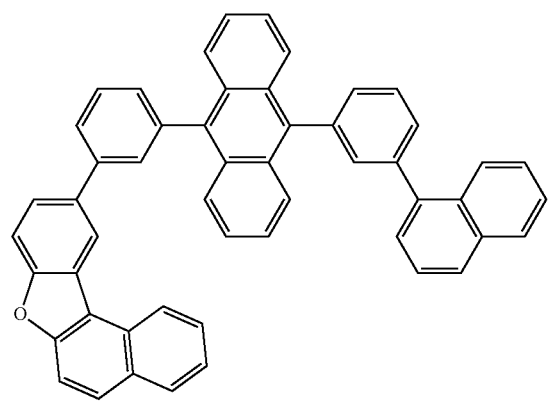
H96
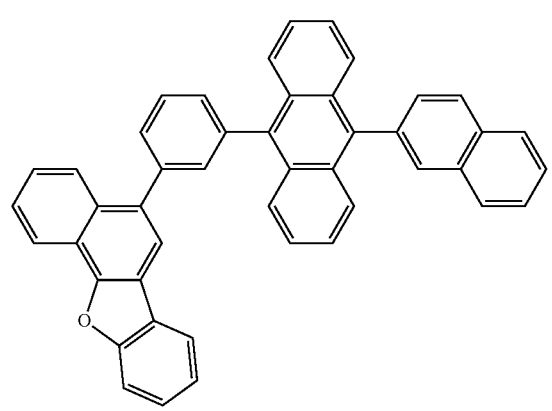
H97
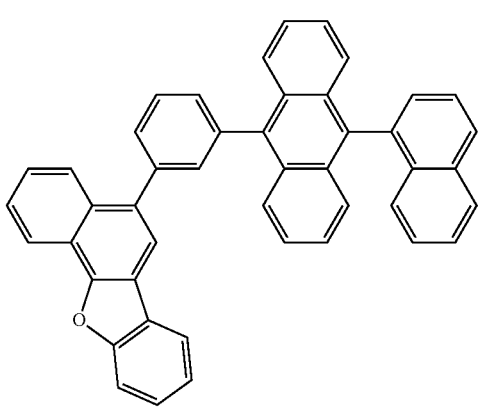
H98
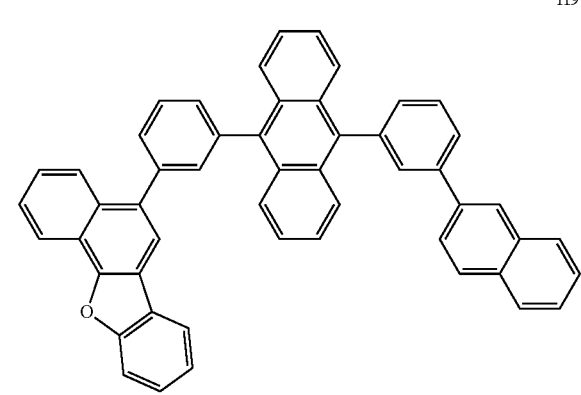
H99
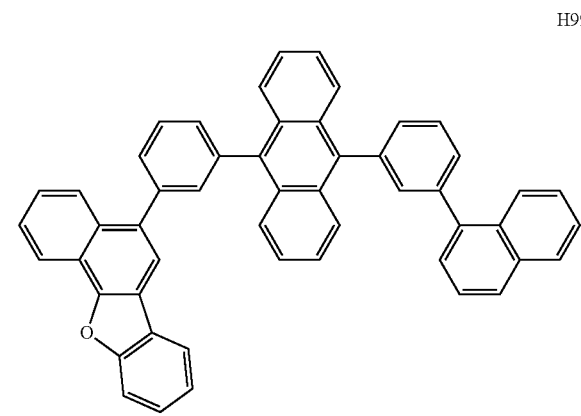
H100
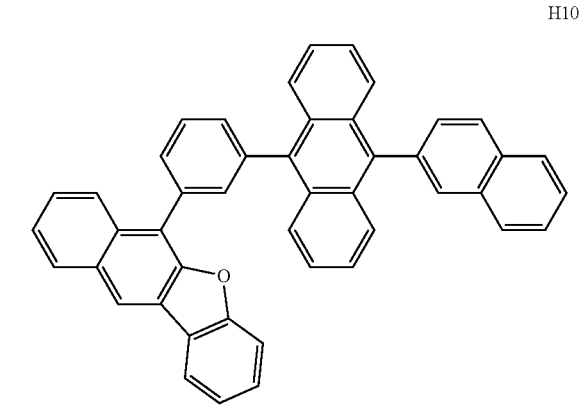

H101
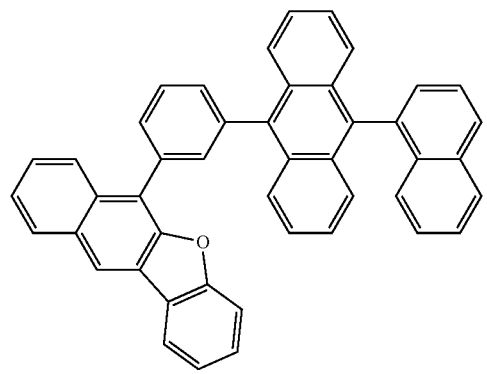
H102
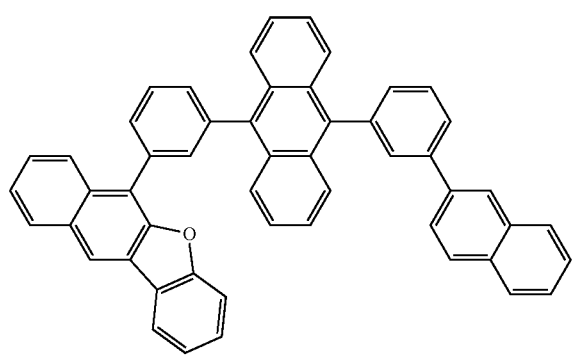
H103
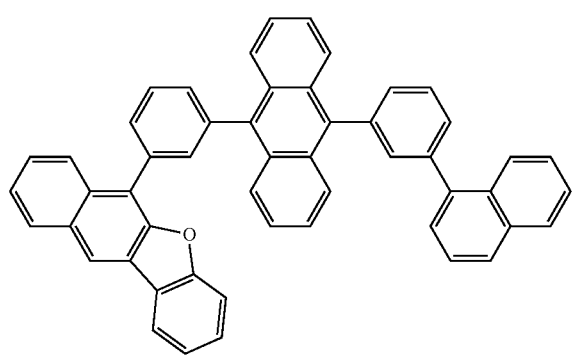
H104
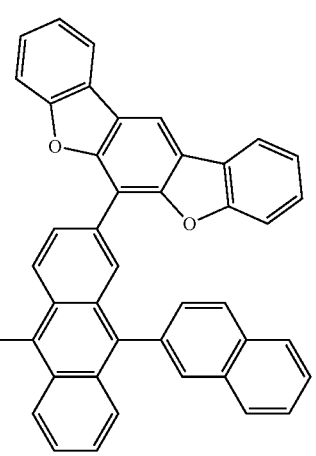
H105
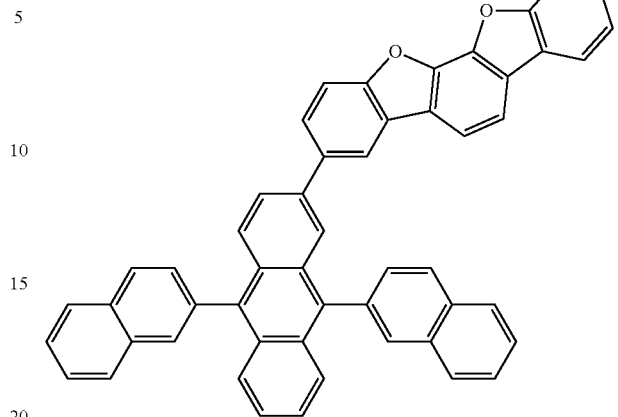
H106
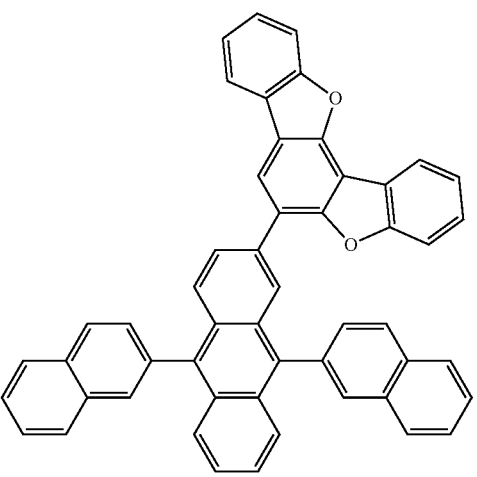
H107
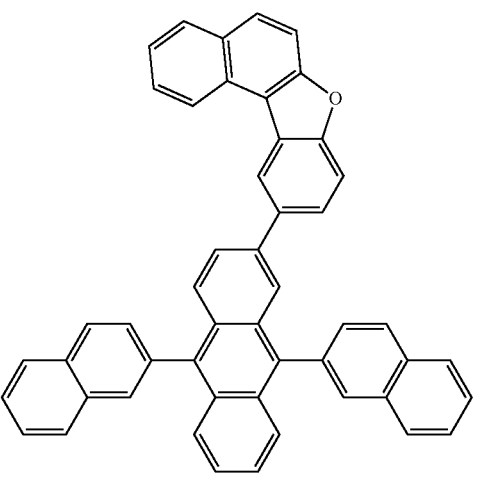

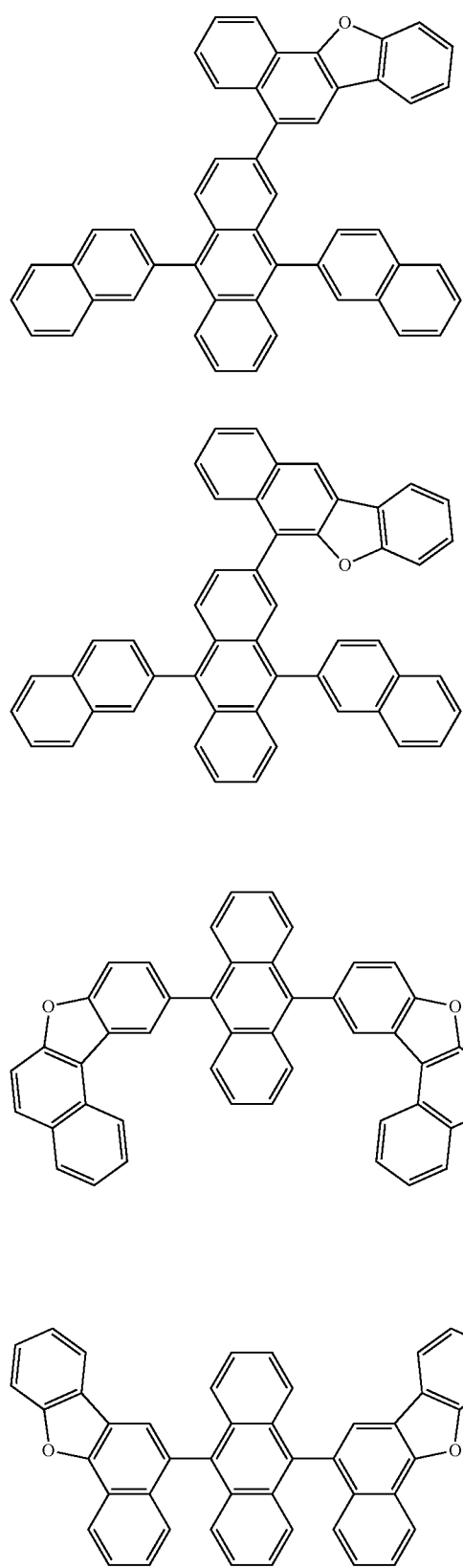
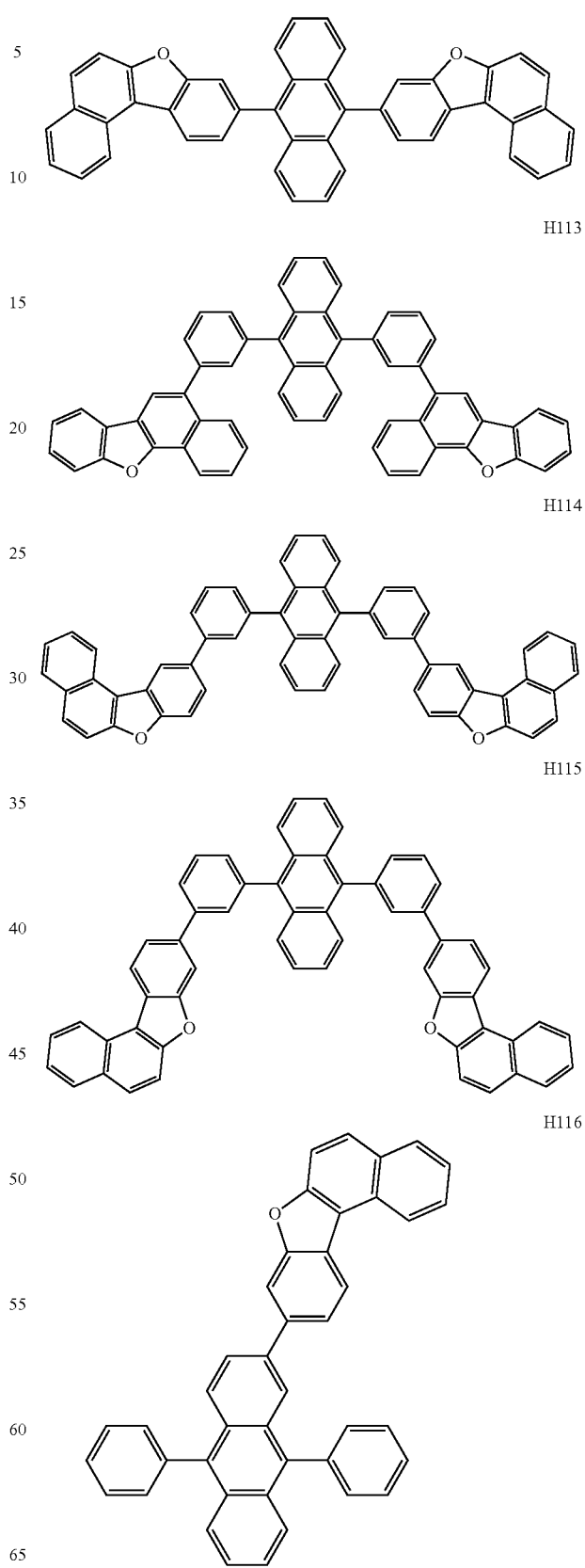

H117
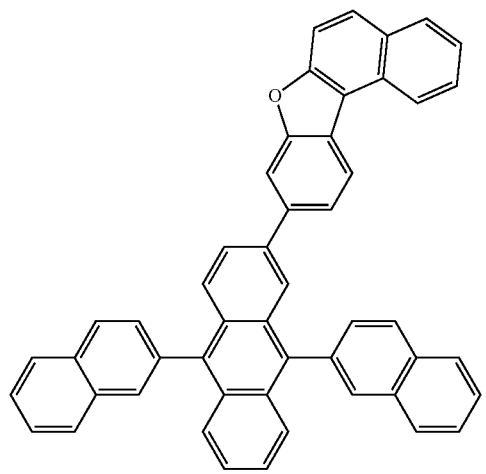
H118
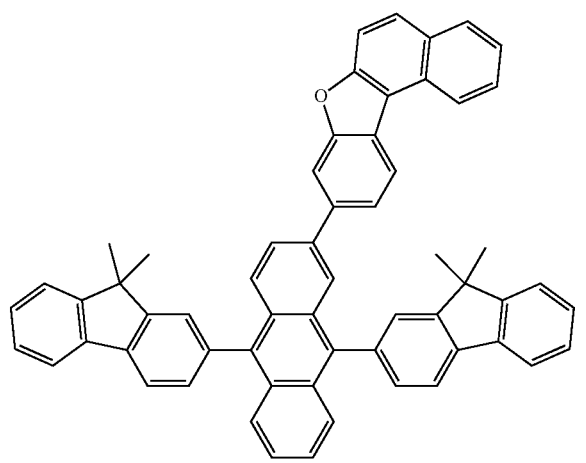
H119
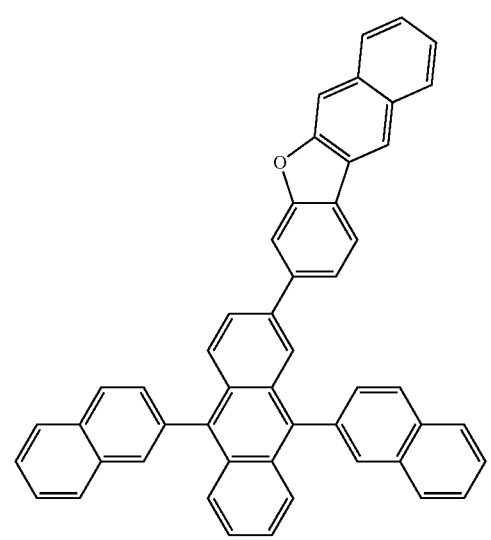
H120
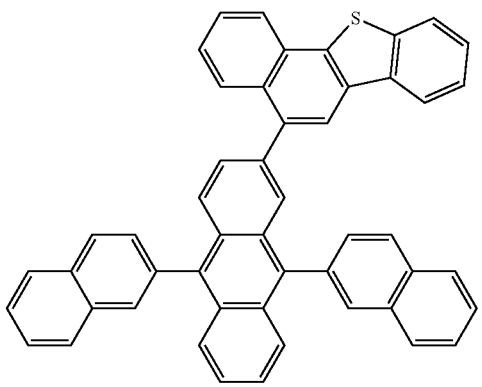
H121
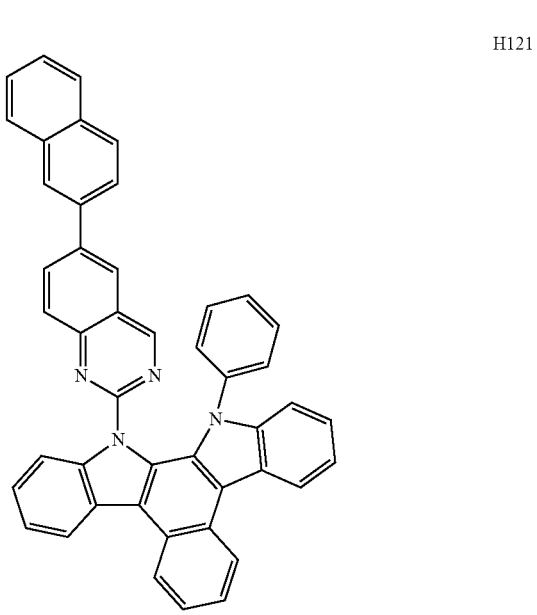
H122
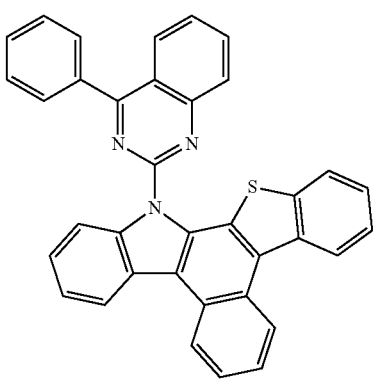

H123
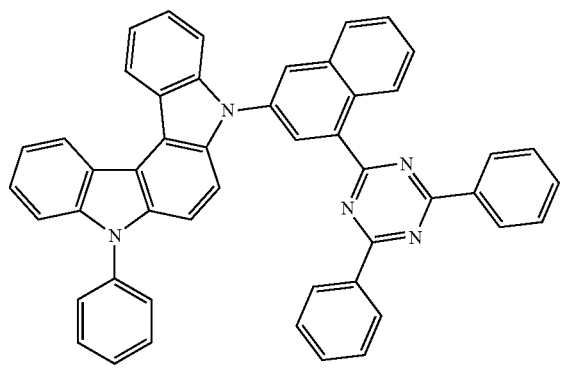
H124
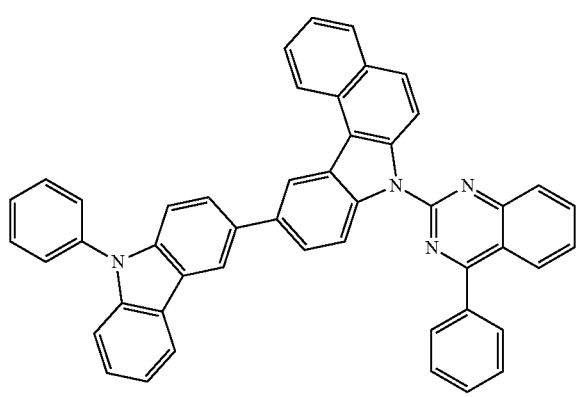
H125
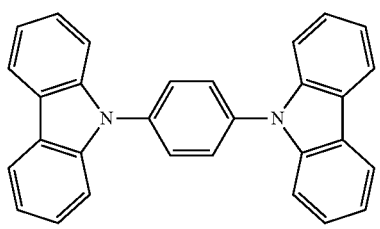
H126
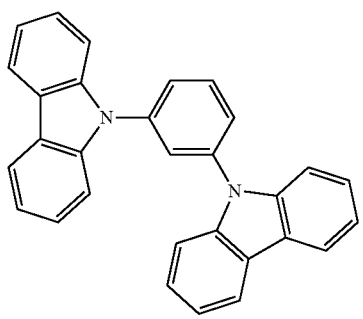
H127
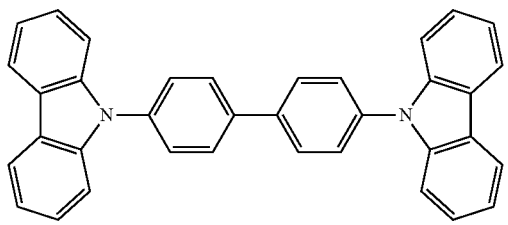
H128
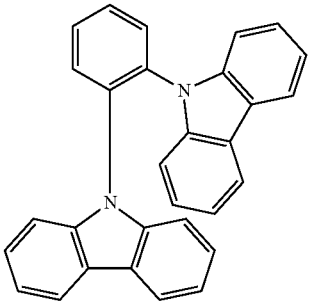
H129
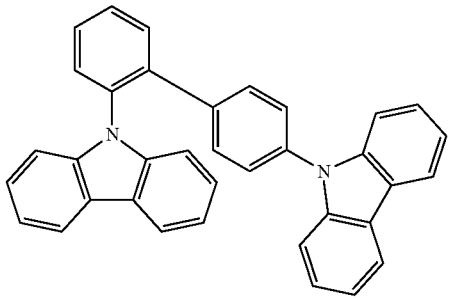
H130
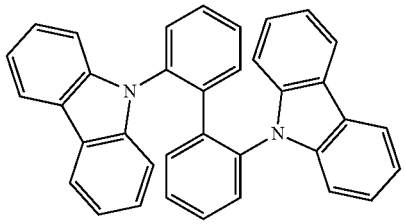
H131
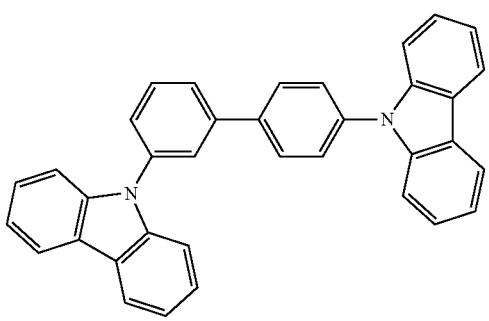
H132
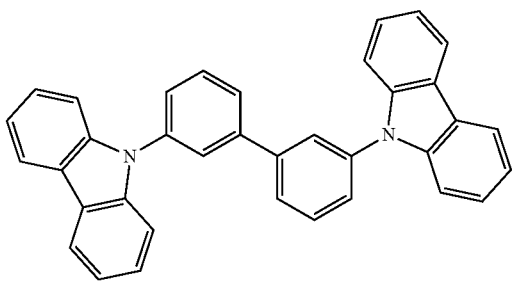

H133

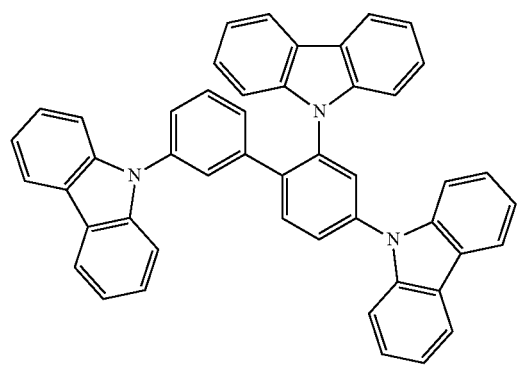

H134

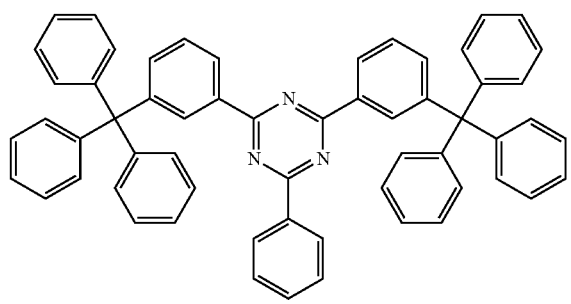

H135

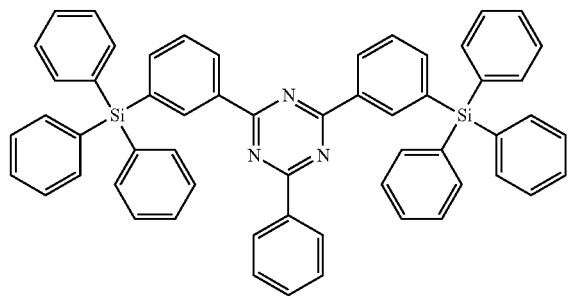

H136

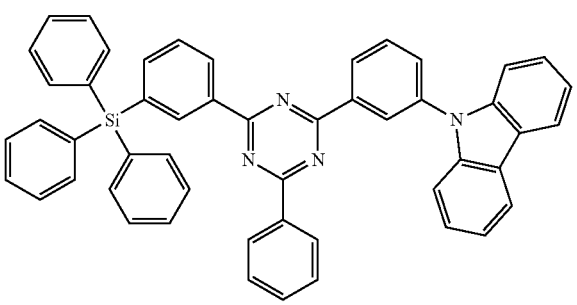

H137

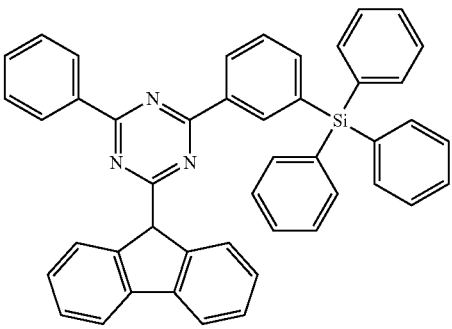

H138

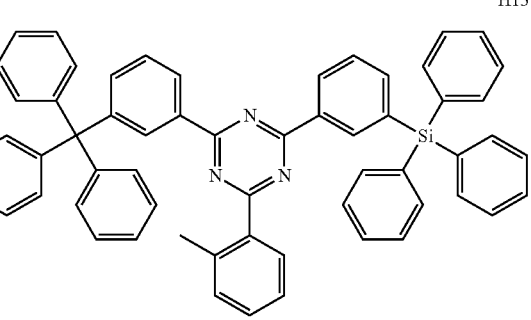

H139

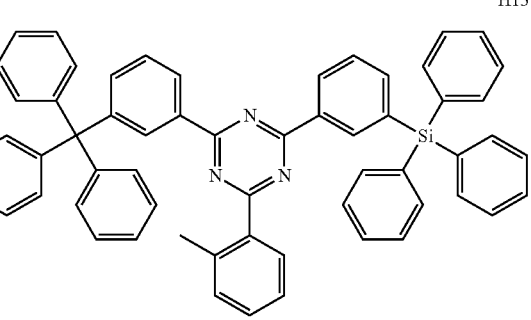

Phosphorescent Dopant

The phosphorescent dopant may include a phosphorescent compound. In one or more embodiments, the phosphorescent dopant may include at least one transition metal as a central metal (e.g., a central metal atom).

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$

Formula 401

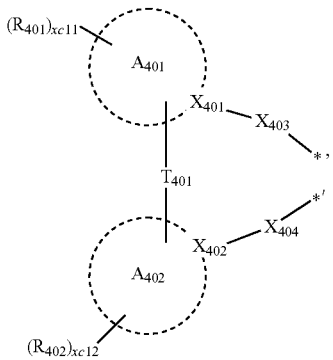

Formula 402 wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are each independently the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{40}$2), $Q_{401}$ to $Q_{403}$ are each independently the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, and/or two ring $A_{402}$(s) may be optionally linked to each other via $T_{403}$, which is a linking group (see Compounds PD1 to PD4 and PD7). $T_{402}$ and $T_{403}$ are each independently the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

The phosphorescent dopant may include, for example, one of compounds PD1 to PD45, or any combination thereof:

PD1

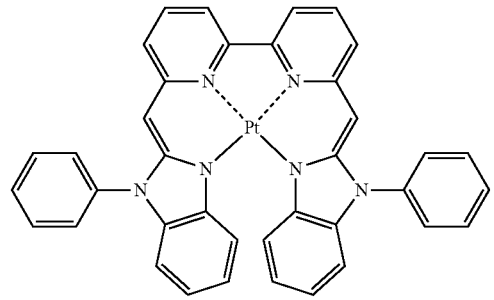

PD2

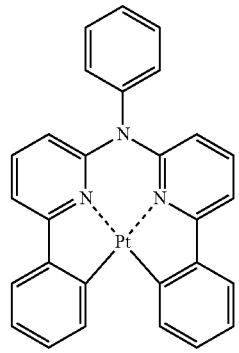

PD3

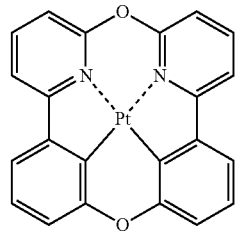

PD4

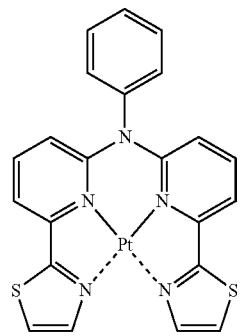

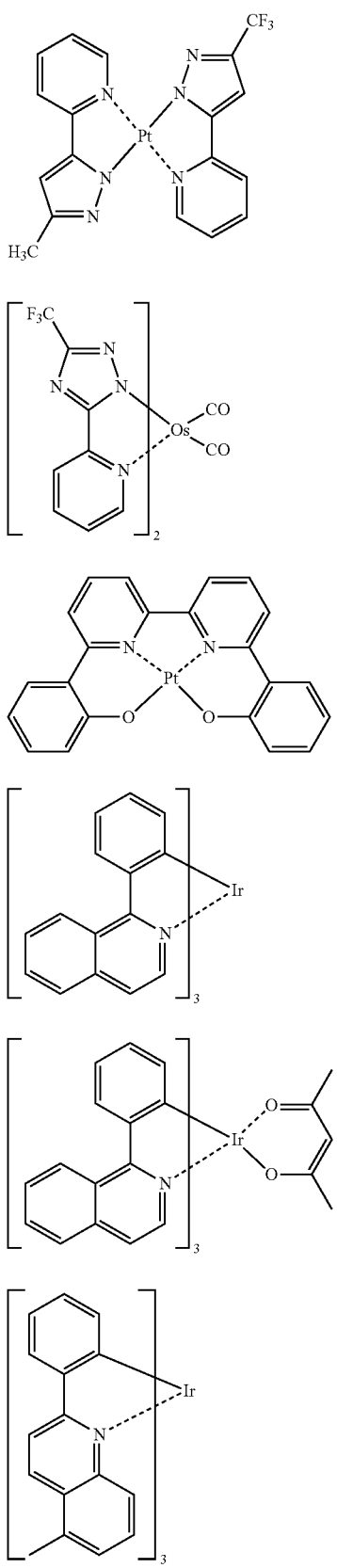
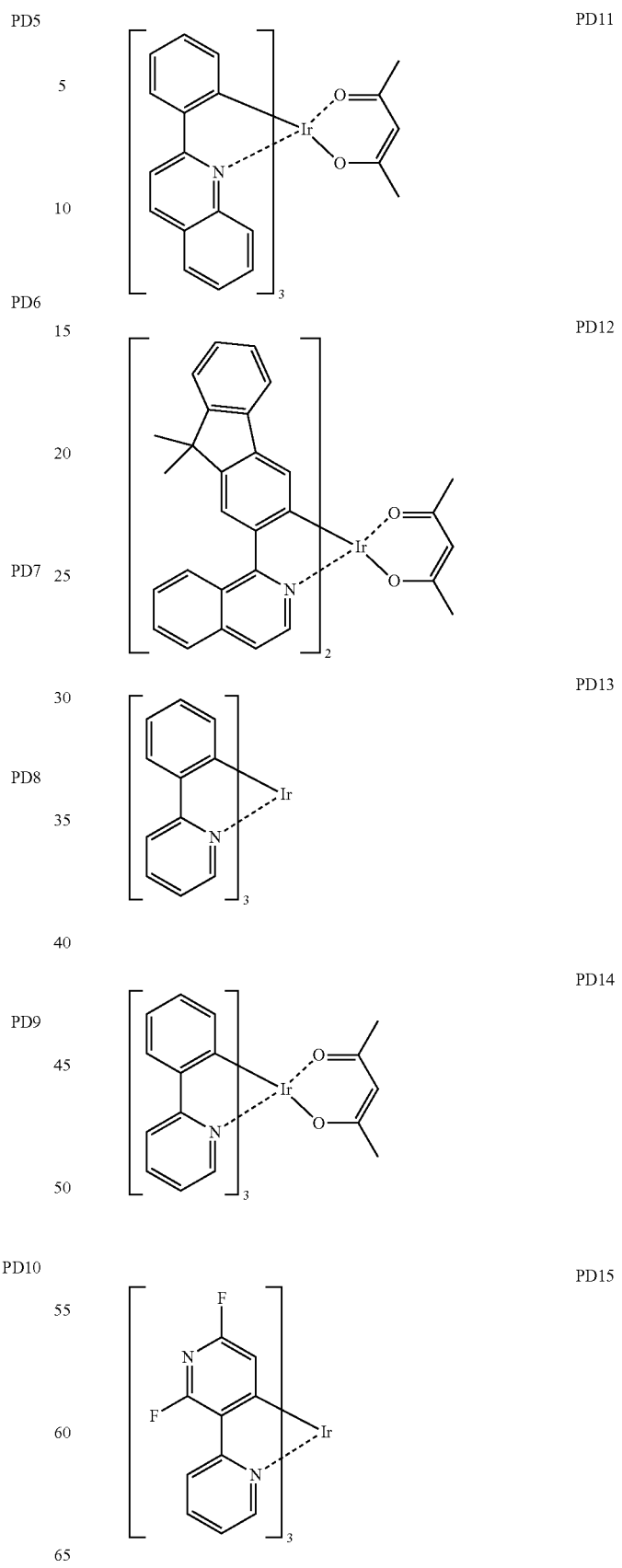

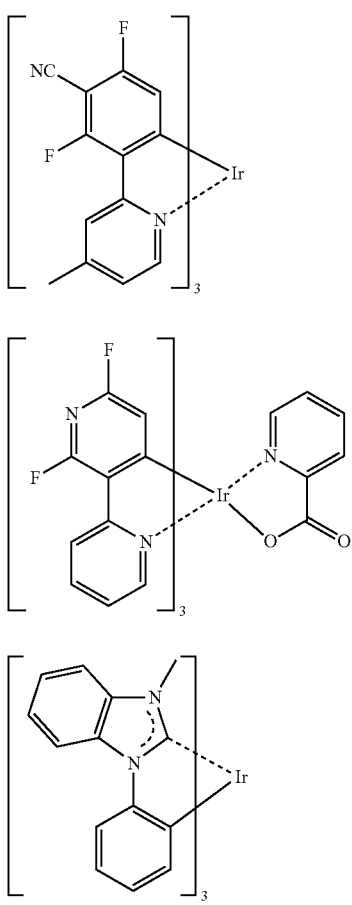
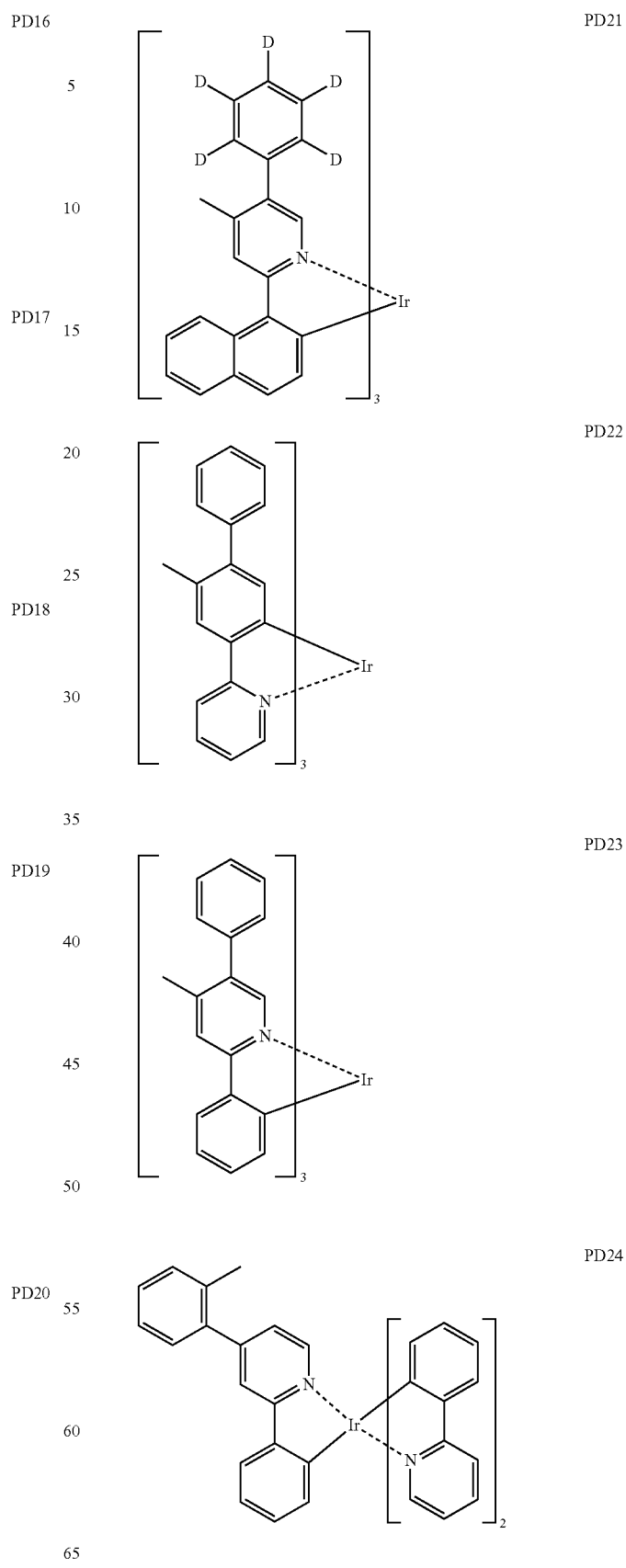

PD25
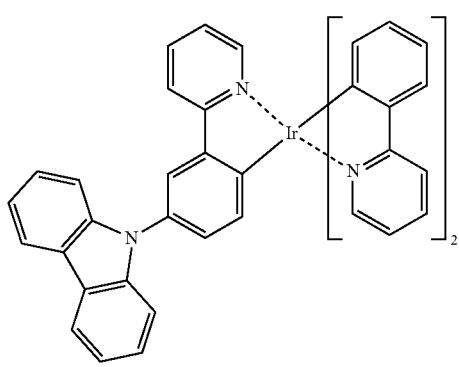
PD26
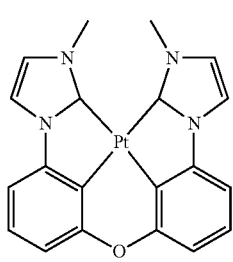
PD27
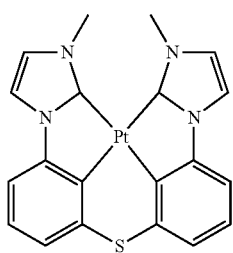
PD28
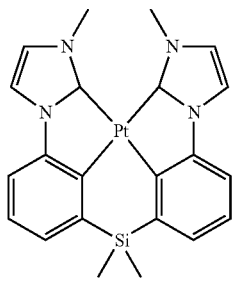
PD29
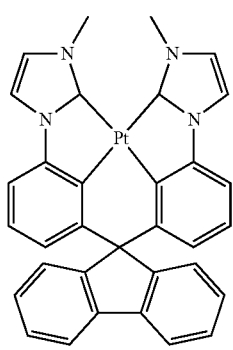
PD30
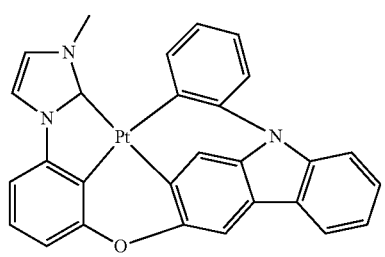
PD31
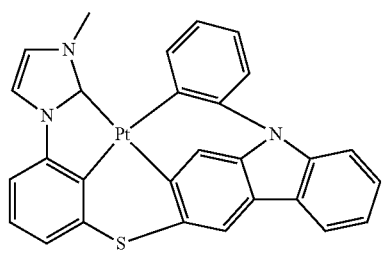
PD32
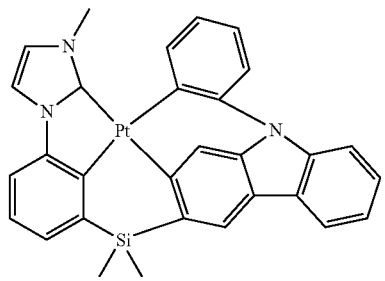
PD33
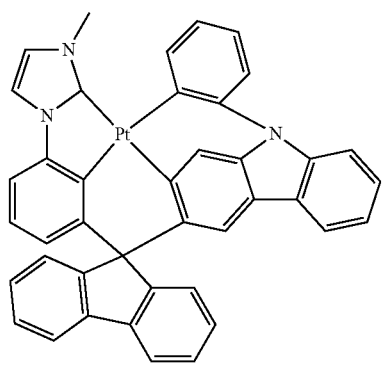
PD34
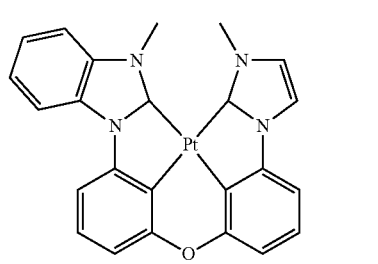

PD35
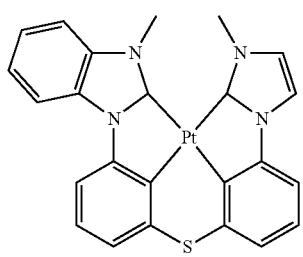
PD36
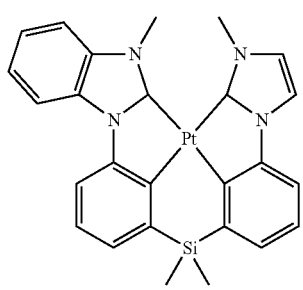
PD37
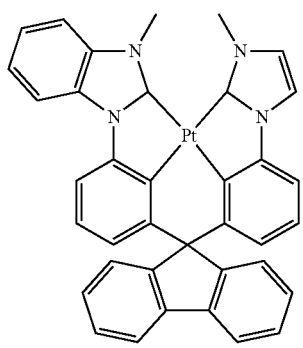
PD38
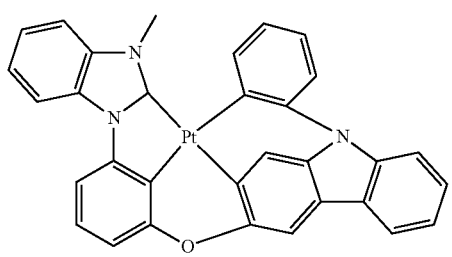
PD39
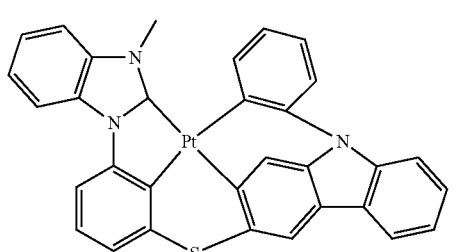
PD40
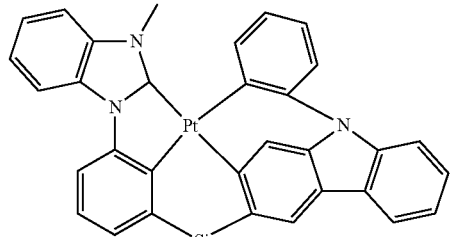
PD41
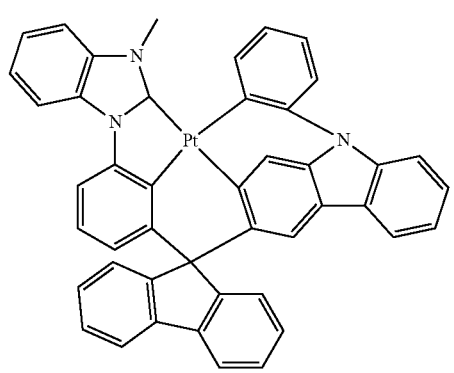
PD42
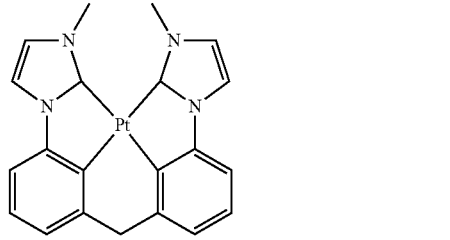
PD43
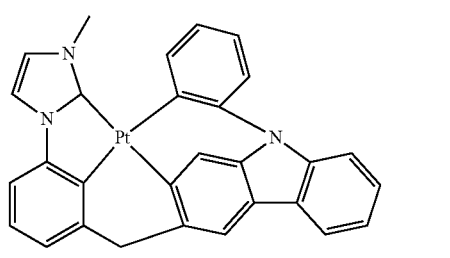
PD44
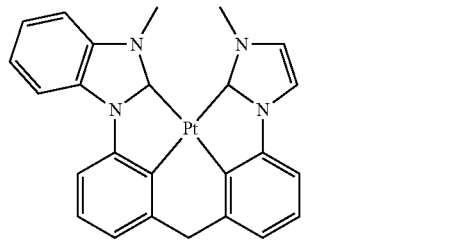

PD45

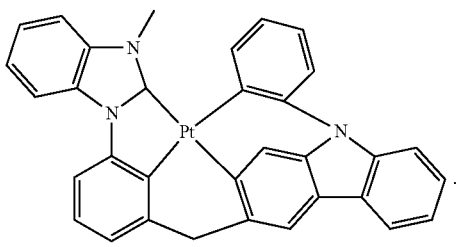

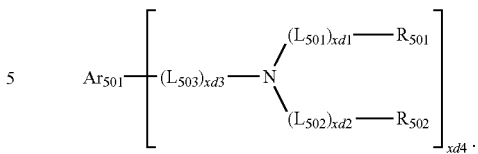

Formula 501 wherein, in Formula 501,
$Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together (e.g., combined together).

In one or more embodiments, xd4 in Formula 501 may be 2.

In one or more embodiments, the fluorescent dopant may include: one of Compounds FD1 to FD36; DPVBi; DPAVBi; or any combination thereof:

Fluorescent Dopant

The fluorescent dopant may include an amine group-containing compound, a styryl group-containing compound, or any combination thereof.

In one or more embodiments, the fluorescent dopant may include a compound represented by Formula 501:

FD1

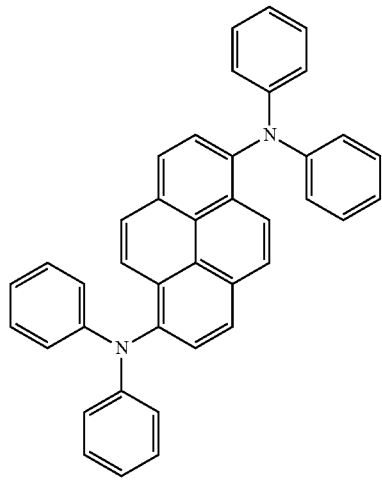

FD2

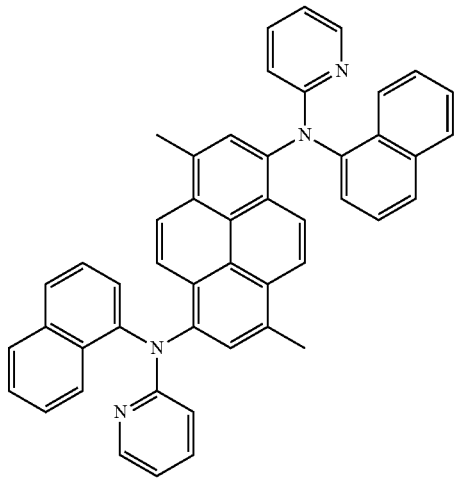

-continued
FD3
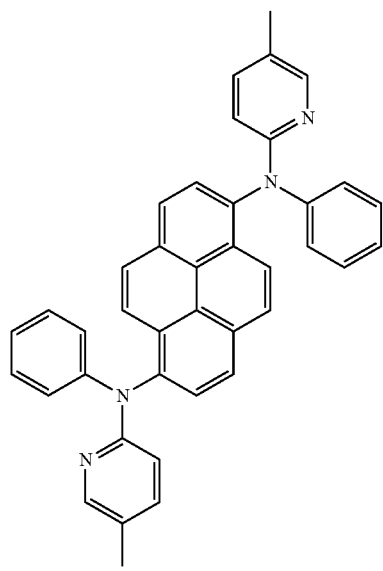
FD4
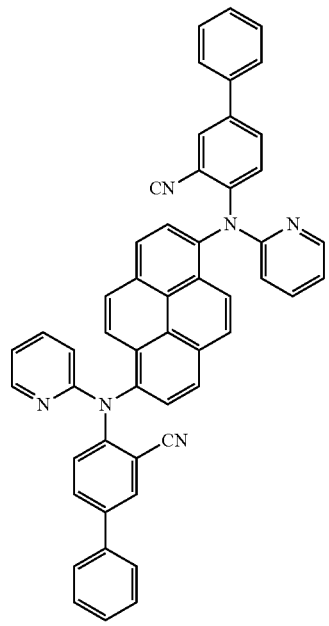
FD5
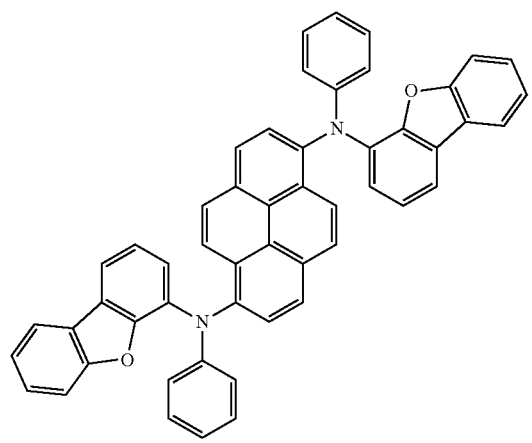
FD6
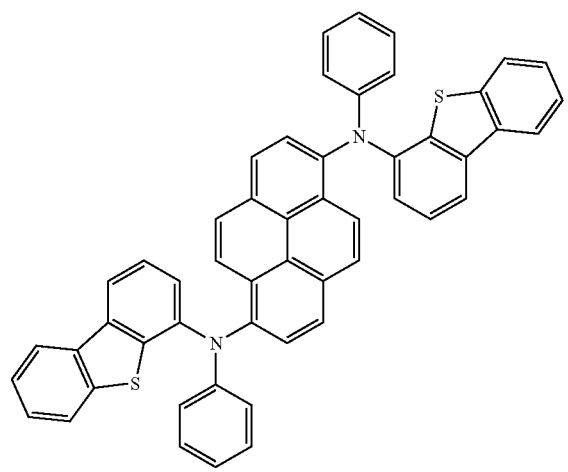

-continued
FD7
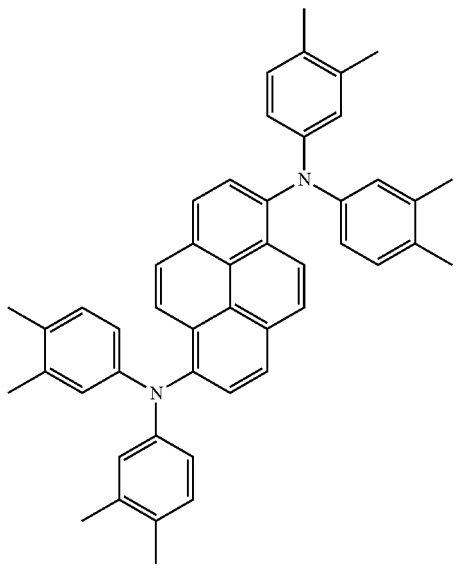
FD8
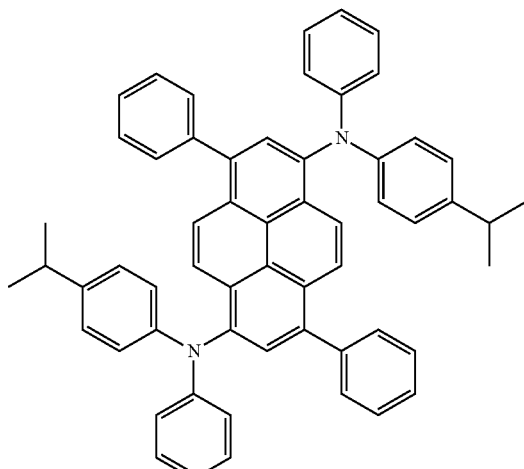
FD9
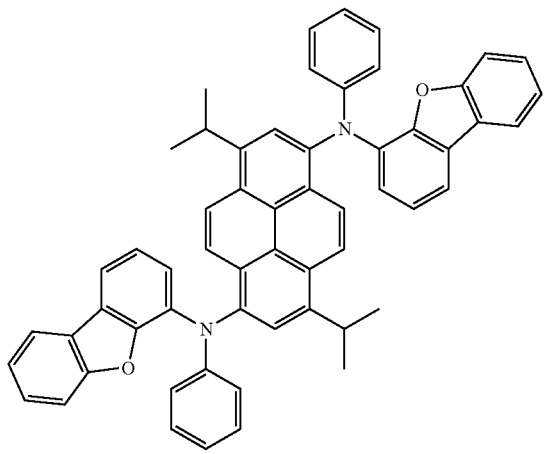
FD10
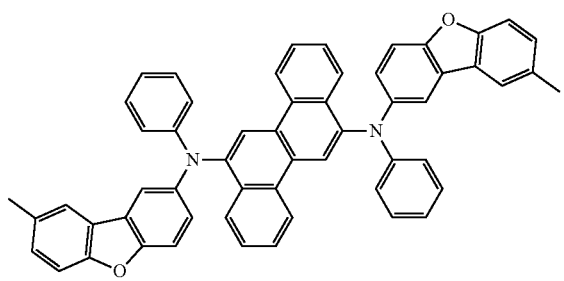
FD11
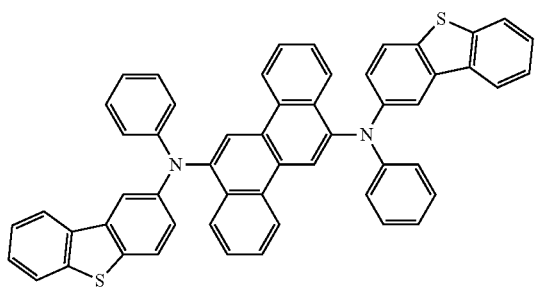
FD12
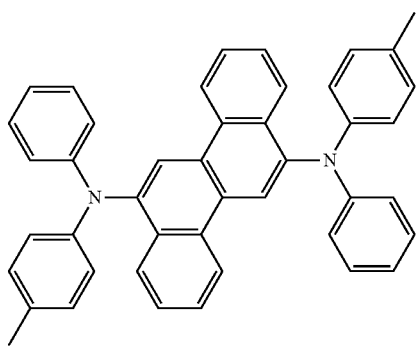

-continued
FD13
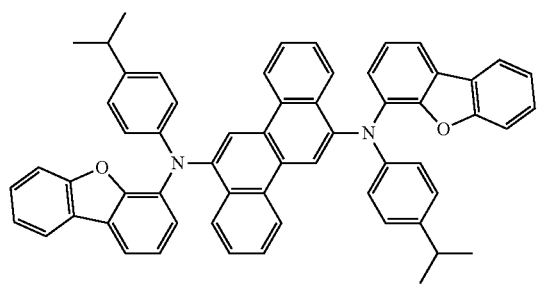
FD14
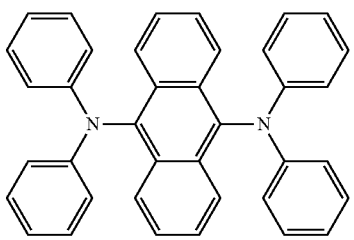
FD15
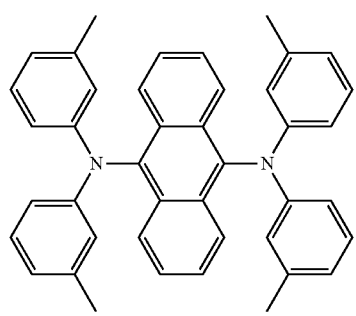
FD16
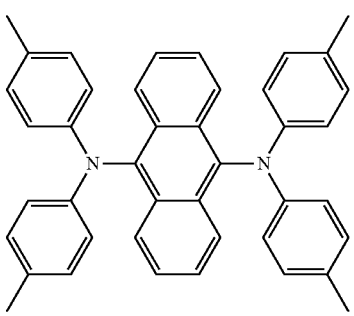
FD17
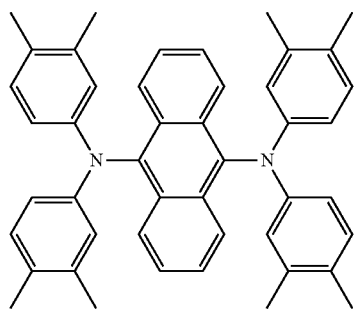
FD18
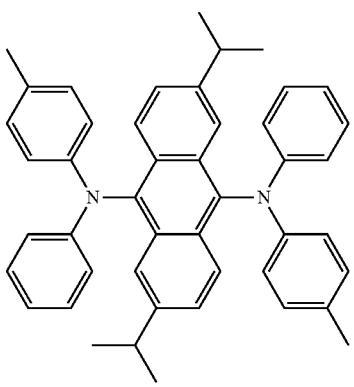
FD19
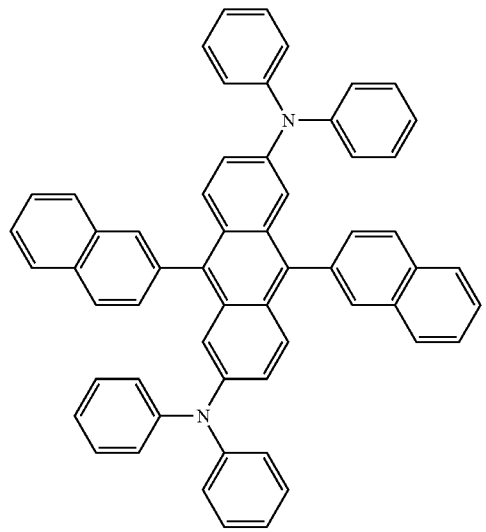
FD20
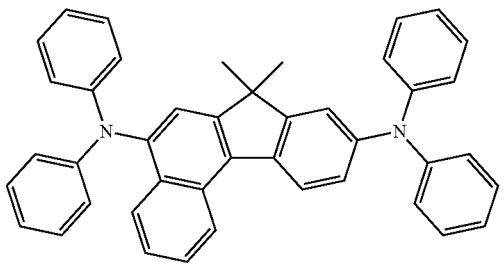

-continued
FD21
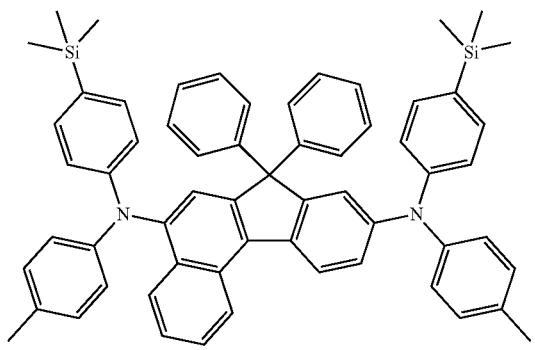
FD22
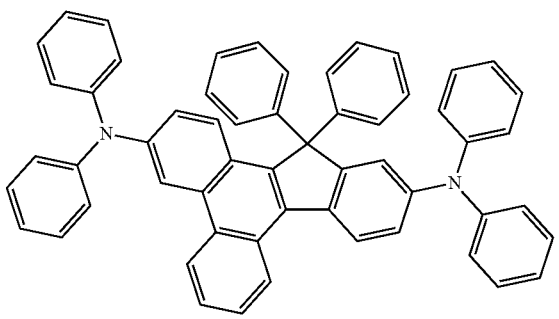
FD23
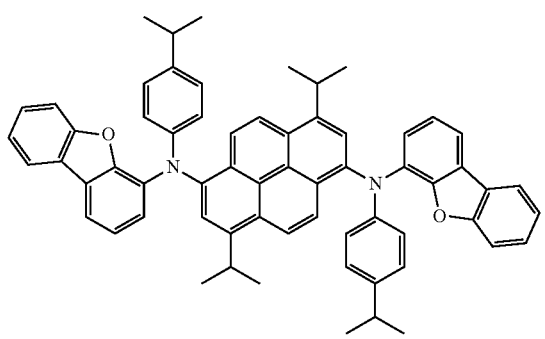
FD24
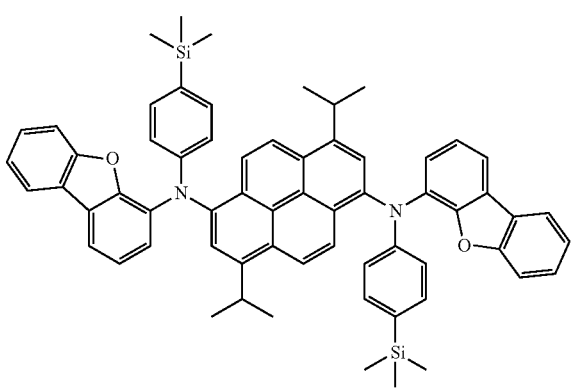
FD25
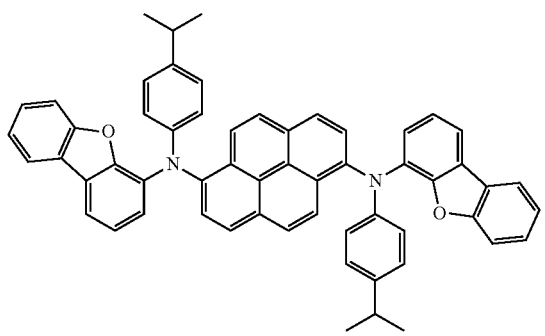
FD26
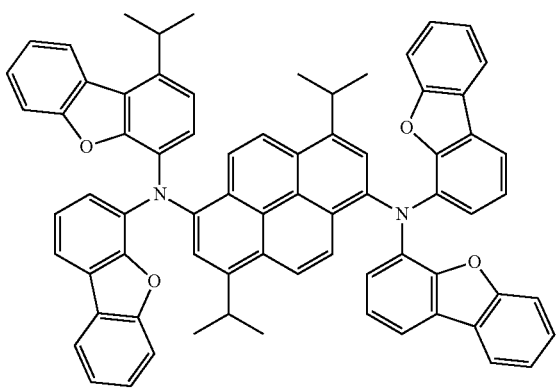
FD27
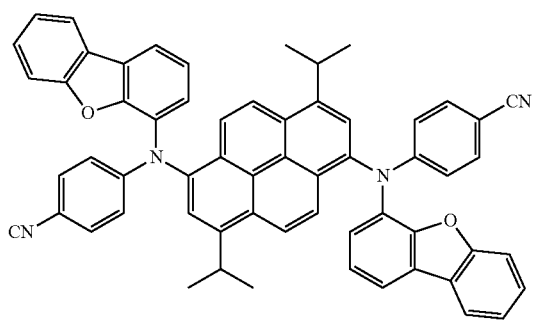
FD28
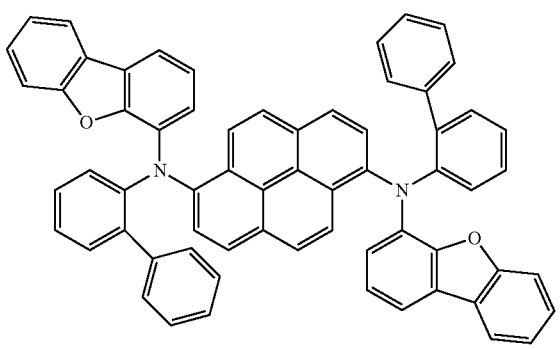

-continued
FD29
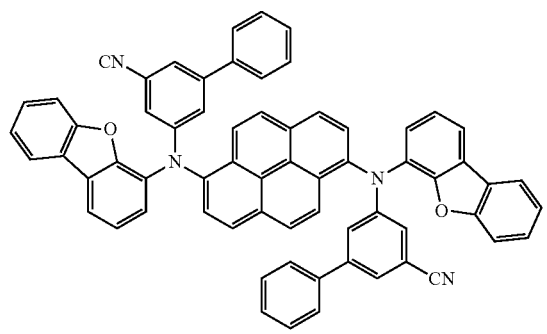
FD30
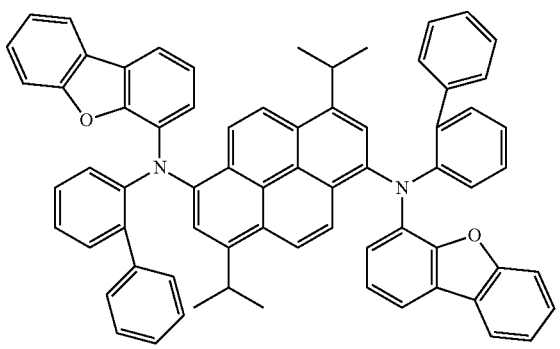
FD31
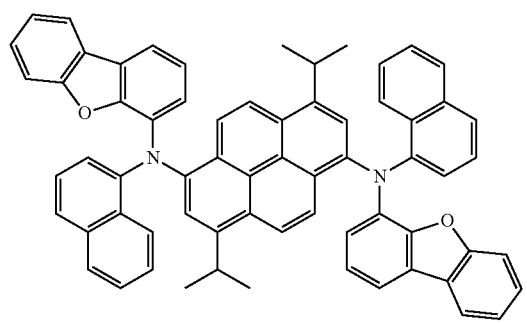
FD32
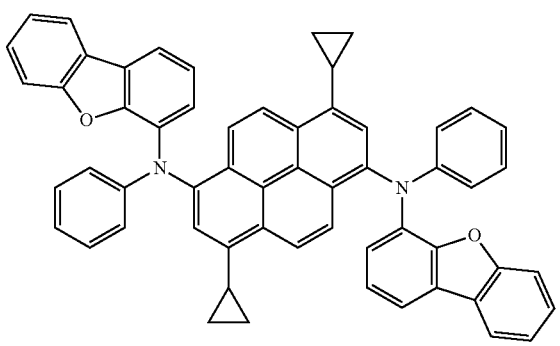
FD33
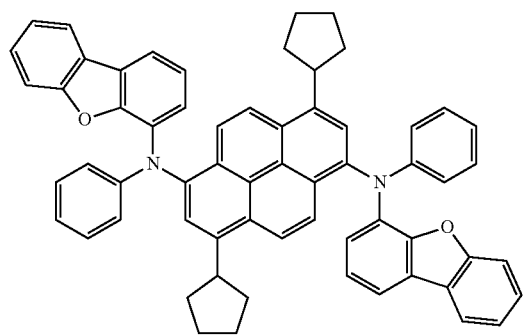
FD34
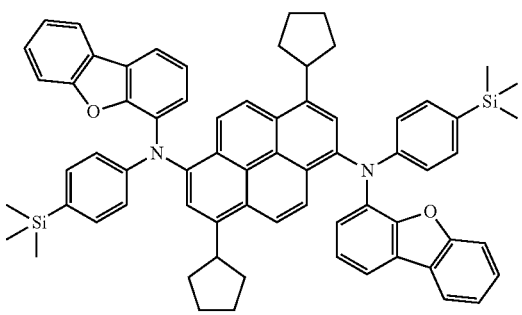
FD35
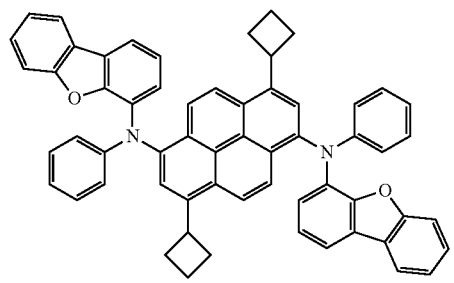
FD36
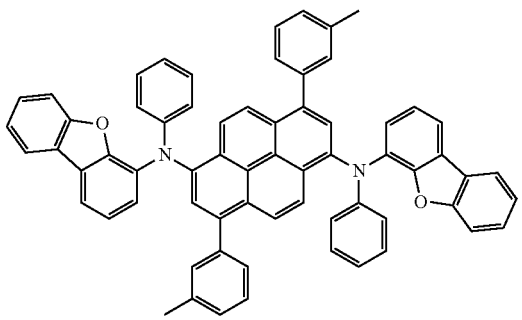

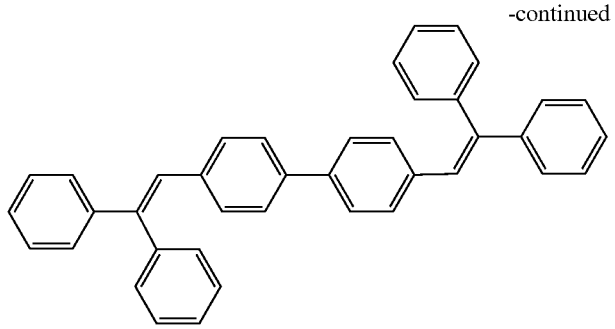

DPVBi

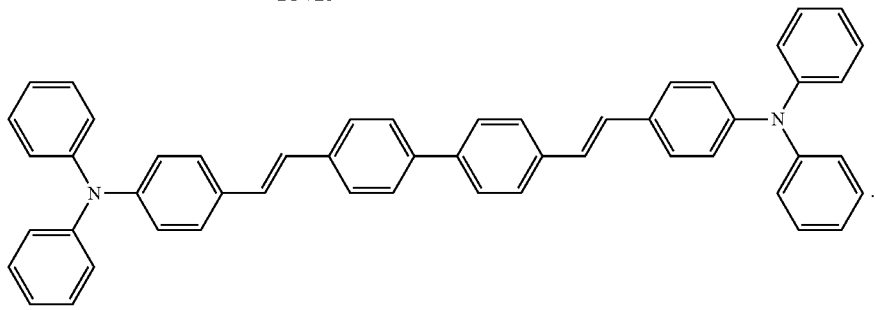

DPAVBi

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole-blocking layer, an electron control layer, an electron transport layer, an electron injection layer, or any combination thereof.

In an embodiment, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer in the respective stated order.

In an embodiment, the electron transport region (for example, the buffer layer, the hole-blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \quad \text{Formula 601}$$

wherein, in Formula 601,
Ar$_{601}$ and L$_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
xe11 may be 1, 2, or 3,
xe1 may be 0, 1, 2, 3, 4, or 5, R$_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si(Q$_{601}$)(Q$_{602}$)(Q$_{603}$), —C(=O)(Q$_{601}$), —S(=O)$_2$(Q$_{601}$), or —P(=O)(Q$_{601}$)(Q$_{602}$),
Q$_{601}$ to Q$_{603}$ are each independently the same as described in connection with Q$_1$,
xe21 may be 1, 2, 3, 4, or 5, and
at least one of Ar$_{601}$, L$_{601}$, or R$_{601}$ may each independently be a Tr electron-deficient nitrogen-containing $C_1$-$C_{60}$ cyclic group unsubstituted or substituted with at least one $R_{10a}$.

In an embodiment, when xe11 in Formula 601 is 2 or more, two or more of Ar$_{601}$(s) may be linked to each other via a single bond.

In one or more embodiments, Ar$_{601}$ in Formula 601 may be a substituted or unsubstituted anthracene group.

In an embodiment, the electron transport region may include a compound represented by Formula 601-1:

Formula 601-1

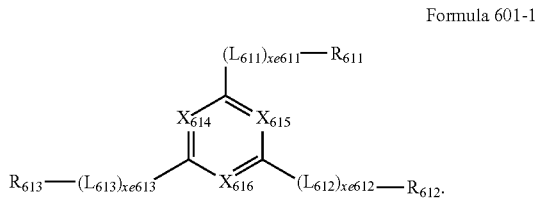

wherein, in Formula 601-1,
X$_{614}$ may be N or C(R$_{614}$), X$_{615}$ may be N or C(R$_{615}$), X$_{616}$ may be N or C(R$_{616}$), and at least one of X$_{614}$ to X$_{616}$ may be N,
L$_{611}$ to L$_{613}$ are each independently the same as described in connection with L$_{601}$,
xe611 to xe613 are each independently the same as described in connection with xe1, $R_{611}$ to $R_{613}$ are each independently the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, TSPO1, TPBI, or any combination thereof:

ET1

ET2

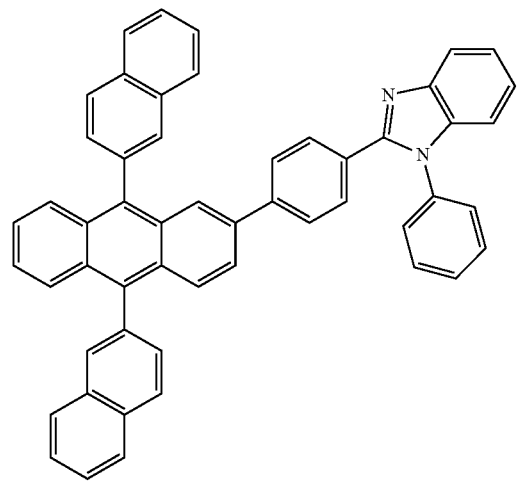

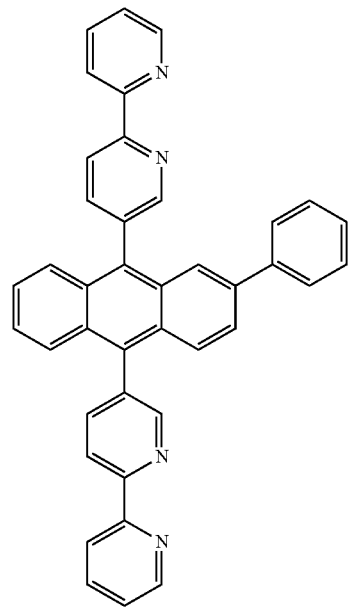

ET3

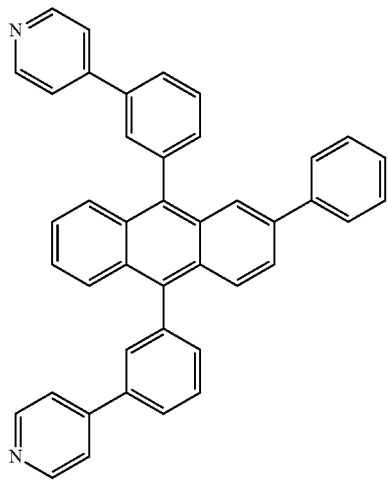

ET4

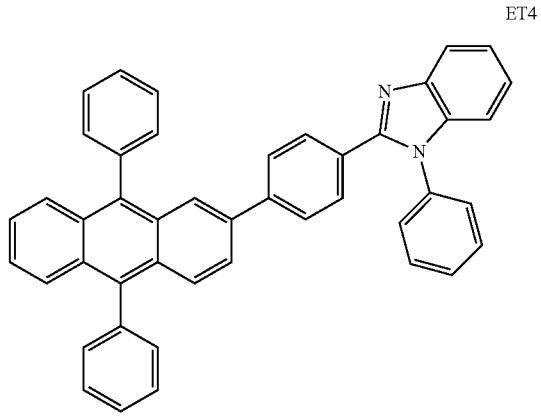

ET5

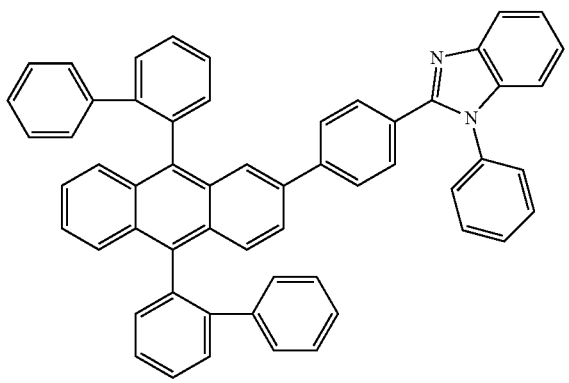

ET6
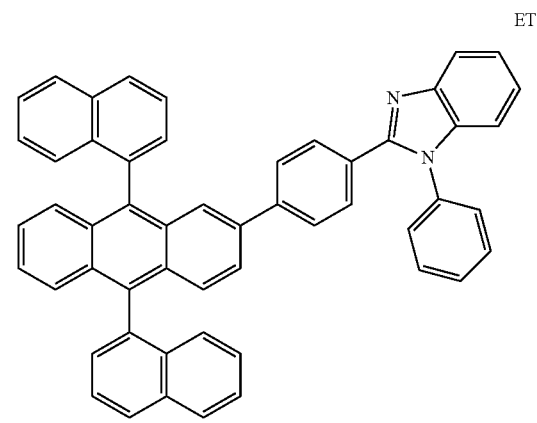
ET7
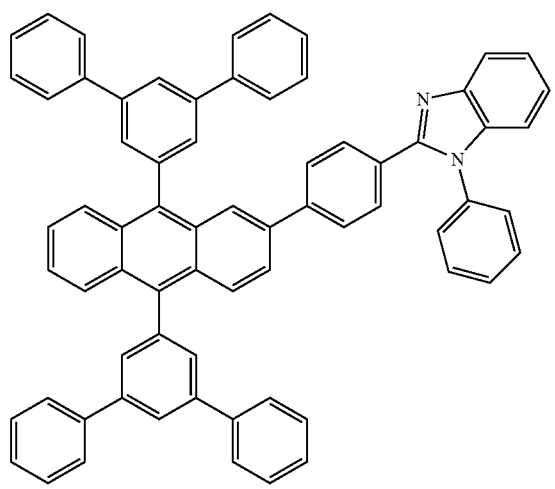
ET8
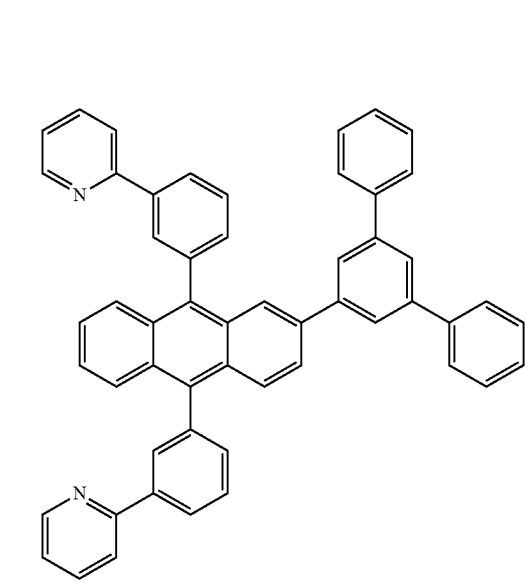
ET9
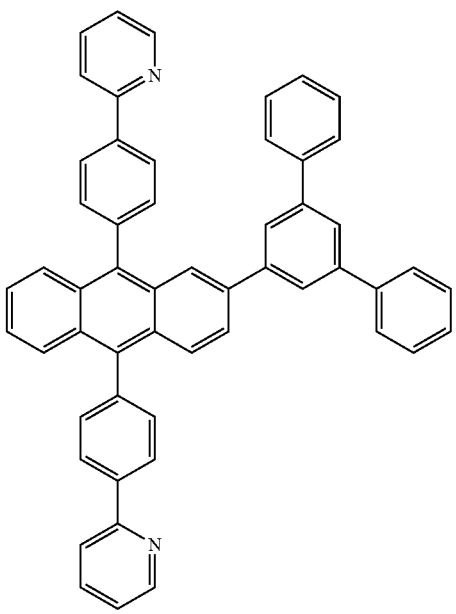
ET10
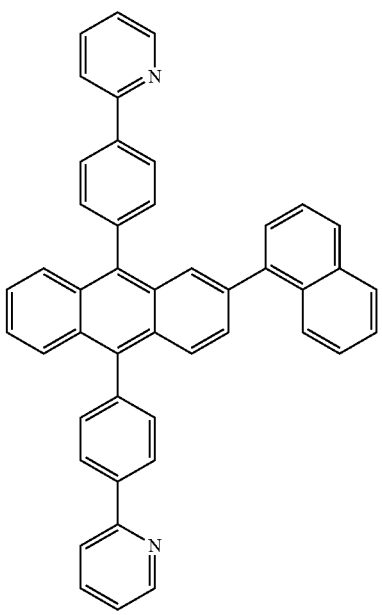

ET11
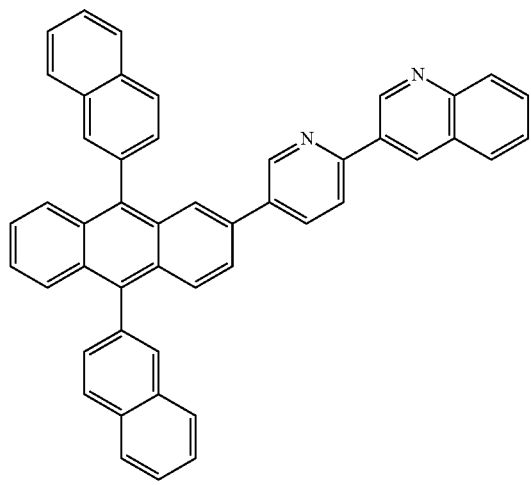
ET12
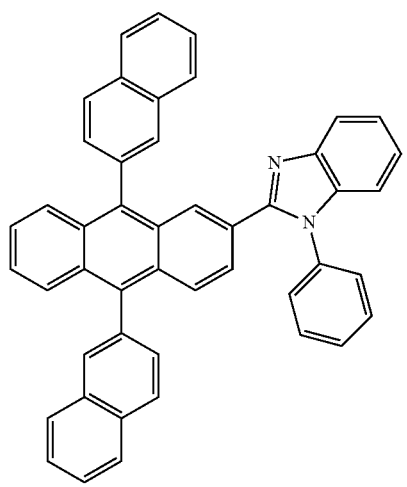
ET13
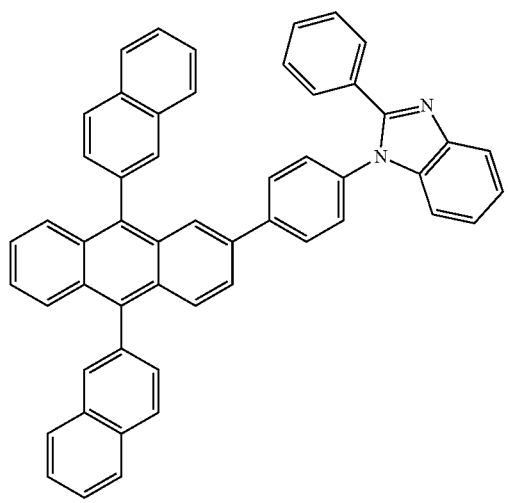
ET14
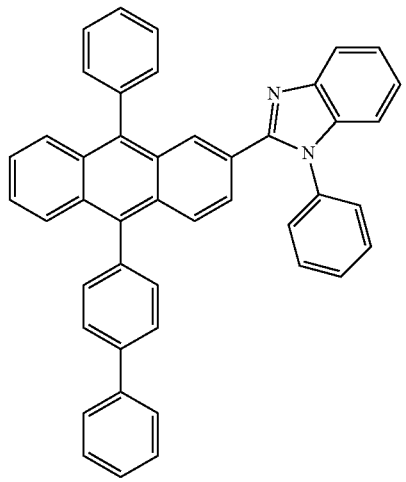
ET15
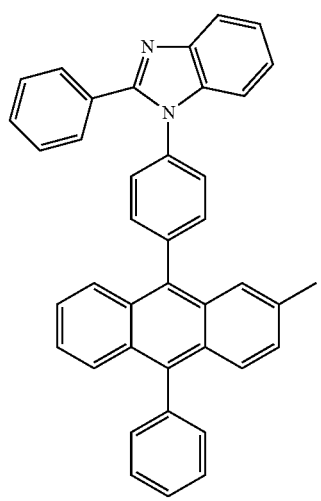
ET16
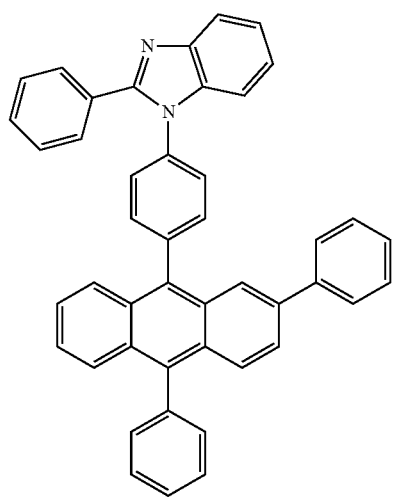

ET17
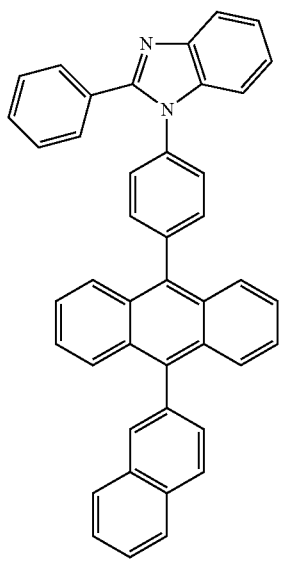
ET18
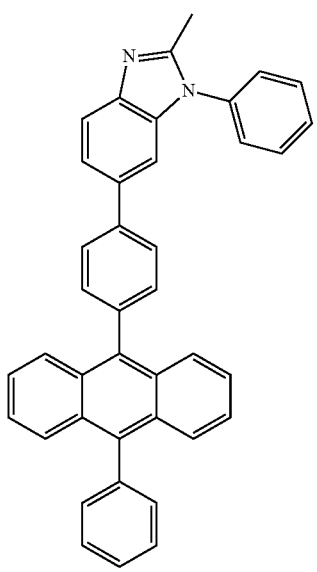
ET19
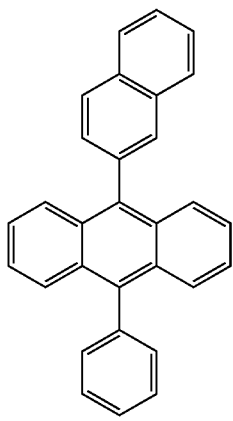
ET20
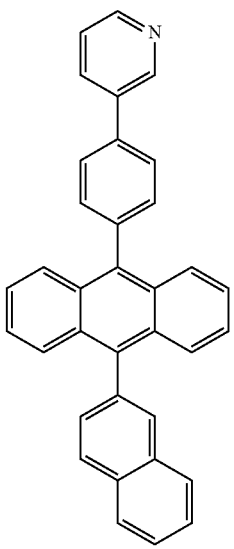
ET21
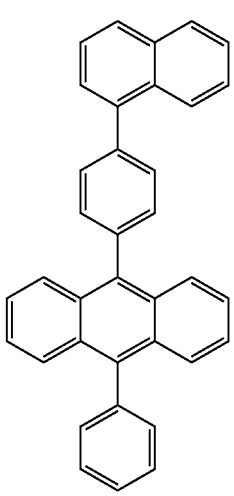
ET22
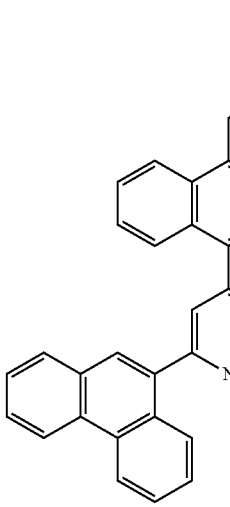

ET23
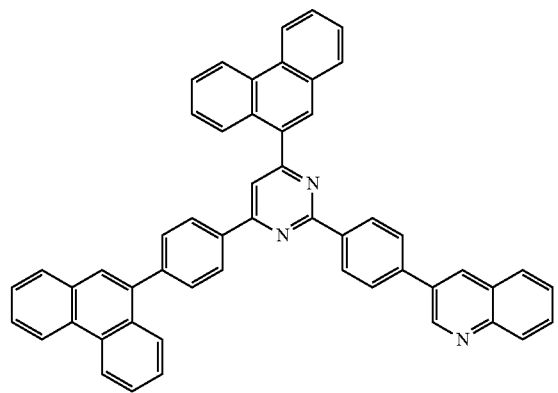
ET24
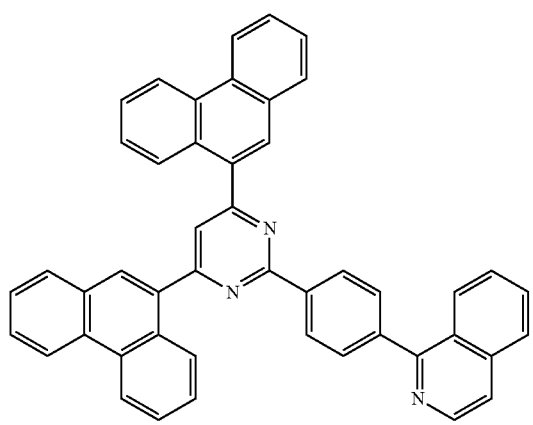
ET25
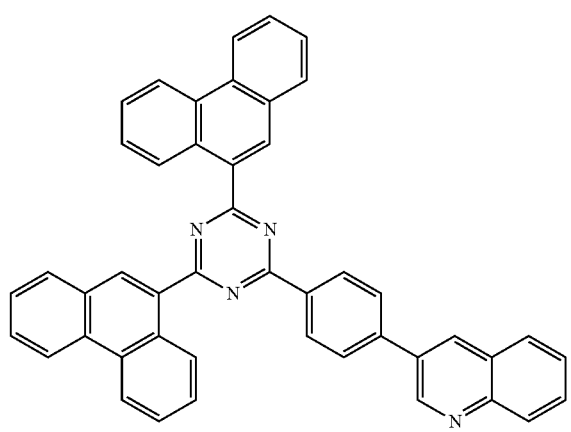
ET26
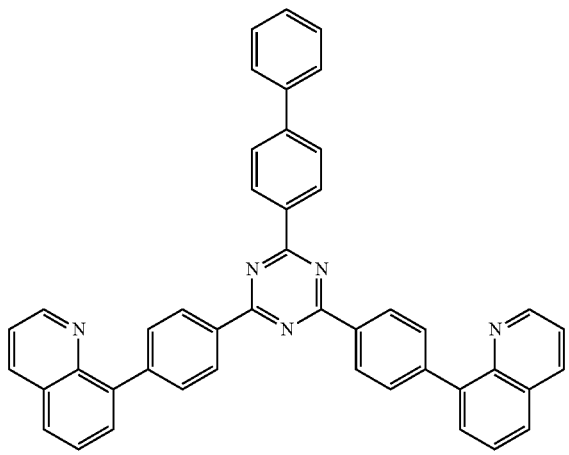
ET27
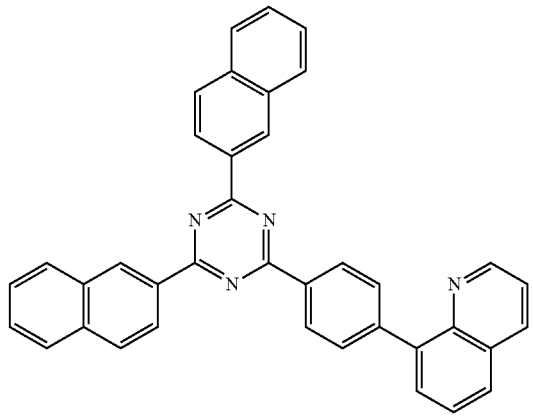
ET28
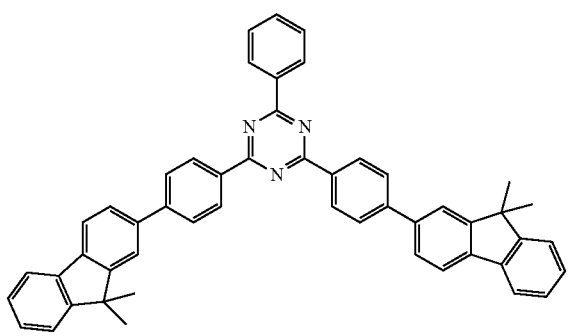

ET29
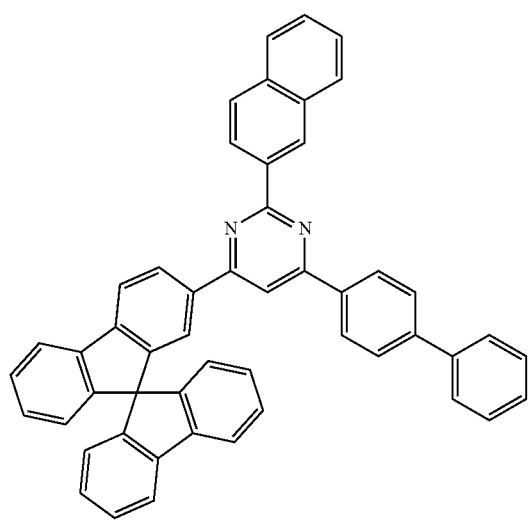
ET32
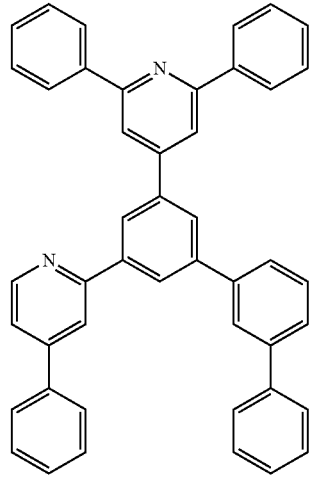
ET30
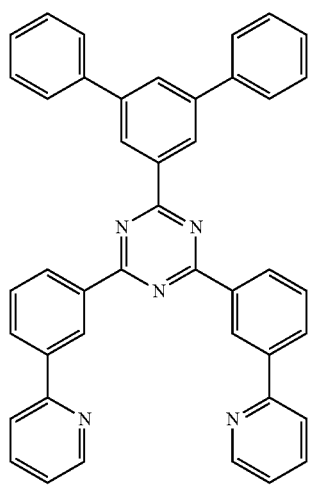
ET33
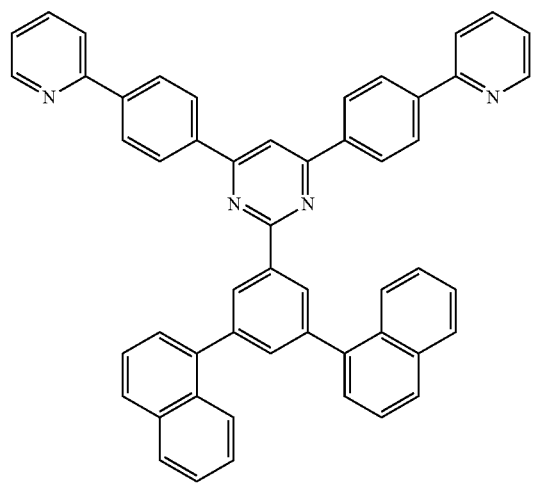
ET31
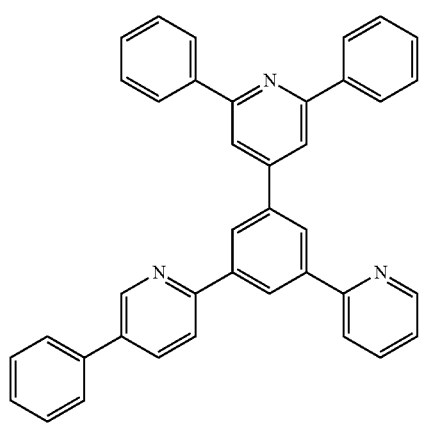
ET34
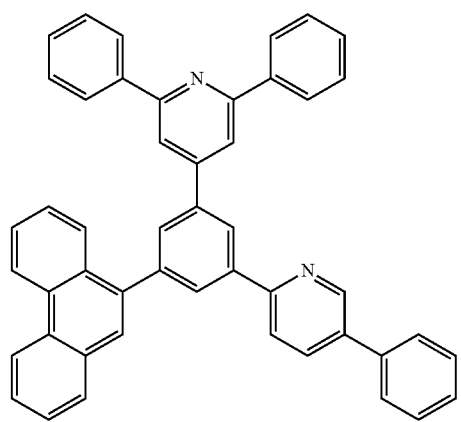

ET35
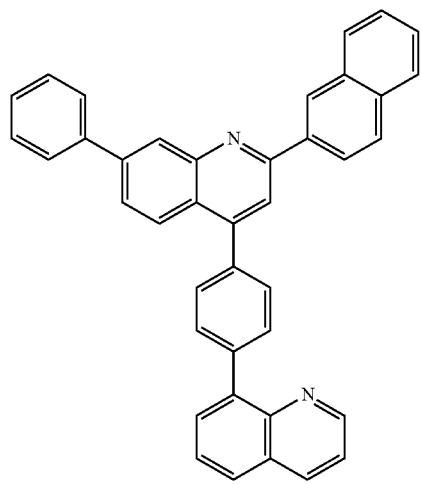
ET36
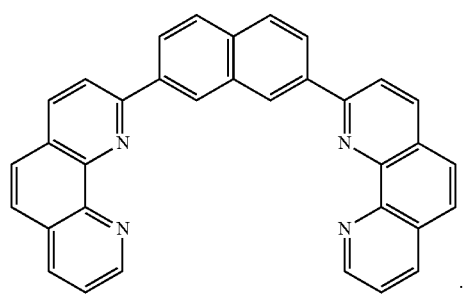
ET37
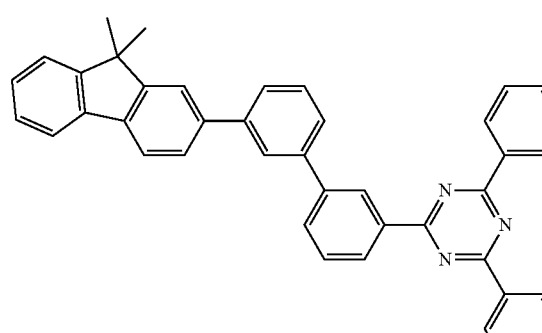
ET38
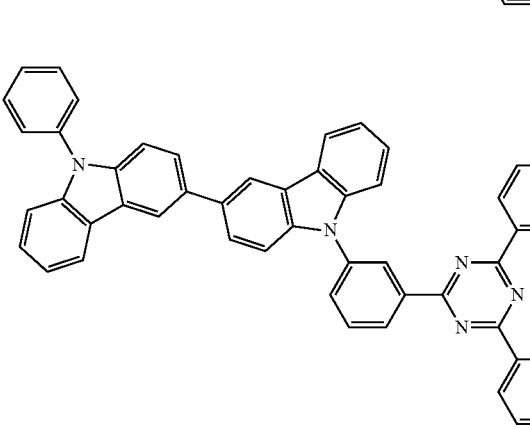
ET39
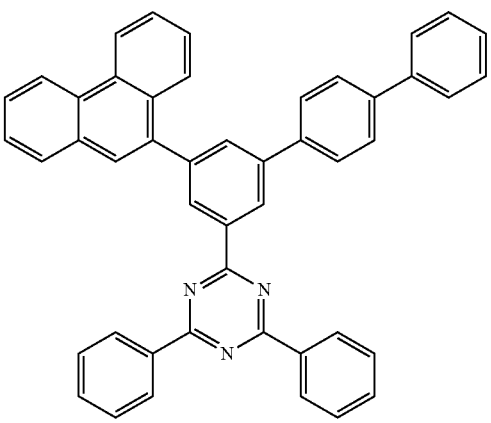
ET40
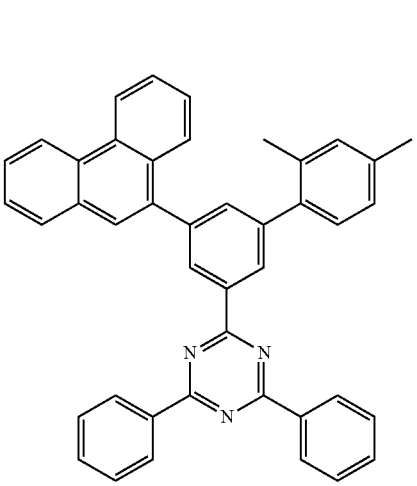
ET41
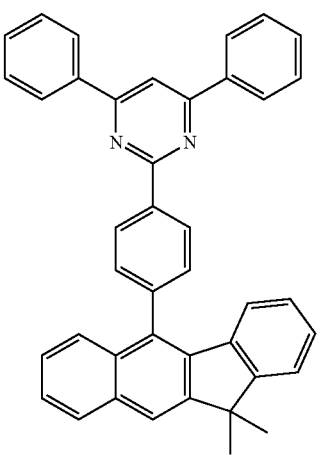

ET42
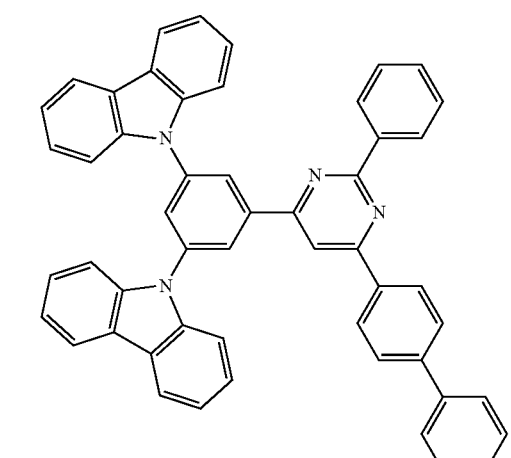
ET43
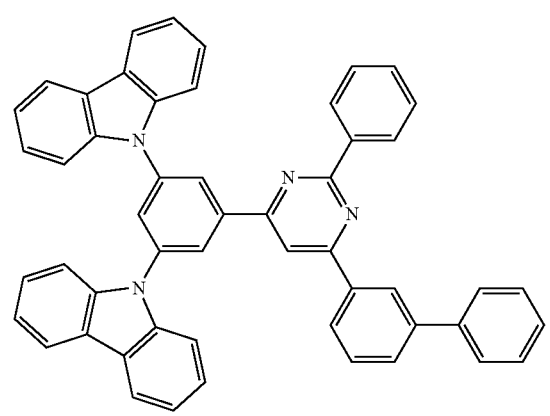
ET44
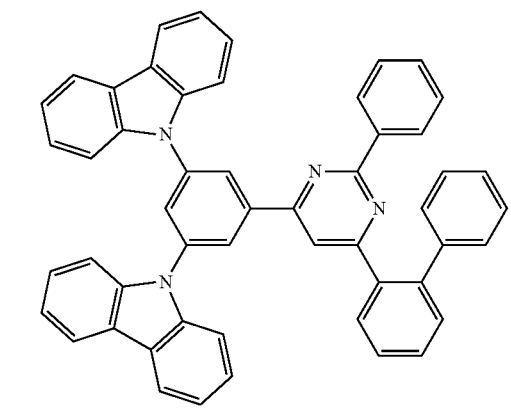
ET45
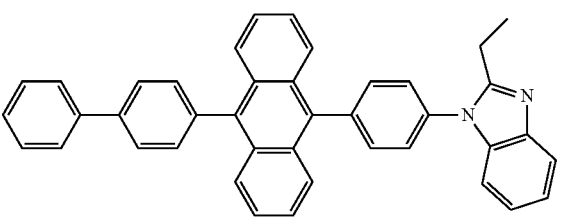
Alq₃
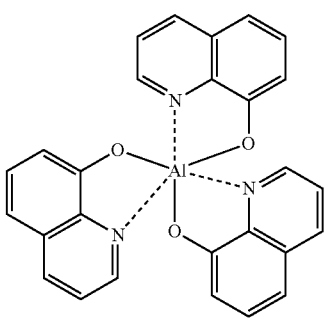
BAlq
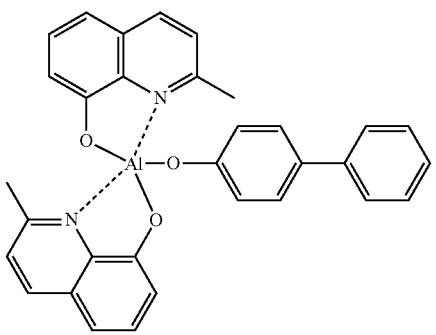
TAZ
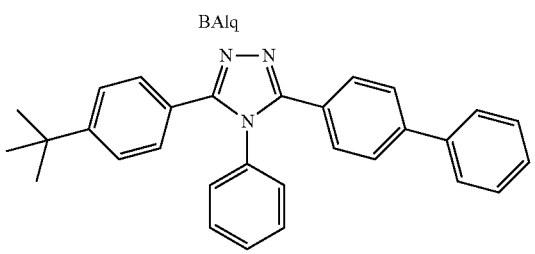
NTAZ
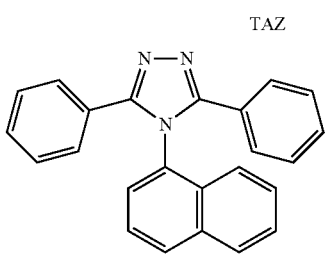
TSPO1
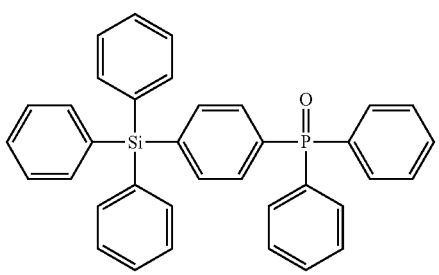

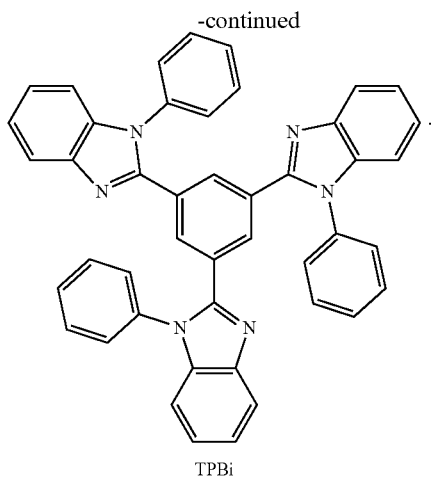

TPBi

A thickness of the electron transport region may be from about 100 Å to about 5,000 Å, for example, from about 160 Å to about 4,000 Å. When the electron transport region includes a buffer layer, a hole-blocking layer, an electron control layer, an electron transport layer, or any combination thereof, the thickness of the buffer layer, the hole-blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, the hole-blocking layer, the electron control layer, and/or the electron transport layer are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

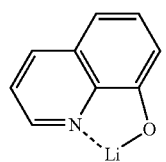

ET-D2

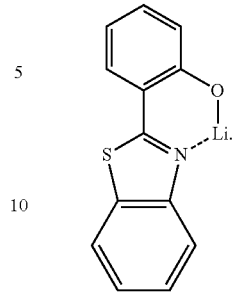

The electron transport region may include an electron injection layer that facilitates the injection of electrons from the second electrode 150. The electron injection layer may directly contact (e.g., physically contact) the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be one or more oxides, halides (for example, fluorides, chlorides, bromides, and/or iodides), and/or tellurides of the alkali metal, the alkaline earth metal, and/or the rare earth metal, or any combination thereof.

The alkali metal-containing compound may include one or more alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include (e.g., may be) LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, the electron injection layer may have suitable or satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110 (e.g., on the side of the first electrode 110 facing oppositely away from the second electrode 150), and/or a second capping layer may be located outside the second electrode 150 (e.g., on the side of the second electrode 150 facing oppositely away from the first electrode 110). In one or embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward (e.g., transmitted or provided to) the outside through the first electrode 110, which may be a semi-transmissive electrode or a transmissive electrode, and the first capping layer, or light generated in an emission layer of the interlayer 130 of the light-emitting device 10 may be extracted toward (e.g., transmitted or provided to) the outside through the second electrode 150, which may be a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and second capping layer may include a material having a refractive index (at a wavelength of 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may (e.g., may each) independently include one or more carbocyclic compounds, heterocyclic compounds, amine group-containing compounds, porphyrin derivatives, phthalocyanine derivatives, a naphthalocyanine derivatives, alkali metal complexes, alkaline earth metal complexes, or any combination thereof. The carbocyclic compound, the heterocyclic compound, and the amine group-containing compound may be optionally substituted with a substituent including O, N, S, Se, Si, F, Cl, Br, I, or any combination thereof. In one or more embodiments, at least one of the first capping layer or the second capping layer may (e.g., may each) independently include an amine group-containing compound.

In one or more embodiments, at least one of the first capping layer or the second capping layer may (e.g., may each) independently include a compound represented by Formula 201, a compound represented by Formula 202, or any combination thereof.

In one or more embodiments, at least one of the first capping layer or the second capping layer may (e.g., may each) independently include one of Compounds HT28 to HT33, Compounds CP1 to CP6, β-NPB, or any combination thereof:

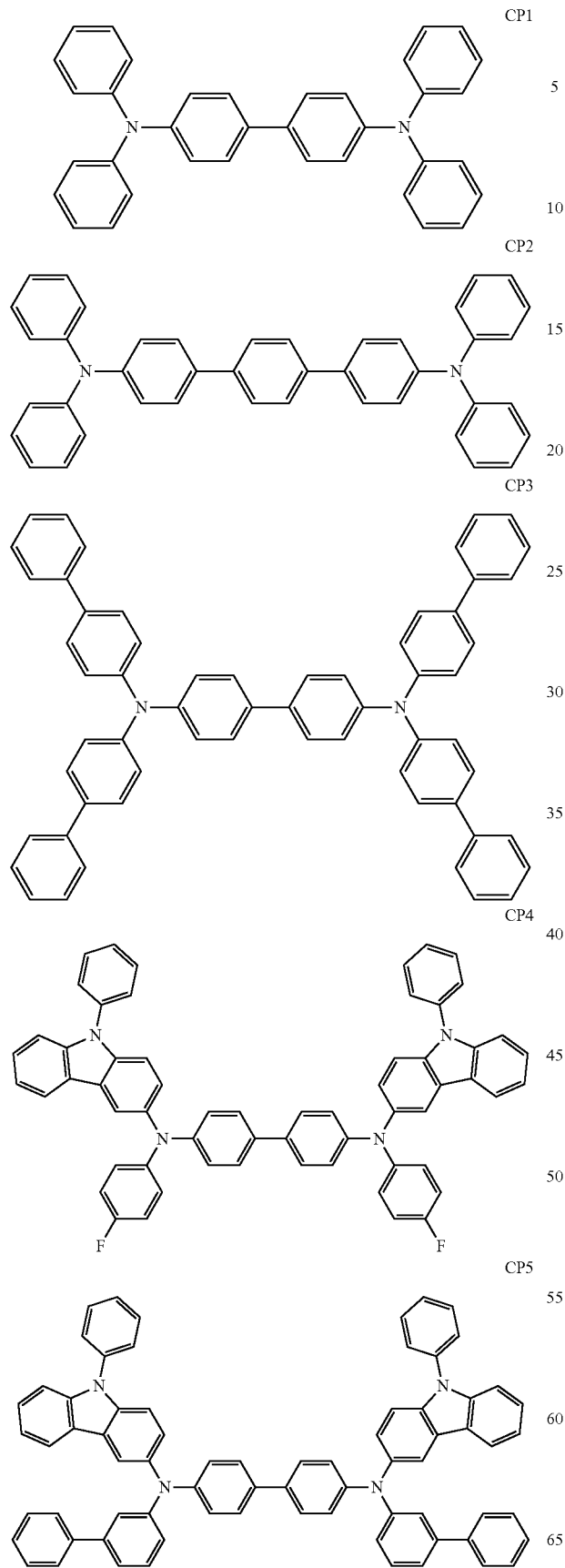

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, the light emitted from the light-emitting device may be blue light or white light. The light-emitting device may be the same as described above. In one or more embodiments, the color conversion layer may include quantum dots. The quantum dots may be, for example, the same as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be located among the plurality of subpixel areas to define each of the subpixel areas.

The color filter may further include a plurality of color filter areas and light-shielding patterns located among the plurality of color filter areas, and the color conversion layer may include a plurality of color conversion areas and light-shielding patterns located among the plurality of color conversion areas.

The plurality of color filter areas (or the plurality of color conversion areas) may include a first area emitting a first color light, a second area emitting a second color light, and/or a third area emitting a third color light, and the first color light, the second color light, and/or the third color light may have different maximum emission wavelengths from one another. In one or more embodiments, the first color light may be red light, the second color light may be green light, and the third color light may be blue light. In one or more embodiments, the plurality of color filter areas (or the plurality of color conversion areas) may include quantum dots. In more detail, the first area may include a red quantum dot (e.g., a red-light emitting quantum dot), the second area may include a green quantum dot (e.g., a green-light emitting quantum dot), and the third area may not include a quantum dot. The quantum dot may be the same as described in the present specification. The first area, the second area, and/or the third area may each further include a scatterer (e.g., a light scatterer).

In one or more embodiments, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, etc.

The activation layer may include crystalline silicon, amorphous silicon, an organic semiconductor, an oxide semiconductor, and/or the like.

The electronic apparatus may further include a sealing portion for sealing the light-emitting device. The sealing portion may be placed between the color filter and the light-emitting device and/or between the color conversion layer and the light-emitting device. The sealing portion allows light from the light-emitting device to be extracted to the outside, while concurrently (or simultaneously) preventing or substantially preventing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting apparatuses, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
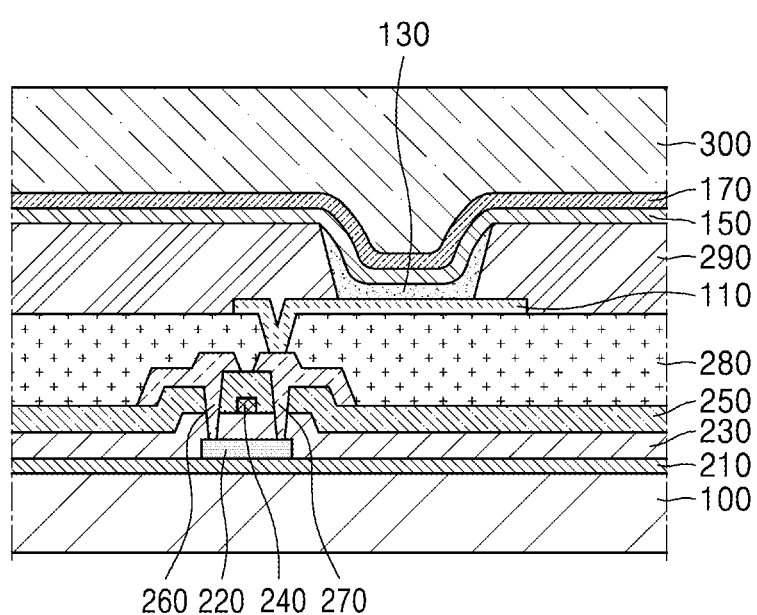
FIG. 2 shows a schematic cross-sectional view of an electronic apparatus according to an embodiment.
Figure 3:
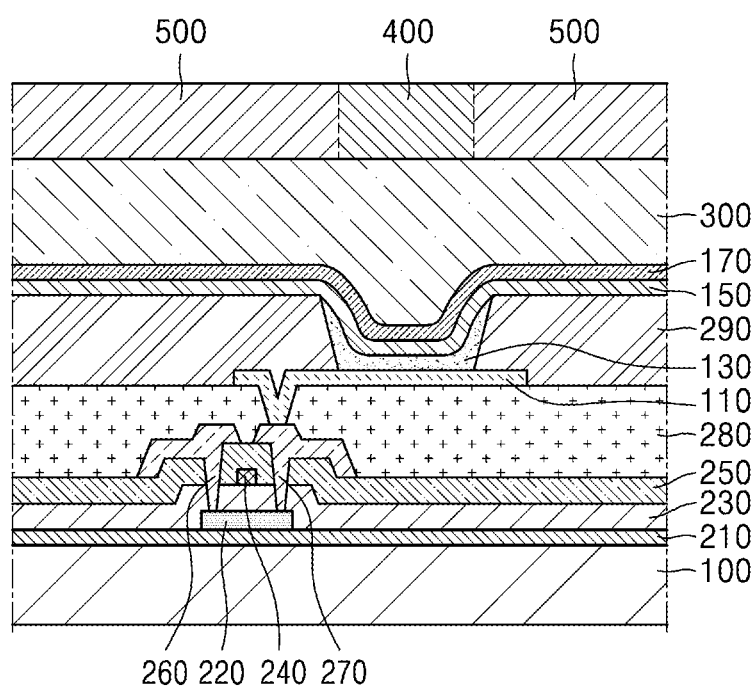
FIG. 3 shows a schematic cross-sectional view of an electronic apparatus according to an embodiment.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion (or an encapsulation layer) 300 that seals the light-emitting device.

The substrate 100 may be a flexible substrate, a glass substrate, and/or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be formed on the passivation layer 280. The passivation layer 280 may not completely cover the drain electrode 270 and may expose a portion of the drain electrode 270, and the first electrode 110 may be connected to the exposed portion of the drain electrode 270.

A pixel defining layer 290 including an insulating material may be located on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. In one embodiment, one or more layers of the interlayer 130 may extend beyond the upper portion of the pixel defining layer 290 in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic film and the organic film.

FIG. 3 shows a cross-sectional view showing a light-emitting apparatus according to an embodiment of the present disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

DEFINITION OF TERMS

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed (e.g., combined together) with each other. For example, the $C_1$-$C_{60}$ heterocyclic group may have 3 to 61 ring-forming atoms.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) group T1 or ii) a condensed cyclic group in which two or more groups T1 are condensed (e.g., combined together) with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed (e.g., combined together) with each other, or iii) a condensed cyclic group in which at least one group T2 and at least one group T1 are condensed (e.g., combined together) with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed (e.g., combined together) with each other, iii) group T3, iv) a condensed cyclic group in which two or more groups T3 are condensed (e.g., combined together) with each other, or v) a condensed cyclic group in which at least one group T3 and at least one group T1 are condensed (e.g., combined together) with each other (for example, the Tr electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more groups T4 are condensed (e.g., combined together) with each other, iii) a condensed cyclic group in which at least one group T4 and at least one group T1 are condensed (e.g., combined together) with each other, iv) a condensed cyclic group in which at least one group T4 and at least one group T3 are condensed (e.g., combined together) with each other, or v) a condensed cyclic group in which at least one group T4, at least one group T1, and at least one group T3 are condensed (e.g., combined together) with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazoie group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group condensed to (e.g., combined together with) any cyclic group or a monovalent or polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond at a main chain (e.g., in the middle) and/or at a terminal end (e.g., the terminus) of the $C_2$-$C_{60}$ alkyl group, and examples thereof may include (e.g., may be) an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond at a main chain (e.g., in the middle) and/or at a terminal end (e.g., the terminus) of the $C_2$-$C_{60}$ alkyl group, and examples thereof may include (e.g., may be) an ethynyl group, and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —O$A_{101}$ (wherein $A_{101}$ is the $C_1$-$C_{60}$ alkyl group), and examples thereof may include (e.g., may be) a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent saturated monocyclic group that further includes, in addition to carbon atom(s), at least one heteroatom as a ring-forming atom and has 1 to 10 carbon atoms, and examples thereof may include (e.g., may be) a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof may include (e.g., may be) a cyclopentenyl group, a cyclo-hexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that has, in addition to carbon atom(s), at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each include two or more rings, the two or more rings may be condensed (e.g., combined together) with each other.

The term "$C_1$-$C_{60}$ heteroaryl group" as used herein refers to a monovalent group having a heterocyclic aromatic system that has, in addition to carbon atom(s), at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to carbon atom(s), at least one heteroatom as a ring-forming atom, and 1 to 60 carbon atoms. Examples of the $C_1$-$C_{60}$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the two or more rings may be condensed (e.g., combined together) with each other.

The term "monovalent non-aromatic condensed polycyclic group" as used herein refers to a monovalent group having two or more rings condensed to (e.g., combined together with) each other, only carbon atoms (for example, having 8 to 60 carbon atoms) as ring-forming atoms, and no aromaticity in its entire molecular structure (e.g., is not aromatic when considered as a whole). Examples of the monovalent non-aromatic condensed polycyclic group may include (e.g., may be) an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group having two or more rings condensed to (e.g., combined together with) each other, at least one heteroatom other than 1 to 60 carbon atoms as a ring-forming atom, and non-aromaticity in its entire molecular structure (e.g., is not aromatic when considered as a whole). Examples of the monovalent non-aromatic condensed heteropolycyclic group may include (e.g., may be) a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_0$ aryl alkyl group" as used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_0$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{606}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_0$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include (e.g., may be) O, S, N, P, Si, B, Ge, Se, and any combination thereof.

The term "the third-row transition metal" as used herein includes hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "tert-Bu," "'Bu," or "Bu'" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

*, *' and *'' as used herein, unless defined otherwise, each refer to a binding site to a neighboring atom in a corresponding formula or moiety.

Hereinafter, a compound according to embodiments and a light-emitting device according to embodiments will be described in more detail with reference to Synthesis Examples and Examples. The expression "B was utilized instead of A" used in describing Synthesis Examples refers to that an identical molar equivalent of B was utilized in place of A.

EXAMPLES

Synthesis Example of Compound 1

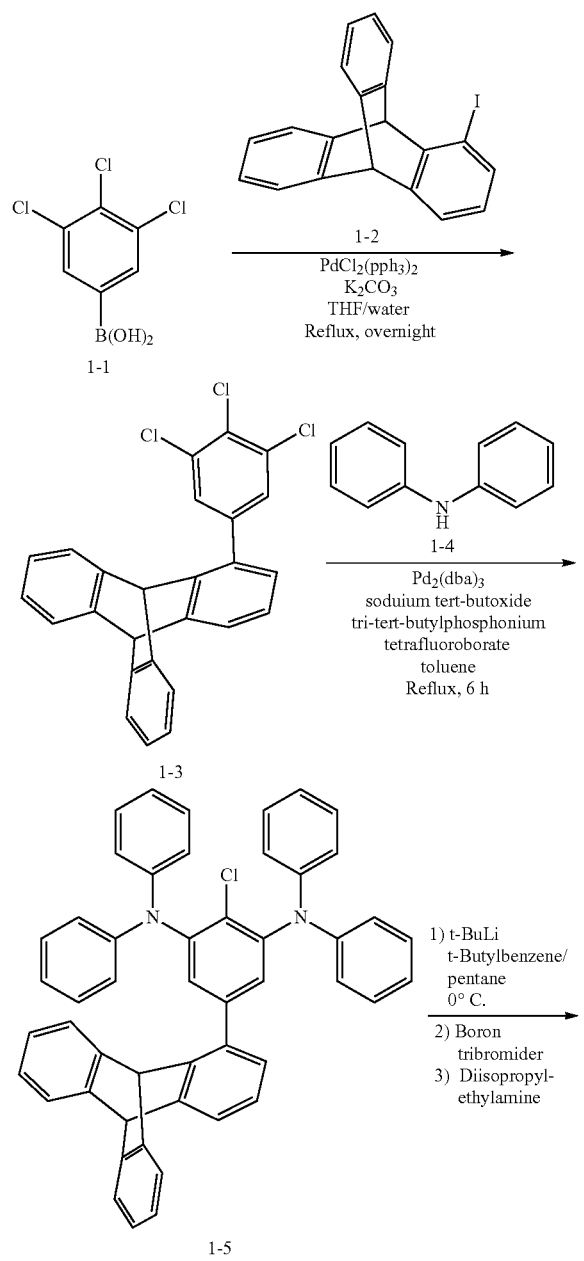

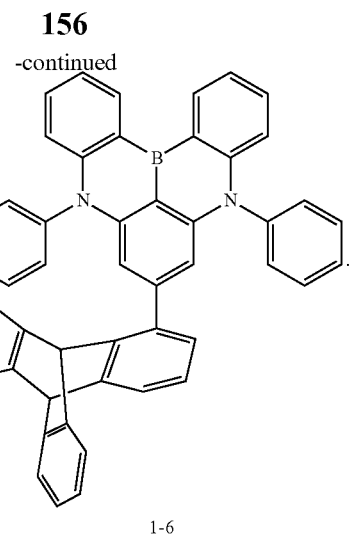

Compound 1-1 (15.8 g, 70.0 mmol) and Compound 1-2 (26.6 g, 70.0 mmol) were added to a flask and then, tetrahydrofuran (THF) was added thereto. A 0.3 M $K_2CO_3$ aqueous solution which had been bubbled with nitrogen for 10 minutes or more, and $PdCl_2(PPh_3)_2$ were added thereto and stirred at a temperature of 80° C. (reflux) for 20 hours (overnight). The obtained residue was purified by silica gel chromatography and recrystallized utilizing a mixed solvent including chloroform and hexane to obtain 17.5 g of Compound 1-3 (yield of 58%). Compound 1-3 (17.5 g, 40.3 mmol) and Compound 1-4 (16.4 g, 96.7 mmol) were added to a flask and then, toluene was added thereto. Sodium tert-butoxide, $Pd_2(dba)_3$, and tri-tert-butylphosphonium tetrafluoroborate were added thereto, and then, the resultant mixture was stirred at a temperature of 110° C. (reflux) for 6 hours. The obtained residue was purified by silica gel chromatography and recrystallized utilizing a mixed solvent including chloroform and hexane to obtain 21.7 g of Compound 1-5 (yield of 77%). At a temperature of 0° C., t-BuLi was slowly added to a t-butylbenzene/pentane solvent and Compound 1-5, and then, boron tribromide, and diisopropylethylamine were added in sufficient amounts thereto. The resultant mixture was sufficiently stirred. The obtained compound was purified by silica gel chromatography utilizing a mixed solvent of toluene and hexane to obtain 6.48 g of Compound 1-6 (Compound 1) (yield of 31%).

MS: calcd 672.27; found 672.30.

Synthesis Example of Compound 3

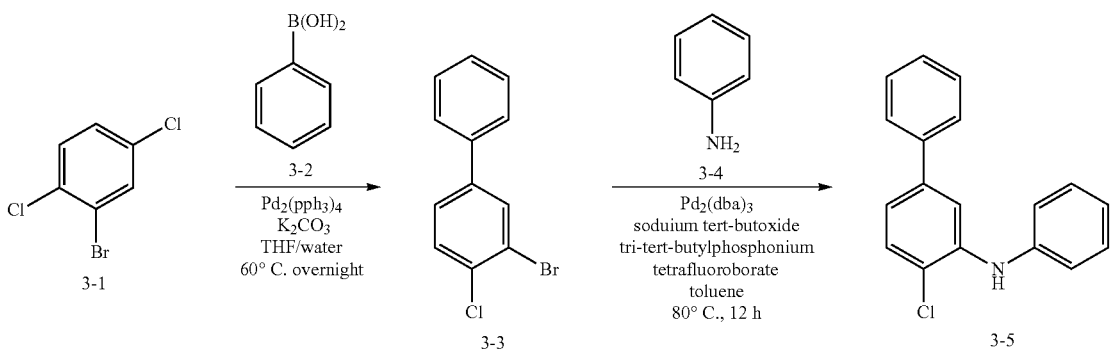

-continued

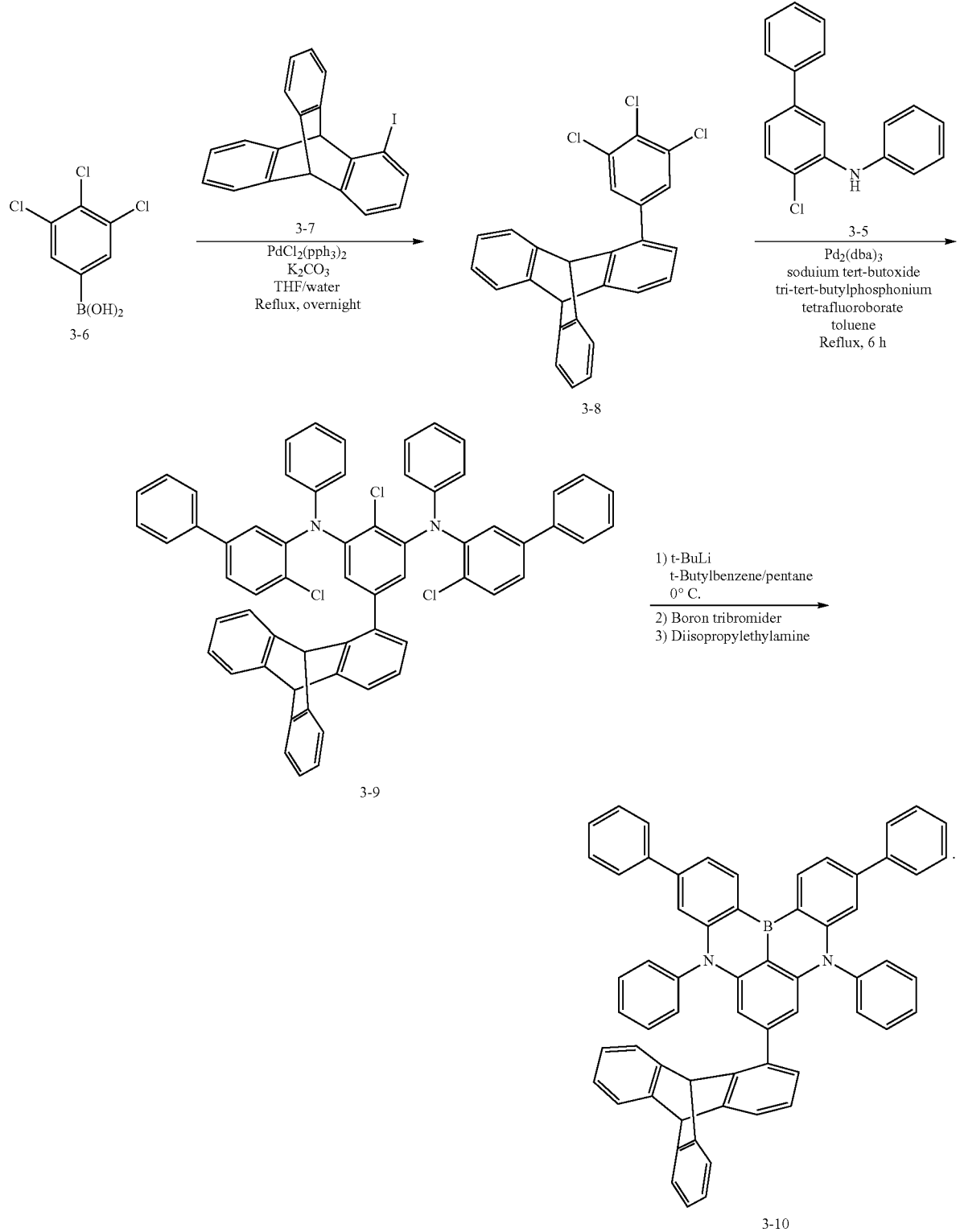

Compound 3-1 (10.0 g, 31.5 mmol) and Compound 3-2 (4.61 g, 37.8 mmol) were added to a flask and then, THF was added thereto. A 0.3 M $K_2CO_3$ aqueous solution which had been bubbled with nitrogen for 10 minutes or more, and $Pd(PPh_3)_4$ were added thereto and stirred at a temperature of 60° C. for 20 hours (overnight). The obtained residue was purified by silica gel chromatography and recrystallized utilizing a mixed solvent including dichloromethane and hexane to obtain 6.24 g of Compound 3-3 (yield of 74%). Compound 3-3 (6.24 g, 23.3 mmol) and Compound 3-4 (2.61 g, 28.0 mmol) were added to a flask and then, toluene was added thereto. Sodium tert-butoxide, $Pd_2(dba)_3$, and tri-tert-butylphosphonium tetrafluoroborate were added thereto, and stirred at a temperature of 80° C. for 12 hours. The obtained residue was purified by silica gel chromatography and recrystallized utilizing a mixed solvent including chloroform and hexane to obtain 5.93 g of Compound 3-5 (yield of 91%). Compound 3-6 (15.8 g, 70.0 mmol) and Compound 3-7 (26.6 g, 70.0 mmol) were added to a flask and then, THF was added thereto. A 0.3 M $K_2CO_3$ aqueous solution which had been bubbled with nitrogen for 10 minutes or more, and $PdCl_2(PPh_3)_2$ were added thereto and stirred at a temperature of 80° C. (reflux) for 20 hours (overnight). The obtained residue was purified by silica gel chromatography and recrystallized utilizing a mixed solvent including chloroform and hexane to obtain 17.5 g of Compound 3-8 (yield of 58%). Compound 3-8 (6.00 g, 13.8 mmol) and Compound 3-5 (10.4 g, 33.1 mmol) were added to a flask, and then, toluene was added thereto. Sodium tert-butoxide, $Pd_2(dba)_3$, and tri-tert-butylphosphonium tetrafluoroborate were added thereto, and then, the resultant mixture was stirred at a temperature of 110° C. for 6 hours. The obtained residue was purified by silica gel chromatography and recrystallized utilizing a mixed solvent including chloroform and hexane to obtain 9.14 g of Compound 3-9 (yield of 72%). At a temperature of 0° C., t-BuLi was slowly added to a t-butylbenzene/pentane solvent and Compound 3-9, and then, boron tribromide and diisopropylethylamine were added in sufficient amounts thereto. The resultant mixture was sufficiently stirred to obtain a compound. The obtained compound was purified by silica gel chromatography utilizing a mixed solvent of dichloromethane and hexane to obtain 2.62 g of Compound 3-10 (Compound 3) (yield of 32%).

Synthesis Example of Compound 4

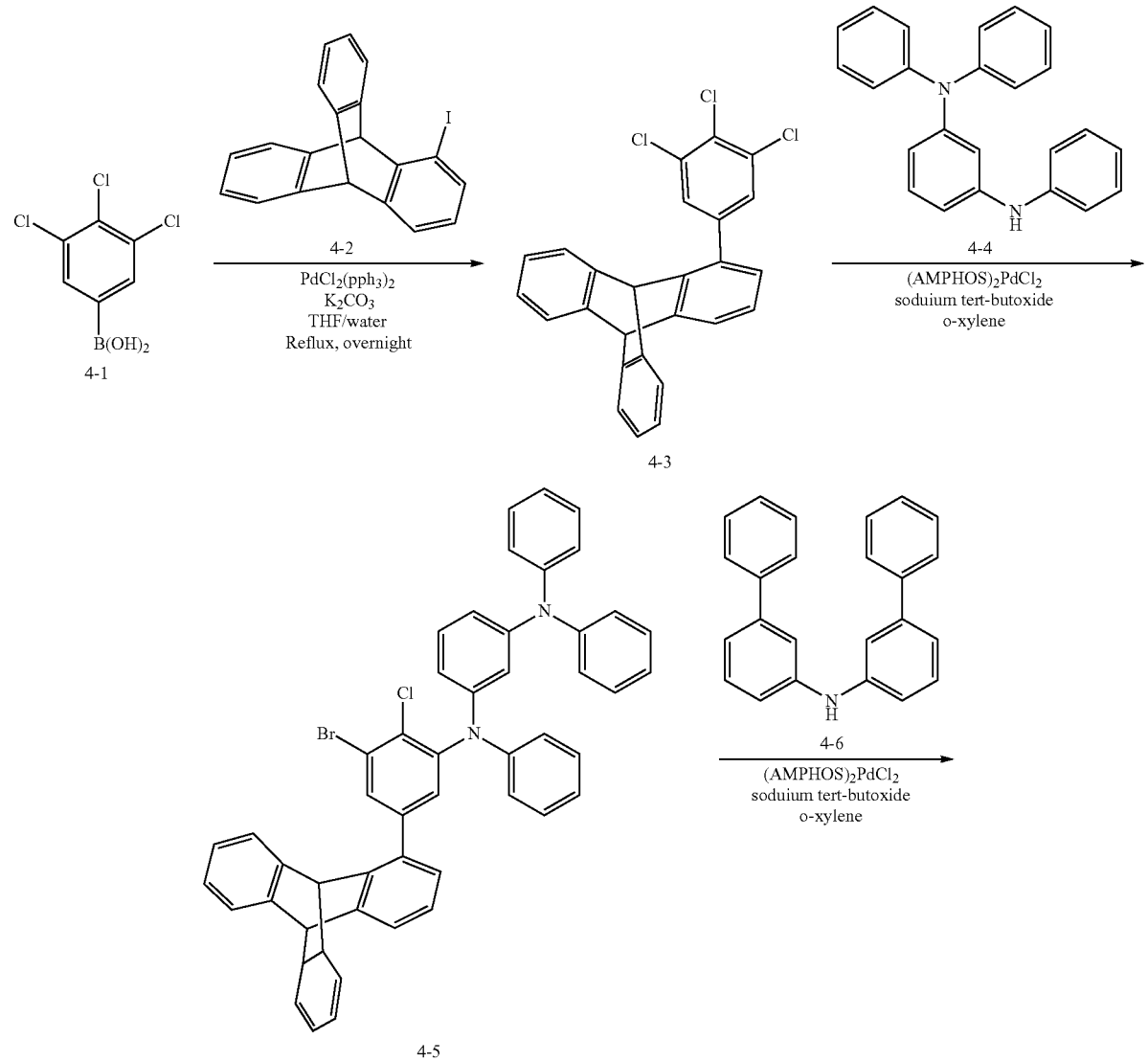

-continued

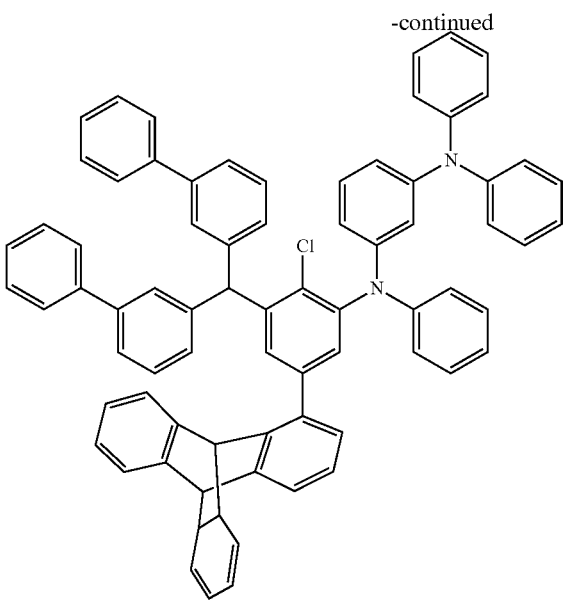

4-7

1) t-BuLi
   t-Butylbenzene/pentane
   0° C.
2) Boron tribromider
3) Diisopropylethylamine

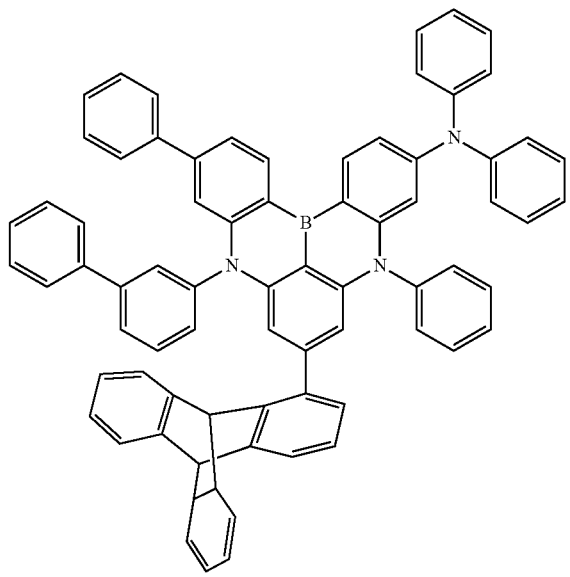

4-8

Compound 4-1 (18.9 g, 70.0 mmol) and Compound 4-2 (26.6 g, 70.0 mmol) were added to a flask and then, tetrahydrofuran (THF) was added thereto. A 0.3 M $K_2CO_3$ aqueous solution which had been bubbled with nitrogen for 10 minutes or more, and $PdCl_2(PPh_3)_2$ were added thereto and stirred at a temperature of 80° C. (reflux) for 20 hours (overnight). The obtained residue was purified by silica gel chromatography and recrystallized utilizing a mixed solvent including chloroform and hexane to obtain 21.8 g of Compound 4-3 (yield of 65%). Compound 4-3 (14.3 g, 30 mmol) and Compound 4-4 (10.1 g, 30 mmol) were added to a flask, and then, o-xylene was added thereto. Sodium tert-butoxide and $(AMPHOS)_2PdCl_2$ were added thereto, and stirred at a temperature of 90° C. for 2.5 hours. The obtained residue was purified by silica gel chromatography and recrystallized utilizing a mixed solvent including chloroform and hexane to obtain 18.6 g of Compound 4-5 (yield of 80%). Compound 4-5 (15.6 g, 20 mmol) and Compound 4-6 (6.43 g, 20 mmol) were added to a flask, and then, o-xylene was added thereto. Sodium tert-butoxide and $(AMPHOS)_2PdCl_2$ were added thereto, and stirred at a temperature of 120° C. for 1 hour. The obtained residue was purified by silica gel chromatography and recrystallized utilizing a mixed solvent including chloroform and hexane to obtain 19.6 g of Compound 4-7 (yield of 76%). At a temperature of 0° C., t-BuLi was slowly added to a t-butylbenzene/pentane solvent and Compound 4-7, and then, boron tribromide and diisopropylethylamine were added in sufficient amounts thereto. The resultant mixture was sufficiently stirred to obtain a compound. The obtained compound was purified by silica gel chromatography utilizing a mixed solvent of dichloromethane and hexane to obtain 6.65 g of Compound 4-8 (Compound 4) (yield of 35%).

Synthesis Example of Compound 5
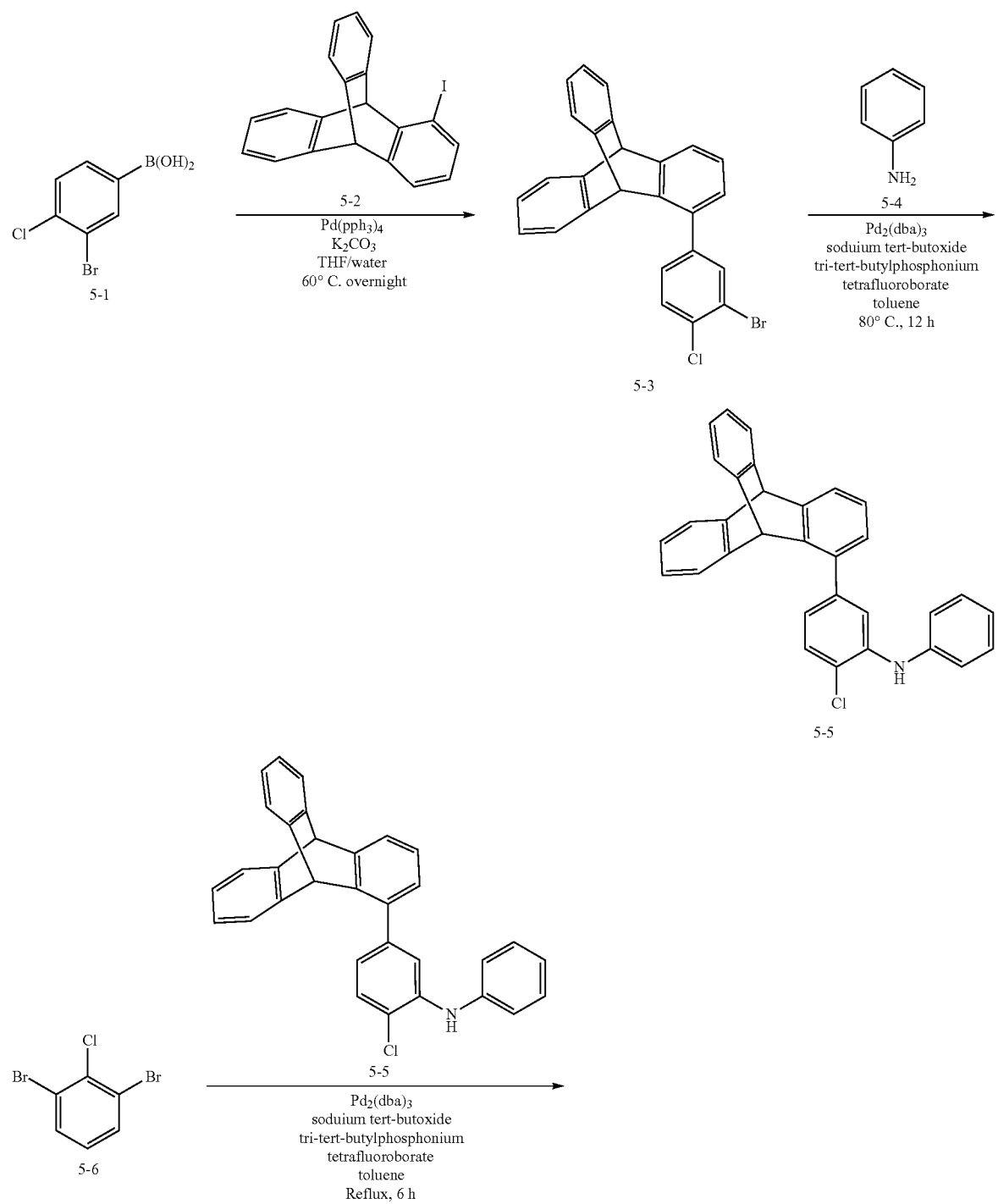

-continued

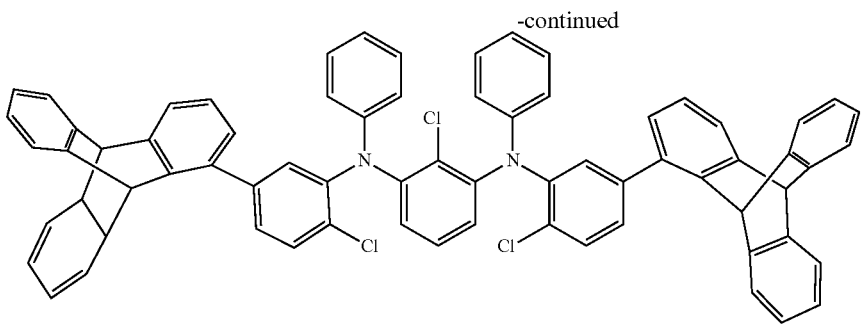

5-7

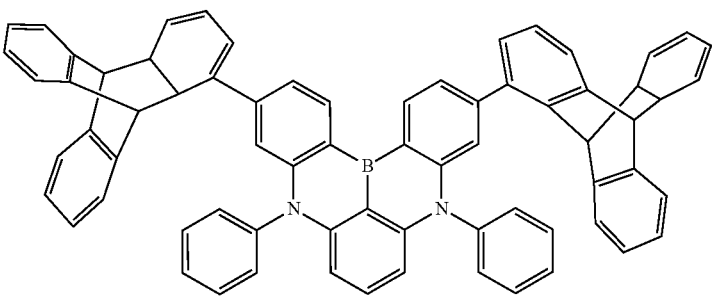

5-8

Compound 5-1 (11.8 g, 50.0 mmol) and Compound 5-2 (26.6 g, 50.0 mmol) were added to a flask and then, tetrahydrofuran (THF) was added thereto. A 0.3 M $K_2CO_3$ aqueous solution which had been bubbled with nitrogen for 10 minutes or more, and $Pd(PPh_3)_4$ were added thereto and stirred at a temperature of 60° C. for 20 hours (overnight). The obtained residue was purified by silica gel chromatography and recrystallized utilizing a mixed solvent including chloroform and hexane to obtain 16.2 g of Compound 5-3 (yield of 73%). Compound 5-3 (13.3 g, 30.0 mmol) and Compound 5-4 (3.35 g, 36.0 mmol) were added to a flask and then, toluene was added thereto. Sodium tert-butoxide, $Pd_2(dba)_3$, and tri-tert-butylphosphonium tetrafluoroborate were added thereto, and then, the resultant mixture was stirred at a temperature of 80° C. for 12 hours. The obtained residue was purified by silica gel chromatography and recrystallized utilizing a mixed solvent including chloroform and hexane to obtain 11.8 g of Compound 5-5 (yield of 86%). Compound 5-6 (2.7 g, 10.0 mmol) and Compound 5-5 (10.0 g, 22.0 mmol) were added to a flask, and then, toluene was added thereto. Sodium tert-butoxide, $Pd_2(dba)_3$, and tri-tert-butylphosphonium tetrafluoroborate were added thereto, and then, the resultant mixture was stirred at a temperature of 110° C. (reflux) for 6 hours. The obtained residue was purified by silica gel chromatography and recrystallized utilizing a mixed solvent including chloroform and hexane to obtain 10.2 g of Compound 5-7 (yield of 74%). At a temperature of 0° C., t-BuLi was slowly added to a t-butylbenzene/pentane solvent and Compound 5-7, and then, boron tribromide and diisopropylethylamine were added in sufficient amounts thereto. The resultant mixture was sufficiently stirred to obtain a compound. The obtained compound was purified by silica gel chromatography utilizing a mixed solvent of dichloromethane and hexane to obtain 3.32 g of Compound 5-8 (Example 5) (yield of 36%).

Synthesis Example of Compound 14
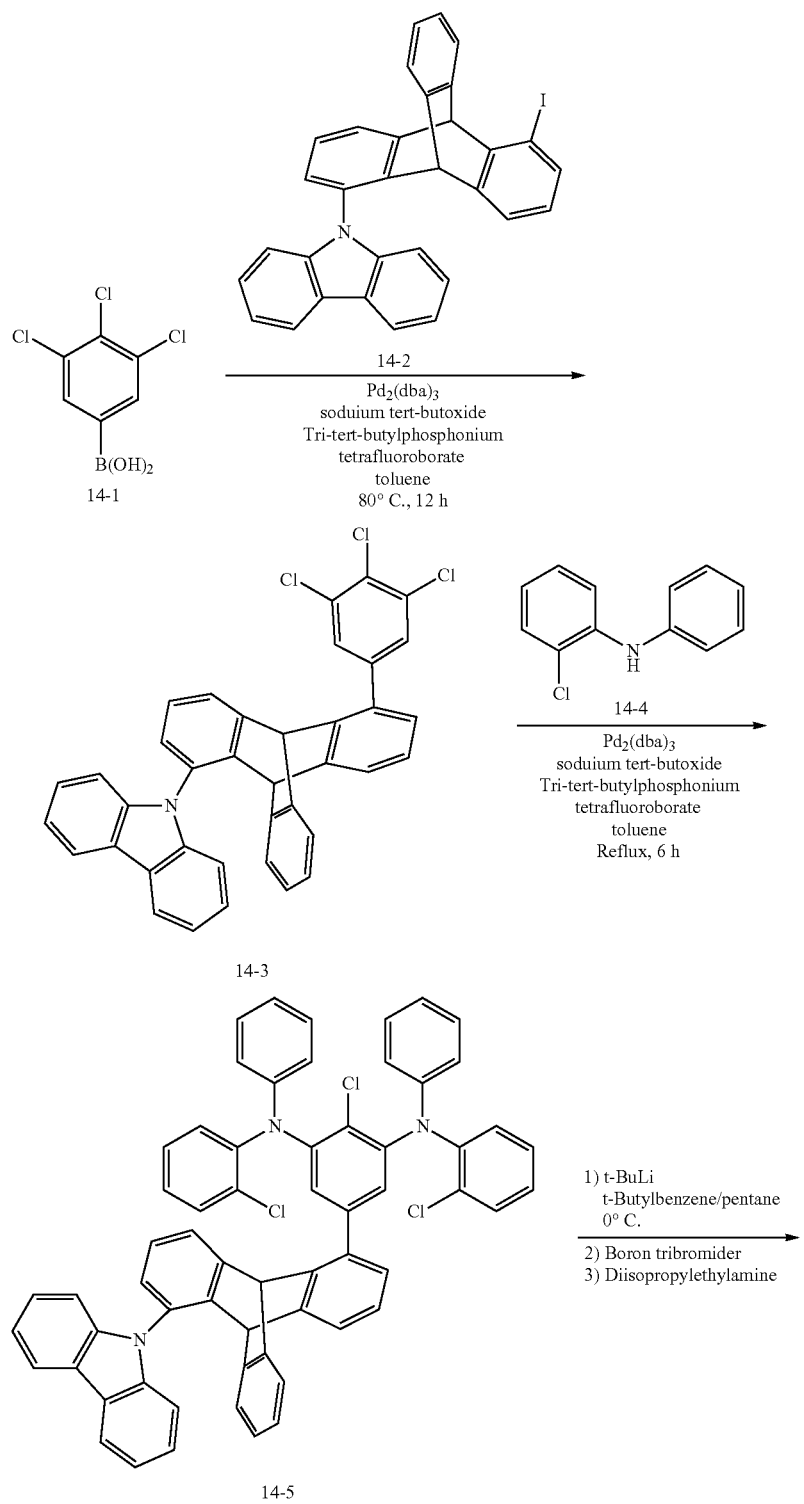

-continued

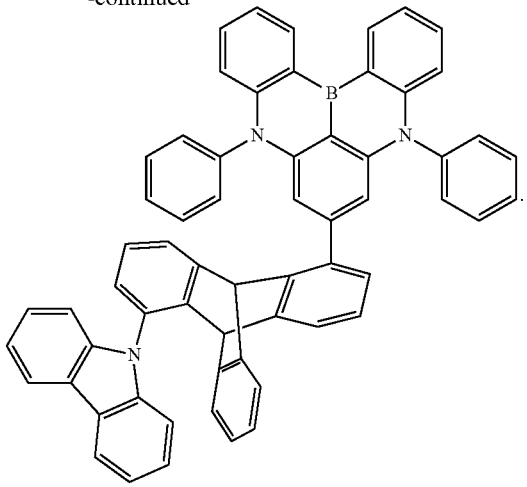

14-6

Compound 14-1 (7.9 g, 35.0 mmol) and Compound 14-2 (19.1 g, 35.0 mmol) were added to a flask and then, toluene was added thereto. Sodium tert-butoxide, tri-tert-butylphosphonium tetrafluoroborate and $Pd_2(dba)_3$ were added thereto and stirred at a temperature of 80° C. for 12 hours. The obtained residue was purified by silica gel chromatography and recrystallized utilizing a mixed solvent including chloroform and hexane to obtain 14.9 g of Compound 14-3 (yield of 71%). Compound 14-3 (11.7 g, 7.00 mmol) and Compound 14-4 (3.14 g, 15.4 mmol were added to a flask and then, toluene was added thereto. Sodium tert-butoxide, $Pd_2(dba)_3$, and tri-tert-butylphosphonium tetrafluoroborate were added thereto, and then, the resultant mixture was stirred at a temperature of 110° C. (reflux) for 6 hours. The obtained residue was purified by silica gel chromatography and recrystallized utilizing a mixed solvent including chloroform and hexane to obtain 4.70 g of Compound 14-5 (yield of 72%). At a temperature of 0° C., t-BuLi was slowly added to a t-butylbenzene/pentane solvent and Compound 14-5, and then, boron tribromide and diisopropylethylamine were added in sufficient amounts thereto. The resultant mixture was sufficiently stirred to obtain a compound. The obtained compound was purified by silica gel chromatography utilizing a mixed solvent of dichloromethane and hexane to obtain 1.60 g of Compound 14-6 (Compound 14) (yield of 38%).

Synthesis Example of Compound 16

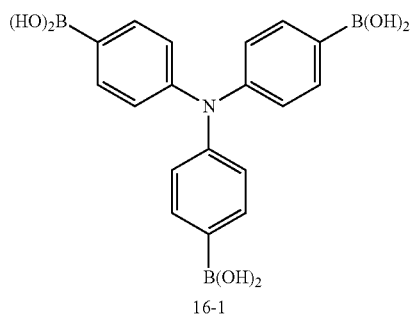

16-1

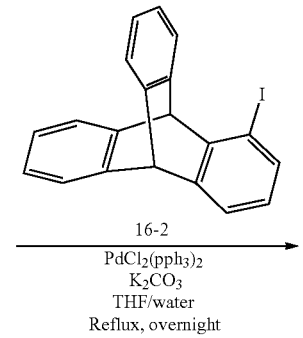

16-2

→ $PdCl_2(pph_3)_2$
$K_2CO_3$
THF/water
Reflux, overnight

-continued
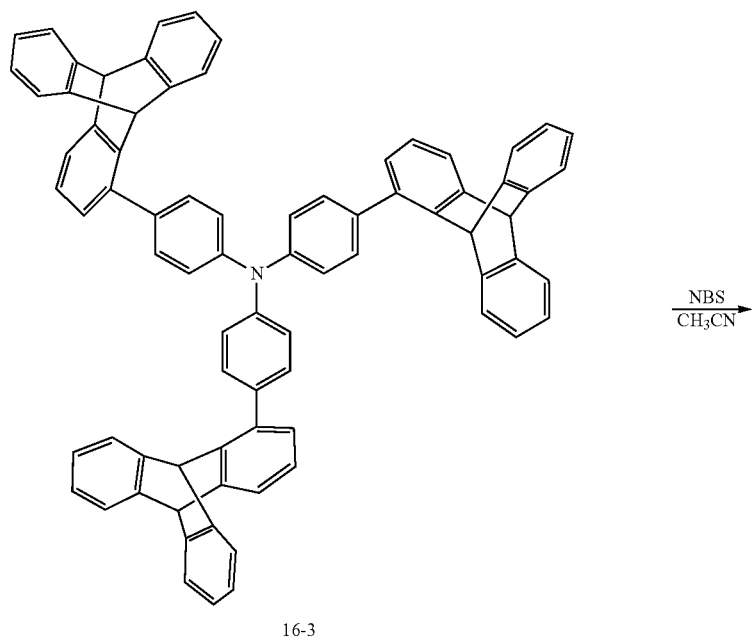
16-3
NBS / CH₃CN →
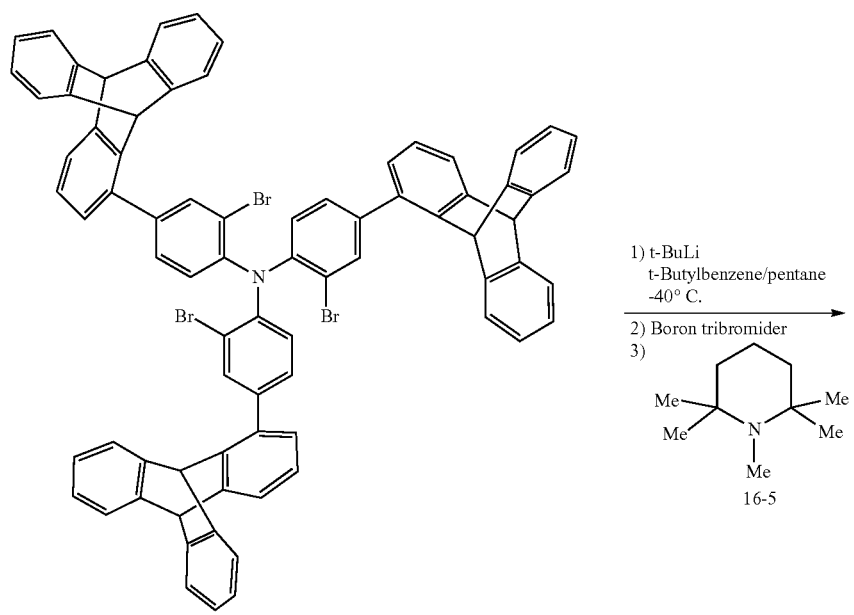
16-4
1) t-BuLi
   t-Butylbenzene/pentane
   -40° C.
2) Boron tribromider
3) 
16-5

-continued

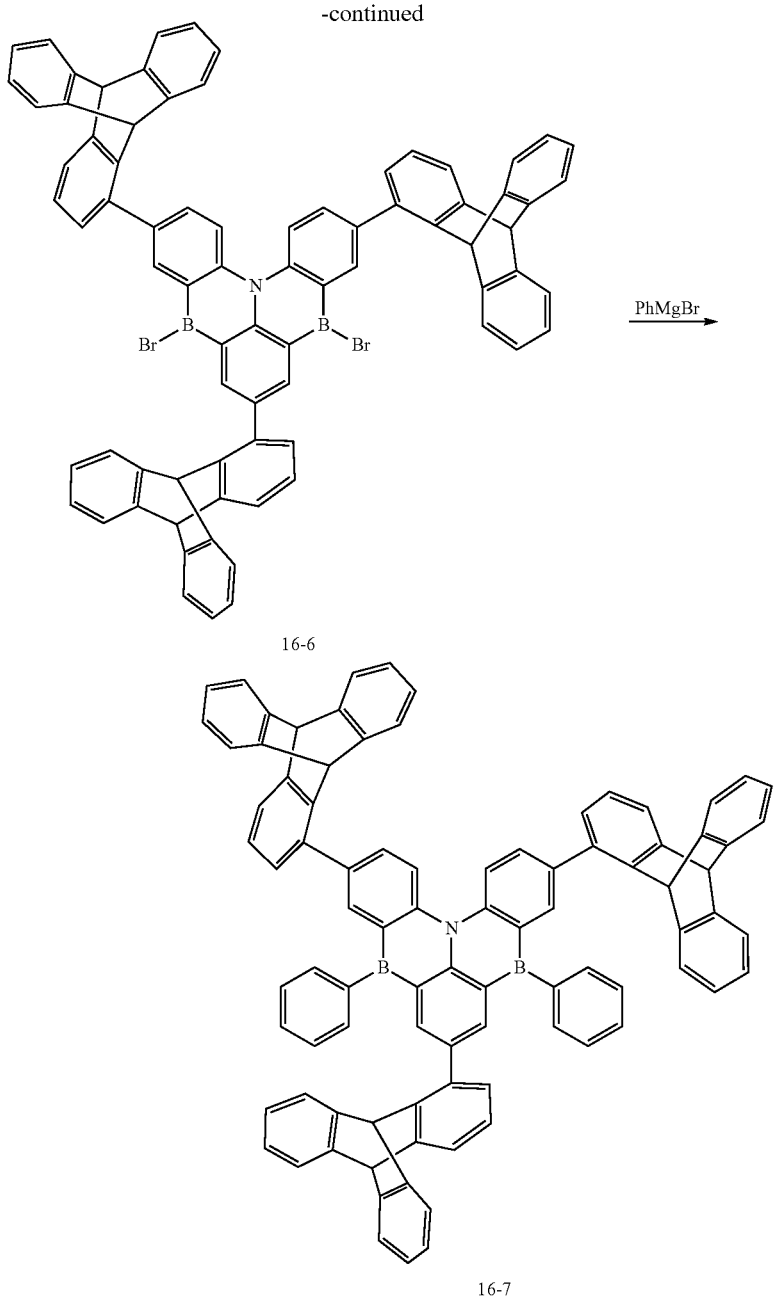

Compound 16-1 (13.2 g, 35.0 mmol) and Compound 16-2 (19.1 g, 35.0 mmol) were added to a flask and then, THF was added thereto. A 0.3 M $K_2CO_3$ aqueous solution which had been bubbled with nitrogen for 10 minutes or more, and $PdCl_2(PPh_3)_2$ were added thereto and stirred at a temperature of 80° C. (reflux) for 20 hours (overnight). The obtained residue was purified by silica gel chromatography and recrystallized utilizing a mixed solvent including chloroform and hexane to obtain 24.6 g of Compound 16-3 (yield of 70%). At a temperature of 0° C., Compound 16-3 (20.0 g, 20 mmol) and NBS (11.0 g, 62 mmol) were added to acetonitrile. At room temperature, the mixture was stirred for 20 hours, and then, the temperature thereof was decreased to 0° C. The obtained residue was washed with methanol and dried to obtain 22.3 g of Compound 16-4 (yield of 90%). At a temperature of −40° C., t-BuLi was slowly added to t-butylbenzene/pentane solvent and Compound 16-4. After stirring for about 1 hour, boron tribromide was added thereto. After one hour of stirring, 1,2,2,6,6-pentamethylpiperidine was added thereto, and then, sufficiently stirred to obtain a compound. The obtained compound was stirred at a temperature of 160° C. for 15 hours, and then, phenylmagnesium bromide was added thereto at room temperature. The obtained compound was stirred for about 2 hours, and then toluene was added thereto. The obtained product was purified by silica gel chromatography to obtain 5.70 g of Compound 16-7 (Compound 16) (yield of 27%).

Evaluation Example 1

The physical property data of the synthesized compounds are shown in Table 1.

TABLE 1

|  | $S_1(eV)$ | $T1(eV)$ | HOMO (eV) | LUMO (eV) |
|---|---|---|---|---|
| Compound 1 | 2.74 | 2.58 | 5.55 | 2.90 |
| Compound 3 | 2.72 | 2.57 | 5.55 | 2.89 |
| Compound 4 | 2.71 | 2.56 | 5.40 | 2.78 |
| Compound 5 | 2.70 | 2.57 | 5.45 | 2.82 |
| Compound 14 | 2.73 | 2.58 | 5.55 | 2.89 |
| Compound 16 | 2.65 | 2.50 | 5.37 | 2.80 |

Example 1

As an anode, a glass substrate (product of Corning Inc.) with a 15 Ω/cm² (1200 Å) ITO electrode formed thereon was cut to a size of 50 mm×50 mm×0.7 mm, sonicated with isopropyl alcohol and pure water each for 5 minutes, and then cleaned by exposure to ultraviolet rays and ozone for 30 minutes. Then, the resultant structure was mounted on a vacuum deposition apparatus.

NPD was deposited on the anode to form a hole injection layer having a thickness of 300 Å, and then, HT3 was deposited on the hole injection layer to form a hole injection layer having a thickness of 200 Å, and then, CzSi was deposited on the hole transport layer to form an emission auxiliary layer having a thickness of 100 Å.

H130 (host), H139 (host), PD38 (phosphorescent dopant), and Compound 1 (dopant) were co-deposited on the emission auxiliary layer at the weight ratio of 70:30:15:0.5 to form an emission layer having a thickness of 250 Å.

Then, TSPO1 was deposited on the emission layer to form a hole-blocking layer having a thickness of 200 Å, and, TPBI was deposited on the hole blocking layer to form an electron transport layer having a thickness of 300 Å. Then, LiF was deposited on the electron transport layer to form an electron injection layer having a thickness of 10 Å, and Al was deposited on the electron injection layer to form a cathode having a thickness of 3000 Å, thereby completing the manufacture of a light-emitting device having the ITO (1200 Å)/NPD (300 Å)/HT3 (200 Å)/CzSi (100 Å)/H130+H139+PD38+Compound 1 (0.43 wt %) (250 Å)/TSPO1 (200 Å)/TPBI (300 Å)/LiF (10 Å)/Al (3000 Å) structure.

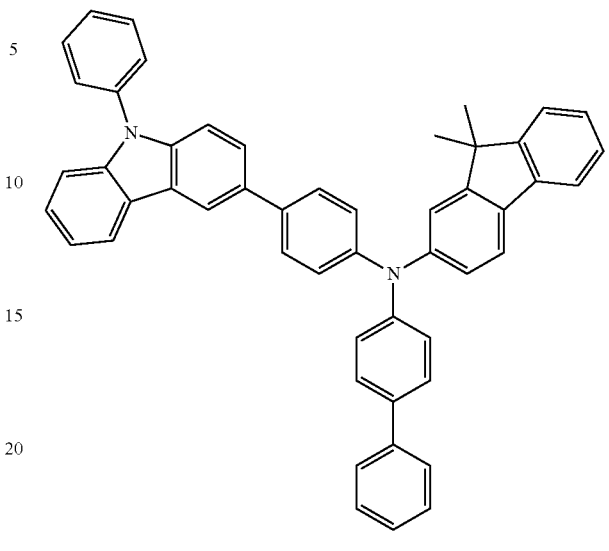

HT3

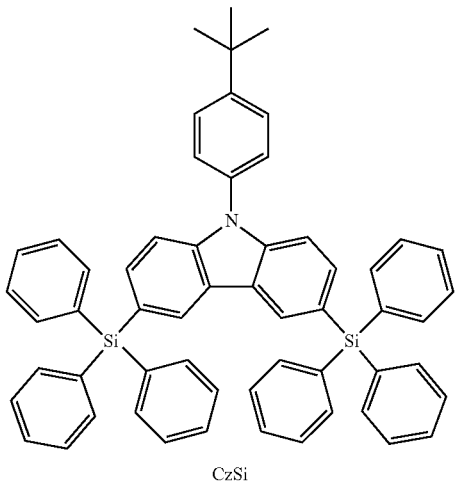

CzSi

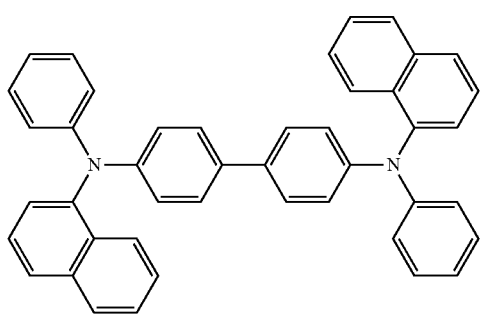

NPD

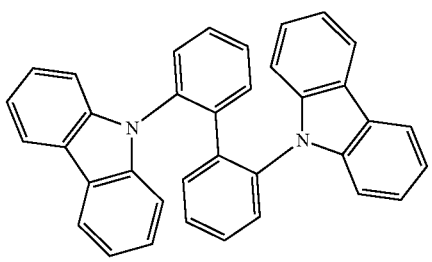

H130

-continued

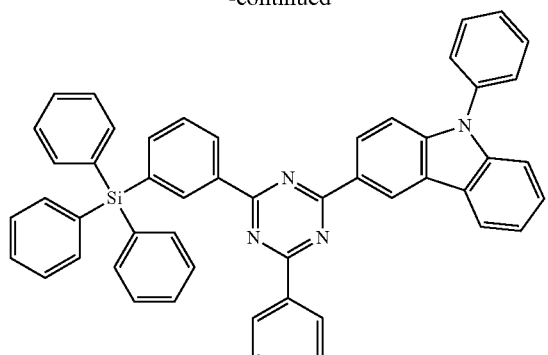
H139

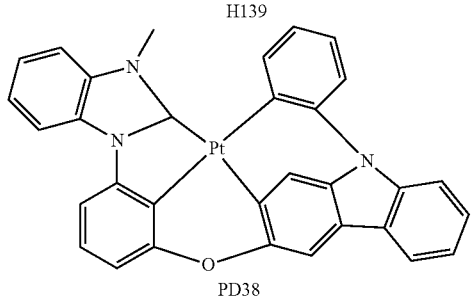
PD38

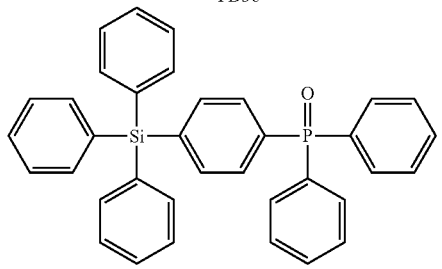
TSPO1

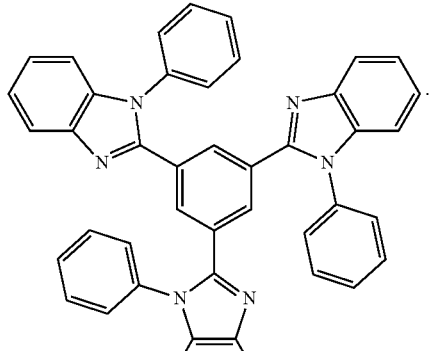
TPBI

Examples 2 to 6 and Comparative Examples A to C

Light-emitting devices were manufactured in substantially the same manner as in Example 1 except that the compounds listed in Table 1 were utilized instead of Compound 1 as a dopant in the respective emission layer. Also, in Comparative Example C, a phosphorescent dopant was not utilized, and the hosts (H130 and H139) and the dopant were co-deposited at the weight ratio of 70:30:1.0 (H130:H139:dopant).

Evaluation Example 2

The driving voltage (V), luminescence efficiency (Cd/A), emission color, and lifespan (LT95) at 1000 cd/m$^2$ of each of the light-emitting devices manufactured in Examples 1 to 6 and Comparative Examples A to C were measured utilizing Keithley MU236 and luminance meter PR650. Results are shown in Table 2.

TABLE 2

| No. | Phosphorescent light Dopant | Dopant | Driving voltage (V) | Luminescence efficiency (cd/A) | Emission color (nm) | Lifespan LT95 (hr) |
|---|---|---|---|---|---|---|
| Example 1 | PD38 | 1 | 4.6 | 21 | 465 | 28 |
| Example 2 | PD38 | 3 | 4.8 | 20 | 465 | 30 |
| Example 3 | PD38 | 4 | 4.5 | 20 | 464 | 24 |
| Example 4 | PD38 | 5 | 4.8 | 18 | 464 | 27 |
| Example 5 | PD38 | 14 | 4.5 | 18 | 466 | 27 |
| Example 6 | PD38 | 16 | 4.5 | 19 | 492 | 40 |
| Comparative Example A | PD38 | DABNA1 | 4.6 | 17 | 464 | 12 |
| Comparative Example B | PD38 | 1-444 | 4.5 | 18 | 463 | 14 |
| Comparative Example C | — | 1 | 4.6 | 9.3 | 461 | 1 |

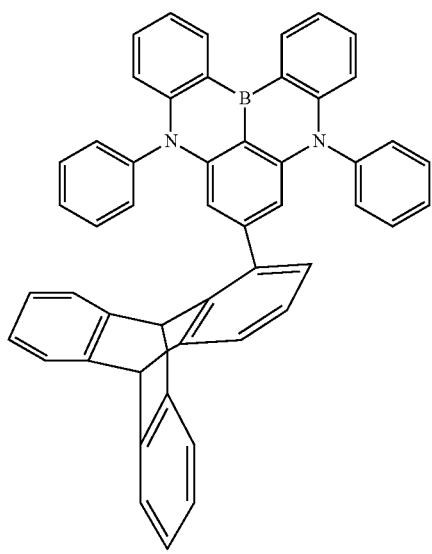
1
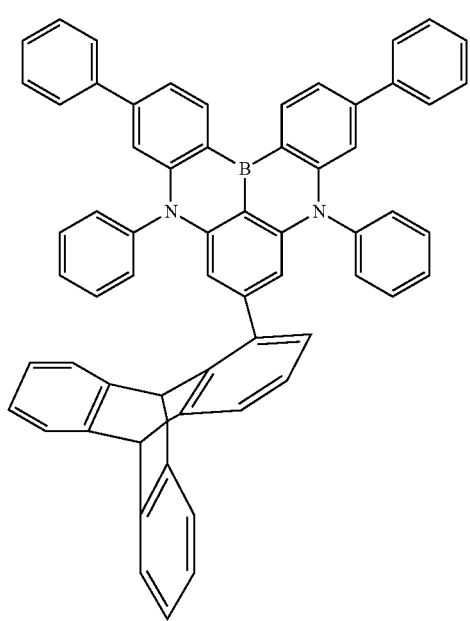
3

-continued
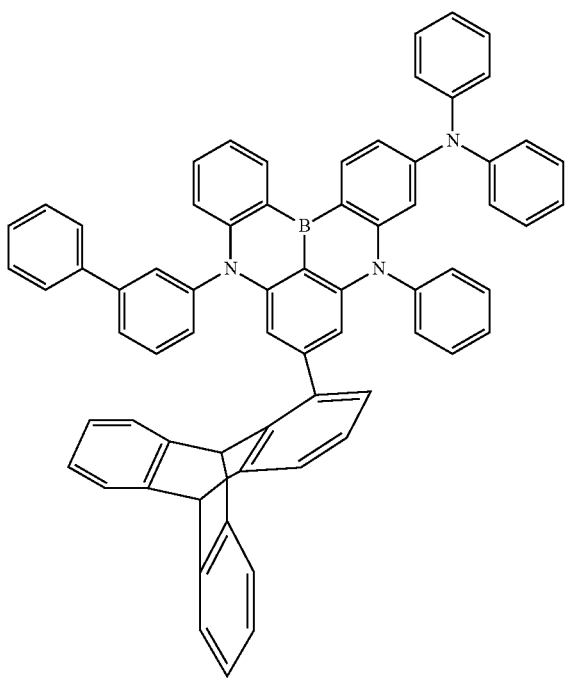
4
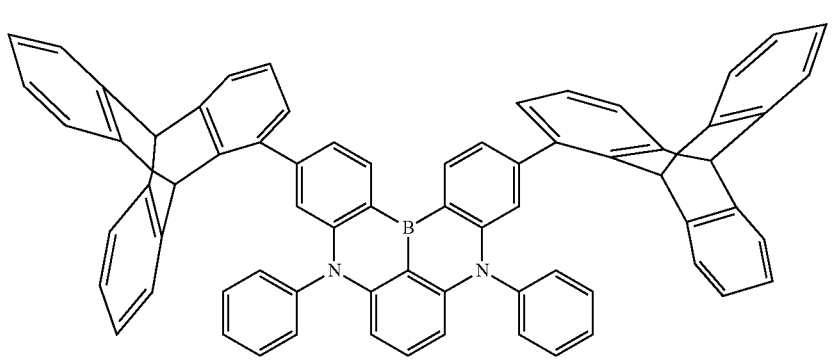
5
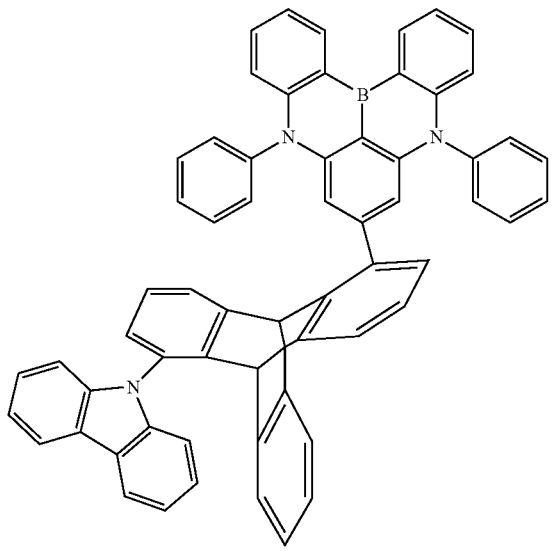
14

-continued

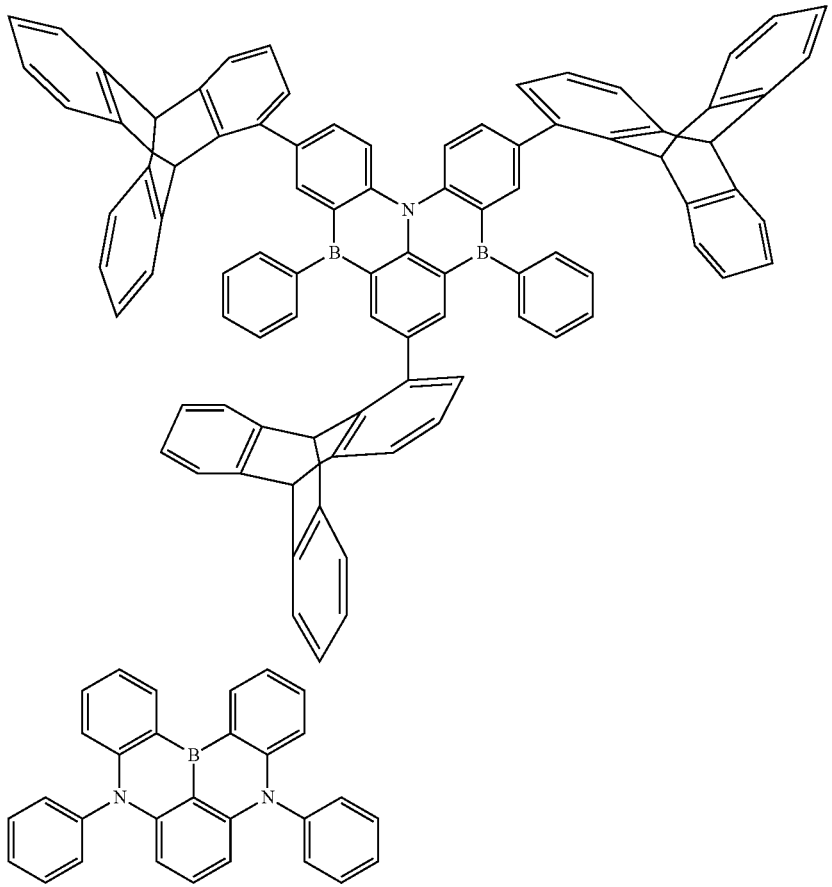

16

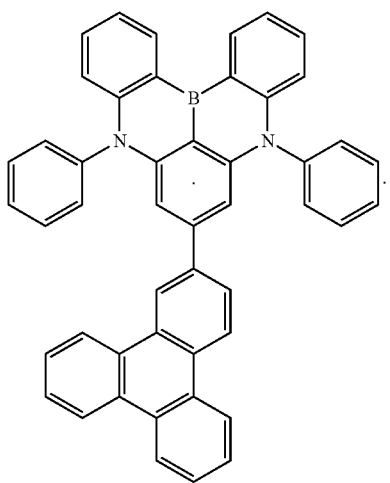

DABNA1

1-444

From Table 1, it can be seen that the light-emitting devices of Examples 1 to 6 each emit deep blue light and have lower driving voltage, higher luminescence efficiency, and longer lifespan than those of Comparative Examples A to C.

The light-emitting device includes the heterocyclic compound represented by Formula 1 and a phosphorescent dopant. Accordingly, the light-emitting device has suitable (e.g., excellent) properties in terms of driving voltage, luminescence efficiency, and external quantum efficiency, and thus, can provide a high-quality electronic apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:
1. A light-emitting device comprising:
a first electrode;
a second electrode facing the first electrode; and
an interlayer between the first electrode and the second electrode and comprising an emission layer,
wherein the emission layer comprises a heterocyclic compound represented by Formula 1 and a phosphorescent compound:

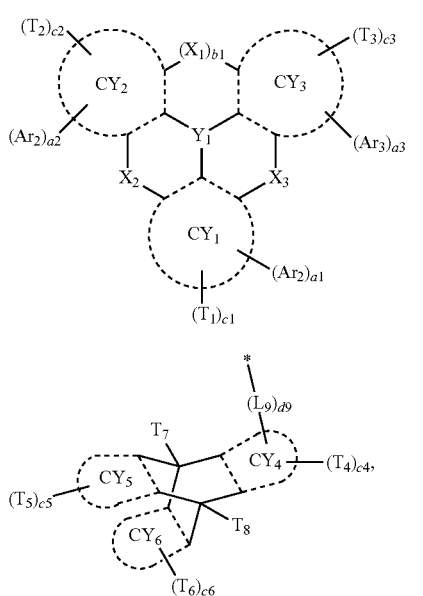

Formula 1

Formula 2 wherein, in Formula 1 and Formula 2,
$Ar_1$ to $Ar_3$ are each independently a group represented by Formula 2,
a1 to a3 are each independently an integer from 0 to 4, and a sum of a1, a2, and a3 is 1 or more,
$Y_1$ is B or N,
$X_1$ is O, S, $B(Z_{1a})$, $N(Z_{1a})$, $C(Z_{1a})(Z_{1b})$, or $Si(Z_{1a})(Z_{1b})$,
b1 is 0 or 1, wherein, when b1 is 0, $X_1$ is not present and ring $CY_2$ is not directly connected to ring $CY_3$,
$X_2$ is O, S, $B(Z_2)$, or $N(Z_2)$,
$X_3$ is O, S, $B(Z_3)$, or $N(Z_3)$,
ring $CY_1$ to ring $CY_6$ are each independently a $C_3$-$C_{60}$ carbocyclic group or a $C_1$-$C_{60}$ heterocyclic group,
$T_1$ is *'-$(L_1)_{d1}$-$(R_1)_{e1}$,
$T_2$ is *'-$(L_2)_{d2}$-$(R_2)_{e2}$,
$T_3$ is *'-$(L_3)_{d3}$-$(R_3)_{e3}$,
$T_4$ is *'-$(L_4)_{d4}$-$(R_4)_{e4}$,
$T_5$ is *'-$(L_5)_{d5}$-$(R_5)_{e5}$,
$T_6$ is *'-$(L_6)_{d6}$-$(R_6)_{e6}$,
$T_7$ is *'-$(L_7)_{d7}$-$(R_7)_{e7}$,
$T_8$ is *'-$(L_8)_{d8}$-$(R_8)_{e8}$,
*' in $T_1$ to $T_8$ is a binding site to a neighboring atom,
c1 to c6 are each independently an integer from 0 to 10,
$L_1$ to $L_9$ are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$,
d1 to d9 are each independently an integer from 0 to 3,
$Z_{1a}$, $Z_{1b}$, $Z_2$, and $Z_3$ are each independently a group represented by Formula 2, hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$,
$R_1$ to $R_8$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, and each of $R_1$ to $R_8$ is not a group represented by Formula 2,
e1 to e8 are each independently an integer from 0 to 10,
* in Formula 2 indicates a binding site to Formula 1,
two or more of $R_1$(s) in the number of e1 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
two or more of $R_2$(s) in the number of e2 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
two or more of $R_3$(s) in the number of e3 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
two or more of $R_4$(s) in the number of e4 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
two or more of $R_5$(s) in the number of e5 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_6$(s) in the number of e6 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_7$(s) in the number of e7 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_8$(s) in the number of e8 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

2. The light-emitting device of claim 1, wherein the emission layer further comprises a host, and the heterocyclic compound represented by Formula 1 is a dopant.

3. The light-emitting device of claim 2, wherein the host comprises a compound represented by Formula 301-1, a compound represented by Formula 301-2, or any combination thereof:

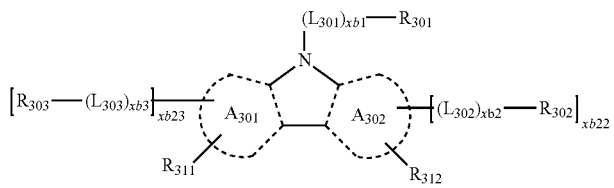

Formula 301-1

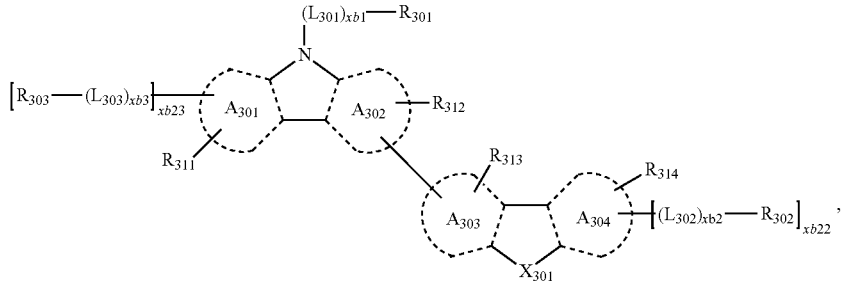

Formula 301-2 wherein, in Formulae 301-1 and 301-2, ring $A_{301}$ to ring $A_{304}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ is O, S, N-[($L_{304}$)$_{xb4}$-$R_{304}$], C($R_{304}$)($R_{305}$), or Si($R_{304}$)($R_{305}$), xb22 and xb23 are each independently 0, 1, or 2, $L_{301}$ to $L_{304}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb1 to xb4 are each independently an integer from 0 to 5, $R_{301}$ to $R_{305}$ and $R_{311}$ to $R_{314}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), and $Q_{301}$ to $Q_{303}$ are each independently the same as described in connection with $Q_1$ in Formula 1.

4. The light-emitting device of claim 1, wherein the phosphorescent compound comprises a phosphorescent dopant represented by Formula 401:

$$M(L_{401})_{xc1}(L_{402})_{xc2},\qquad\text{Formula 401}$$

wherein, in Formula 401,

M is a transition metal selected from the group consisting of iridium (Ir), platinum (Pt), palladium (Pd), osmium (Os), titanium (Ti), gold (Au), hafnium (Hf), europium (Eu), terbium (Tb), rhodium (Rh), rhenium (Re), and thulium (Tm), $L_{401}$ is a ligand represented by Formula 402, and xc1 is 1, 2, or 3, wherein when xc1 is two or more, two or more $L_{401}$ (s) are identical to or different from each other, $L_{402}$ is an organic ligand, and xc2 is 0, 1, 2, 3, or 4, and when xc2 is 2 or more, two or more $L_{402}$(s) are identical to or different from each other,

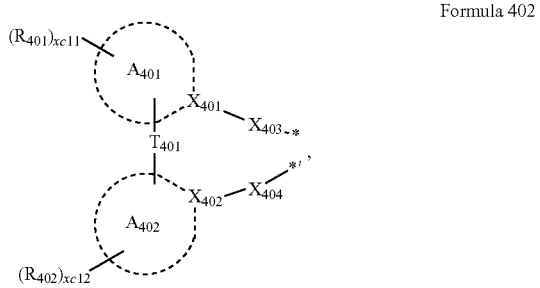

Formula 402 wherein, in Formula 402, $X_{401}$ and $X_{402}$ are each independently nitrogen or carbon, ring $A_{401}$ and ring $A_{402}$ are each independently a $C_3$-$C_{60}$ carbocyclic group or a $C_1$-$C_{60}$ heterocyclic group, $T_{401}$ is a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{41}$)=*', or *=C=*', $X_{403}$ and $X_{404}$ are each independently a chemical bond, O, S, N($Q_{413}$), B($Q_{413}$), P($Q_{413}$), C($Q_{413}$)($Q_{414}$), or Si($Q_{413}$)($Q_{414}$), $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ and $Q_{411}$ to $Q_{414}$ are each independently the same as described in connection with $Q_1$ in connection with Formula 1, xc11 and xc12 are each independently an integer from 0 to 10, and

* and *' in Formula 402 each indicate a binding site to M in Formula 401.

5. The light-emitting device of claim 1, wherein in Formula 1, b1 is 0, and $X_1$ is not present.

6. The light-emitting device of claim 1, wherein $X_2$ and $X_3$ in Formula 1 are each different from $Y_1$.

7. The light-emitting device of claim 1, wherein ring $CY_1$ to ring $CY_3$ in Formula 1 are each a benzene group, and ring $CY_4$ to ring $CY_6$ in Formula 2 are each a benzene group.

8. The light-emitting device of claim 1, wherein ring $CY_5$ or ring $CY_6$ in Formula 2 is a carbazole group.

9. The light-emitting device of claim 1, wherein in Formula 1 and Formula 2, $L_1$ to $L_9$ are each independently:

a single bond; a phenylene group or a naphthylene group; or a phenylene group or a naphthylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, or any combination thereof.

10. The light-emitting device of claim 1, wherein $Z_{1a}$, $Z_{1b}$, $Z_2$, $Z_3$, and $R_1$ to $R_8$ in Formulae 1 and 2 are each independently:

hydrogen, deuterium, —F, or a cyano group;

a group represented by —N($Q_1$)($Q_2$) or —P(=O)($Q_1$)($Q_2$); or a phenyl group, a biphenyl group, a carbazolyl group, a pyridinyl group, an indazolyl group, or a pyridoindolyl group, each unsubstituted or substituted with deuterium, —F, a cyano group, a $C_1$-$C_{20}$ alkyl group, a phenyl group, a biphenyl group, a $C_1$-$C_{20}$ alkylphenyl group, a carbazolyl group, a pyridinyl group, an indazolyl group, a pyridoindolyl group, or any combination thereof.

11. The light-emitting device of claim 1, wherein a group represented by

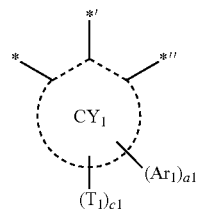

in Formula 1 is a group represented by one of Formulae CY1-1 to CY1-3:

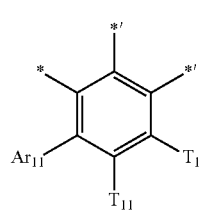

CY1-1

-continued

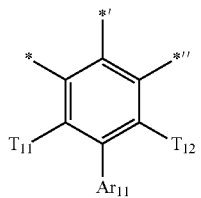

CY1-2

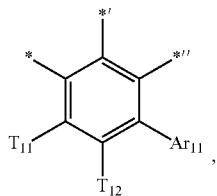

CY1-3 wherein, in Formulae CY1-1 to CY1-3,
$Ar_{11}$ is the same as described in connection with $Ar_1$ of Formula 1,
$T_{11}$ and $T_{12}$ are each independently the same as described in connection with $T_1$ of Formula 1,
* indicates a binding site to $X_2$ in Formula 1,
*' indicates a binding site to $Y_1$ in Formula 1, and
*'' indicates a binding site to $X_3$ in Formula 1.

12. The light-emitting device of claim 1, wherein a group represented by

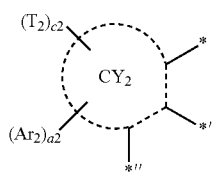

in Formula 1 is a group represented by one of Formulae CY2-1 to CY2-3:

CY2-1

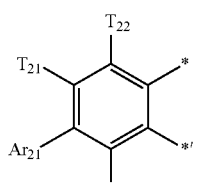

CY2-2

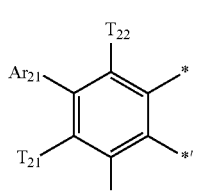

CY2-3

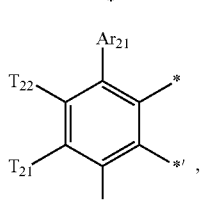

wherein, in Formulae CY2-1 to CY2-3,
$Ar_{21}$ is the same as described in connection with $Ar_2$ in Formula 1,
$T_{21}$ and $T_{22}$ are each independently the same as described in connection with $T_2$ in Formula 1,
* indicates a binding site to $X_1$ in Formula 1,
*' indicates a binding site to $Y_1$ in Formula 1, and
*'' indicates a binding site to $X_2$ in Formula 1.

13. The light-emitting device of claim 1, wherein a group represented by

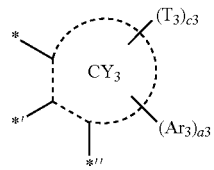

in Formula 1 is a group represented by one of Formulae CY3-1 to CY3-3:

CY3-1

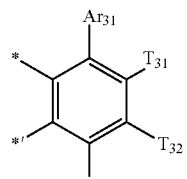

CY3-2

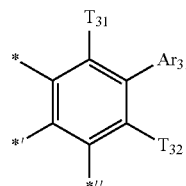

CY3-3

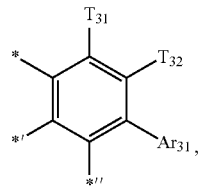

wherein, in Formulae CY3-1 to CY3-3,
$Ar_{31}$ is the same as described in connection with $Ar_3$ in Formula 1,
$T_{31}$ and $T_{32}$ are each independently the same as described in connection with $T_3$ in Formula 1,
* indicates a binding site to $X_1$ in Formula 1,
*' indicates a binding site to $Y_1$ in Formula 1, and
*'' indicates a binding site to $X_3$ in Formula 1.

14. The light-emitting device of claim 1, wherein
a sum of a1 and c1 is an integer of 0 or 3,
a sum of a2 and c2 is an integer of 0 or 3,
a sum of a3 and c3 is an integer of 0 or 3, and
a sum of a1, a2, a3, c1, c2, and c3 is 1 or more.

15. The light-emitting device of claim 1, wherein a group represented by

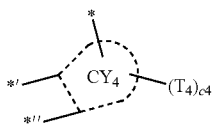

in Formula 2 is a group represented by one of Formulae CY4-1 to CY4-4:

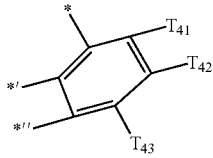

CY4-1

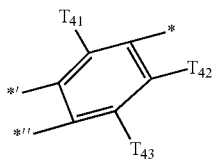

CY4-2

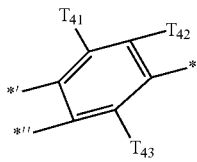

CY4-3

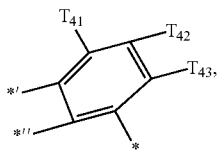

CY4-4 wherein, in Formulae CY4-1 to CY4-4,
$T_{41}$ to $T_{43}$ are each independently the same as described in connection with $T_4$ in Formula 2,
* indicates a binding site to Formula 1,
*' indicates a binding site to the carbon to which $T_7$ in Formula 2 is bonded, and
*'' indicates a binding site to the carbon to which $T_8$ in Formula 2 is bonded.

16. The light-emitting device of claim 1, wherein a group represented by

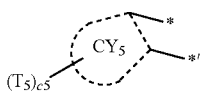

in Formula 2 is a group represented by one of Formulae CY5-1 to CY5-5:

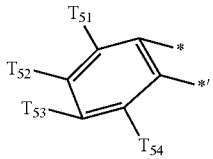

CY5-1

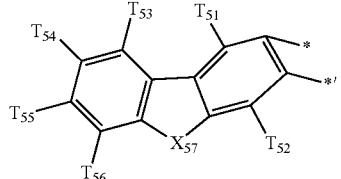

CY5-2

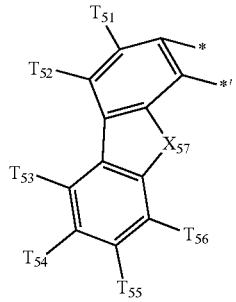

CY5-3

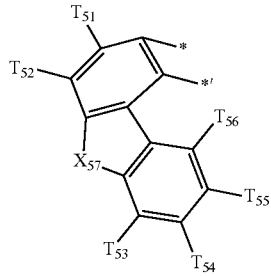

Cy5-4

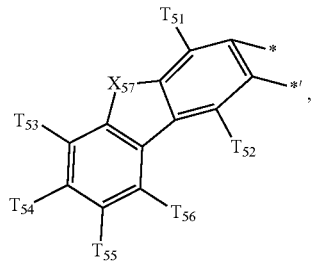

CY5-5 wherein, in Formulae CY5-1 to CY5-5,
$X_{57}$ is O, S, B($T_{57}$), N($T_{57}$), C($T_{57}$)($T_{58}$), or Si($T_{57}$)($T_{58}$),
$T_{51}$ to $T_{58}$ are each independently the same as described in connection with $T_5$ in Formula 2,
* is a binding site to the carbon to which $T_7$ in Formula 2 is bonded, and
*' is a binding site to the carbon to which $T_8$ in Formula 2 is bonded.

17. The light-emitting device of claim 1, wherein a group represented by

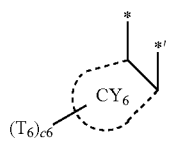

in Formula 2 is a group represented by one of Formulae CY6-1 to CY6-5:

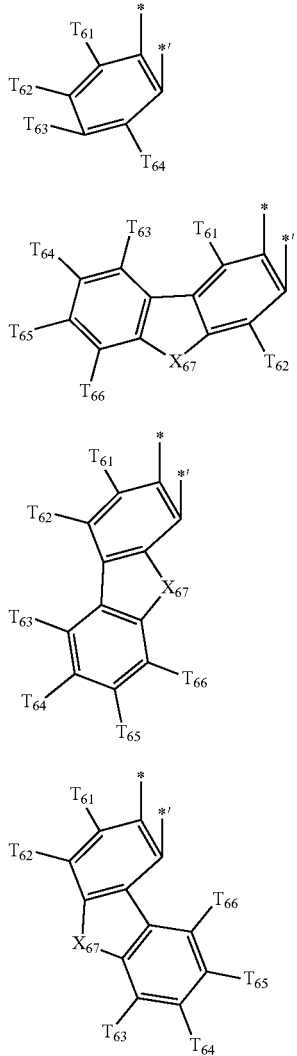

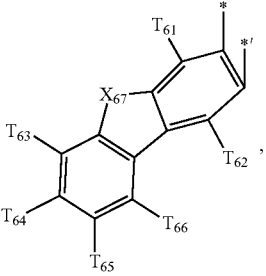

wherein, in Formulae CY6-1 to CY6-5, $X_{67}$ is O, S, $B(T_{67})$, $N(T_{67})$, $C(T_{67})(T_{68})$, or $Si(T_{67})(T_{68})$, $T_{61}$ to $T_{68}$ are each independently the same as described in connection with $T_6$ in Formula 2,

* is a binding site to the carbon to which $T_7$ in Formula 2 is bonded, and

*' is a binding site to the carbon to which $T_8$ in Formula 2 is bonded.

18. An electronic apparatus comprising the light-emitting device of claim 1.

19. The electronic apparatus of claim 18, further comprising a thin-film transistor, wherein the thin-film transistor comprises a source electrode and a drain electrode, and the first electrode of the light-emitting device is electrically connected to the source electrode or the drain electrode of the thin-film transistor.

20. The electronic apparatus of claim 18, further comprising a color filter, a color conversion layer, a touch screen layer, a polarizing layer, or any combination thereof.

* * * * *